US007010074B2

(12) United States Patent
Nakamura

(10) Patent No.: US 7,010,074 B2
(45) Date of Patent: Mar. 7, 2006

(54) OVERSAMPLING CLOCK RECOVERY HAVING A HIGH FOLLOW-UP CHARACTER USING A FEW CLOCK SIGNALS

(75) Inventor: Satoshi Nakamura, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 754 days.

(21) Appl. No.: 10/043,729

(22) Filed: Jan. 11, 2002

(65) Prior Publication Data

US 2002/0154723 A1  Oct. 24, 2002

(30) Foreign Application Priority Data

Jan. 11, 2001  (JP)  .............................. 2001/003667

(51) Int. Cl.
 *H04L 7/04*  (2006.01)
 *H03D 3/24*  (2006.01)
(52) U.S. Cl. ...................... 375/371; 375/373; 370/517; 327/144; 327/153
(58) Field of Classification Search ................ 375/326, 375/327, 371, 373, 376; 370/516, 517, 518, 370/519; 327/144, 147, 149, 153, 156, 158, 327/161

See application file for complete search history.

(56) References Cited

U.S. PATENT DOCUMENTS

| 5,633,899 | A |   | 5/1997 | Fiedler et al. |
| 6,125,157 | A | * | 9/2000 | Donnelly et al. ........... 375/371 |
| 6,281,759 | B1 | * | 8/2001 | Coffey .......................... 331/57 |
| 6,337,590 | B1 | * | 1/2002 | Millar ........................ 327/158 |
| 6,483,360 | B1 | * | 11/2002 | Nakamura .................. 327/158 |
| 6,492,851 | B1 | * | 12/2002 | Watarai ...................... 327/158 |

FOREIGN PATENT DOCUMENTS

| JP | 9-233061 | 9/1997 |
| JP | 2001-285266 | 10/2001 |
| JP | 2002-50960 | 2/2002 |

* cited by examiner

*Primary Examiner*—Young T. Tse
(74) *Attorney, Agent, or Firm*—Scully, Scott, Murphy & Presser

(57) ABSTRACT

An oversampling clock recovery method according to this invention generates non-uniform three-phase clock signals CLKa, CLKb, and CLKc having non-uniform intervals for one bit of an input data i and controls phases of the clock signals so that either phase of two edges of two-phase clock signals CLKb and CLKc having a relatively narrower interval of 57 ps synchronizes with a phase of a transition point of the input data i. By changing clock signals to be phase-locked in three delay locked loops (DLLs), a phase interval of 57 ps is formed.

25 Claims, 17 Drawing Sheets

OVERSAMPLING CLOCK RECOVERY HAVING A HIGH FOLLOW-UP CHARACTER USING A FEW CLOCK SIGNALS

BACKGROUND OF THE INVENTION

This invention relates to an oversampling clock recovery method.

In recent years, a high-speed protocol has been proposed in data transmission. For this purpose, high speed is requested in a clock recovery circuit and a phase locked loop (PLL). The clock recovery circuit carries out extraction of a clock signal from data transmitted in a high-speed transmission. The phase locked loop (PLL) frequency synchronizes a clock signal used in a circuit with a transmitted clock signal.

Various analog type clock recovery circuits has been proposed. One of them carries out a phase-comparison using a one-phase clock signal by making one leading edge of the clock signal correspond to one bit of data. Inasmuch as it is necessary in this circuit to make a data rate equal to a clock frequency, the clock frequency must be made a high-frequency wave of a level of gigahertz (GHz) when the data rate becomes the level of giga bit per second (Gbps). It is difficult to meet the request of the high-speed in the clock recovery circuit and the phase locked loop (PLL). For example, it is not easy to make an oscillation frequency of a voltage controlled oscillator (VCO) included in the phase locked loop (PLL) the high frequency of the level of GHz.

In order to meet such a request, an oversampling type clock recovery method and circuit have been proposed. The oversampling type clock recovery method and circuit sample transmitted data at a plurality of clock signals (multi-phase clock signals) having different phases. In the oversampling type clock recovery, phase comparison is carried out by making plural leading edges of the multi-phase clock signals correspond to one bit of data. According to the oversampling type clock recovery circuit, inasmuch as it is possible to use the clock signals having a frequency lower than the data rate, it is possible to meet the request of the high-speed.

The clock recovery carrying out phase comparison by making n leading edges of the multi-phase clock signals correspond to one bit of data is called an n-times oversampling. An 8-times oversampling is disclosed in Japanese Unexamined Patent Publication Tokkai No. Hei 9-233061 or JP-A 9-233061. A 2-times oversampling is disclosed in U.S. Pat. No. 5,633,899 issued to Alan Fiedler et al.

However, conventional oversampling methods are disadvantageous in that it is difficult to cope with a further high-speed of data transmission, in the manner which will later be described in conjunction with FIGS. 1A and 1B.

SUMMARY OF THE INVENTION

It is therefore an object of this invention to enable to cope with a further high-speed of data transmission in a field of oversampling clock recovery which meets a high-speed data communication.

More specifically, it is another object of this invention to provide an oversampling clock recovery method and an oversampling clock recovery circuit which are capable of realizing a high follow-up character for sufficiently following variations in a speed of data at a relatively small phase number of clock signals.

It is still another object of this invention to provide an oversampling clock recovery method and an oversampling clock recovery circuit which are capable of generating clock signals having smaller phase intervals regardless of a minimum limit of a propagation delay time interval in a buffer or an inverter.

It is yet another object of this invention to provide an oversampling clock recovery method and an oversampling clock recovery circuit which are capable of cyclically shifting multi-phase clock signals used in sampling at a high resolution as a whole with phase intervals therebetween held at a high precision and of generating the multi-phase clock signals having a good quality.

Other objects of this invention will become clear as the description proceeds.

According to a first aspect of this invention, an oversampling clock recovery method comprises the steps of generating non-uniform multi-phase clock signals having a non-uniform interval, the non-uniform multi-phase clock signals comprising three or more phase clock signals for one bit of an input data, of controlling a phase of the non-uniform multi-phase clock signals so that a phase of one of two edges in two-phase clock signals having a relative narrower interval among the non-uniform multi-phase clock signals is locked with a phase of a transition point of the input data, of digitally controlling, by using selection circuits and delay locked loops each comprising a plurality of delay buffers, phases of two or more sets of uniform multi-phase clock signals having a uniform interval at a resolution less than a propagation delay of a delay buffer in the delay locked loops; of keeping, by the digital control, a phase difference between a set of uniform multi-phase clock signals and another set of uniform multi-phase clock signals to a phase difference shorter than the propagation delay, and of using a combination of said two or more sets of uniform multi-phase clock signals as said non-uniform multi-phase clock signals.

Several proposals are made about a digital phase control circuit for digitally controlling, by using delay locked loops and selection circuits, phases of non-uniform multi-phase clock signals at a resolution shorter than a propagation delay of a delay buffer in the delay locked loops. For example, a digital phase control circuit is revealed in U.S. Pat. No. 6,483,360 B2 filed Aug. 3, 2001, by Satoshi Nakamura (this inventor), for assignment to the present assignee, based on Japanese Patent Application No. 237,458 of 2000. The digital phase control circuit disclosed by Nakamure infinitely (cyclically) phase shifts (phase controls), by using a first delay locked ioop (DLL) comprising a plurality of chained delay buffers each having a first delay of 229.6 ps, a second delay locked loop (DLL) comprising a plurality of chained delay buffers each having a second delay of 200 ps, and selection circuits, sixteen multi-phase clock signals both in a lead direction and in a lag direction at resolution of 28.6 ps as a whole with a phase interval thereof maintained to keep 200 ps.

Another digital phase control circuit is disclosed in Japanese Unexamined Patent Publication Tokkai No. 2001-285266 or JP-A 2001-285226. The digital phase control circuit according to JP-A2001-285266 infinitely (cyclically) phase shifts (phase controls), by using a first delay locked loop (DLL) comprising a plurality of chained delay buffers each having a first delay of 200 ps, a second delay locked loop (DLL) comprising a plurality of chained delay buffers each having a second delay of 160 ps, and selection circuits, sixteen multi-phase clock signals both in a lead direction and in a lag direction at resolution of 40 ps as a whole with a phase interval thereof maintained to keep 200 ps (See FIGS. 2 and 3 in JP-A2001-285266).

According to a second aspect of this invention, an oversampling clock recovery method comprises the steps of generating compression multi-phase clock signals having condensation and rarefaction in arrangement, the compression multi-phase clock signals comprising three or more phase clock signals for one bit of an input data, the compression multi-phase clock signals having a compression period equal to a length of one bit in the input data, of controlling a phase of the compression multi-phase clock signals so that a phase of one of clock edges in two clock signals having a condensation portion among the compression multi-phase clock signals is phase locked with a phase of a transition point of the input data, of digitally controlling, by using selection circuits and delay locked loops each comprising a plurality of delay buffers, phases of two or more sets of uniform multi-phase clock signals having uniform interval at a resolution shorter than a propagation delay of a delay buffer in the delay locked loops, of keeping, by the digital control, a phase difference between a set of uniform multi-phase clock signals and another set of uniform multi-phase clock signals to a phase difference shorter than the propagation delay, and of using a combination of the two or more sets of uniform multi-phase clock signals as the compression multi-phase clock signals.

According to a third aspect of this invention, an oversampling clock recovery method comprises the steps of generating non-uniform multi-phase clock signals having a non-uniform interval, the non-uniform multi-phase clock signals comprising four or more phase clock signals for one bit of an input data, of controlling a phase of the non-uniform multi-phase clock signals so that a phase of one of two clock edges in a first set of clock signals having a relative narrower interval among the non-uniform multi-phase clock signals is phase locked with a phase of a transition point of the input data, and of controlling a phase of the non-uniform multi-phase clock signals so as to avoid making a phase of one of two clock edges in a second set of clock signals having a relative narrower interval among the non-uniform multi-phase clock signals phase lock with the phase of the transition point of the input data, the second set of clock signals being apart from the first set of clock signals through a relatively wider phase interval by about a length of half bit of said input data.

According to a fourth aspect of this invention, an oversampling clock recovery method comprises the steps of generating compression multi-phase clock signals having condensation and rarefaction in arrangement, the compression multi-phase clock signals comprising four or more phase clock signals for one bit of an input data, the compression multi-phase clock signals having a compression period equal to one-second of a length of one bit in said input data, of controlling a phase of said compression multi-phase clock signals so that a phase of one of two clock edges in a first set of clock signals having a condensation portion among the compression multi-phase clock signals is phase locked with a phase of a transition point of said input data, and of controlling a phase of the non-uniform multi-phase clock signals so as to avoid making a phase of one of two clock edges in a second set of clock signals having a condensation portion among the non-uniform multi-phase clock signals phase lock with the phase of the transition point of the input data, the second set of clock signals being adjacent to the first set of clock signals through a rarefaction portion.

Among through the specification, a "phase interval" means a phase difference between two adjacent clock signals among multi-phase clock signals. The multi-phase clock signals having a uniform phase interval may be generated by using, for example, an analog delay locked loop (DLL). The "multi-phase clock signals" mean a predetermined number of clock signals having the same frequency and having different phases.

According to a fifth aspect of this invention, an oversampling clock recovery circuit comprises a first delay locked loop comprising m-stage delay buffers where m represents a first positive integer which is not less than two, a first selection circuit for selecting, as a first selected delay buffer, a first one of said m-stage delay buffers in the first delay locked loop to pick up a first selected clock signal from the first selected delay buffer, a second selection circuit for selecting, as a second selected delay buffer, a second one of said m-stage delay buffers in the first delay locked loop to pick up a second selected clock signal from the second selected delay buffer, a second delay locked loop comprising n-stage delay buffers where n represents a second positive integer which is different from the first positive integer and which is not less than two, a third selection circuit for selecting, as a third selected delay buffer, one of the n-stage delay buffers in the second delay locked loop to supply the third selected delay buffer with said first selected clock signal, a third delay locked loop comprising n-stage delay buffers, a fourth selection circuit for selecting, as a fourth selected delay buffer, one of the n-stage delay buffers in said third delay locked loop to supply the fourth selected delay buffer with the second selected clock signal, a phase comparison portion for sampling an input data using both clock signals produced by the second delay locked loop and clock signals produced by the third delay locked loop to detect lag/lead of the clock signals in reference with the input data, the phase comparison portion producing a comparison result indicative of the lag/lead of said clock signals, and a control circuit for controlling the first through the fourth selection circuits on the basis of the comparison result.

DESCRIPTION OF THE PREFERRED EMBODIMENTS

Figure 1A:
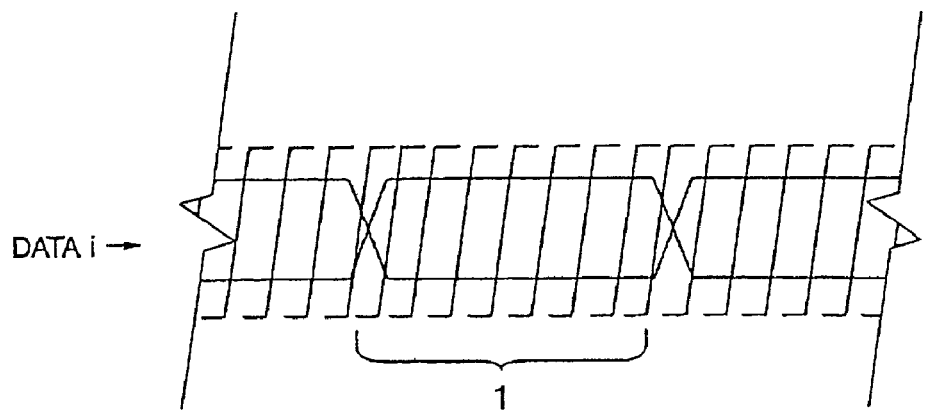
FIG. 1A shows a time charts schematically showing a waveform of data and clock edges in a conventional 8-times oversampling.
Figure 1B:
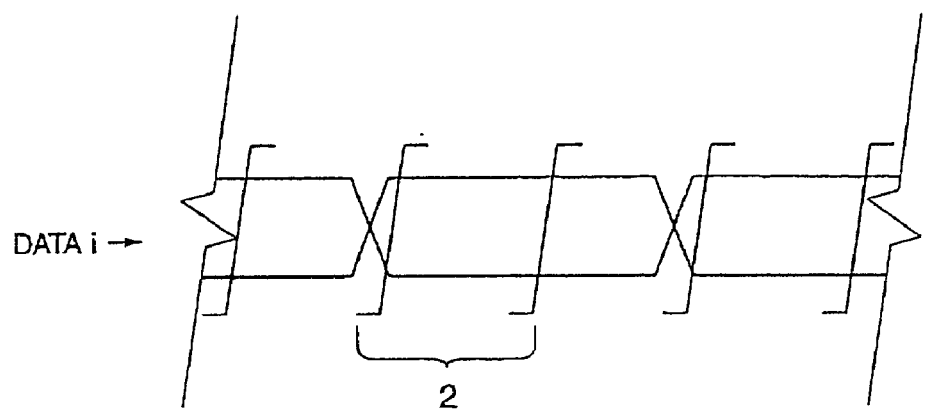
FIG. 1B shows a time charts schematically showing a waveform of data and clock edges in a conventional 2-times oversampling.

Referring to FIGS. 1A and 1B, description will at first be directed to conventional oversampling methods to facilitate an understanding of this invention.

Referring now to FIG. 1A, description will be directed to a conventional 8-times oversampling. FIG. 1A is a time chart schematically showing waveforms of data and leading edges of clock signals in the conventional 8-times oversampling.

In the 8-times oversampling, eight clock edges 1 match with one bit of a serial input data i. By determining that a transition point of the serial input data i positions between which two clock edges among the eight clock edges 1, a position relationship between a phase of the serial input data i and phases of the clock signals or a degree of lead or lag in the input data i compared with the clock signals is detected. On the basis of its detected result, the phases of the clock signals are shifted and a phase synchronization is carried out between the serial input data i and the clock signals, and a clock recovery is carried out.

In the 8-times oversampling disclosed in the above-mentioned JP-A 9-233061, a phase synchronization is carried out between the serial input data i and the clock signals by selecting a particular clock signal having a phase difference of about 180° to the phase of the transition point of the data without shifting the phase, thereby carrying out clock recovery.

Accordingly, in order to pass the eight clock edges 1 between one bit of the input data i, it is necessary to reduce a phase difference between adjacent two clock signals, namely, a phase interval of the clock signals to one-eighth of a length of one bit. For example, it will be assumed that the data rate is equal to 622 Mbps. In this event, inasmuch as one bit of the serial input data i is equal to 1600 picoseconds (ps) in length, it is necessary to reduce the phase interval to (1600 ps/8) or 200 ps. It will be assumed that the data rate is equal to 2.5 Gbps. In this event, inasmuch as one bit of the serial input data i is equal to 400 ps in length, it is necessary to reduce the phase interval to (400 ps/8) or 50 ps.

Inasmuch as the length of one bit becomes shorter as high-speed in data transmission advances in the manner as described above, it is difficult to apply the 8-times oversampling with the high-speed of the data transmission. In present art, the 8-times over-sampling is applicable if the data rate is equal to hundreds of Mbps but the 8-times oversampling is difficult if the data rate is not less than several Gbps. Specifically, it is difficult to generate multi-phase clock signals having a phase interval which is one-eighth of a length of one bit when the data rate is not less than several Gbps. Concretely, it will be assumed that the data rate is equal to 2.5 GHz. In this event, a buffer or an inverter for responding at 50 ps or the buffer or the inverter having an operating frequency of 20 GHz (1/50 ps) is required. However, it is impossible to implement such a buffer or inverter using an existing CMOS (complementary metal oxide semiconductor) process.

Although it may generate multi-phase clock signals, it is difficult to phase shift 8-phase or the multi-phase clock signals with the phase interval and waveform thereof kept.

Attention will be directed to a case of generating 8-phase clock signals using a delay locked loop (DLL) in order to pass the eight clock edges 1 within one bit of the input data i. In this event, it is necessary to construct the DLL comprising 8-stage delay buffers (in a case of single-phase). It will be presumed that successive several bits of the input data are oversampled using a clock signal having a frequency lower than the data rate. In this event, a lot of delay buffers are further required. For example, it will be assumed that successive eight bits of the input data are oversampled using a clock signal having a frequency which is one-eighth of the data rate. In this event, 8-by-8 or 64 delay buffers are required and a circuit becomes on a large scale.

Figure 4:
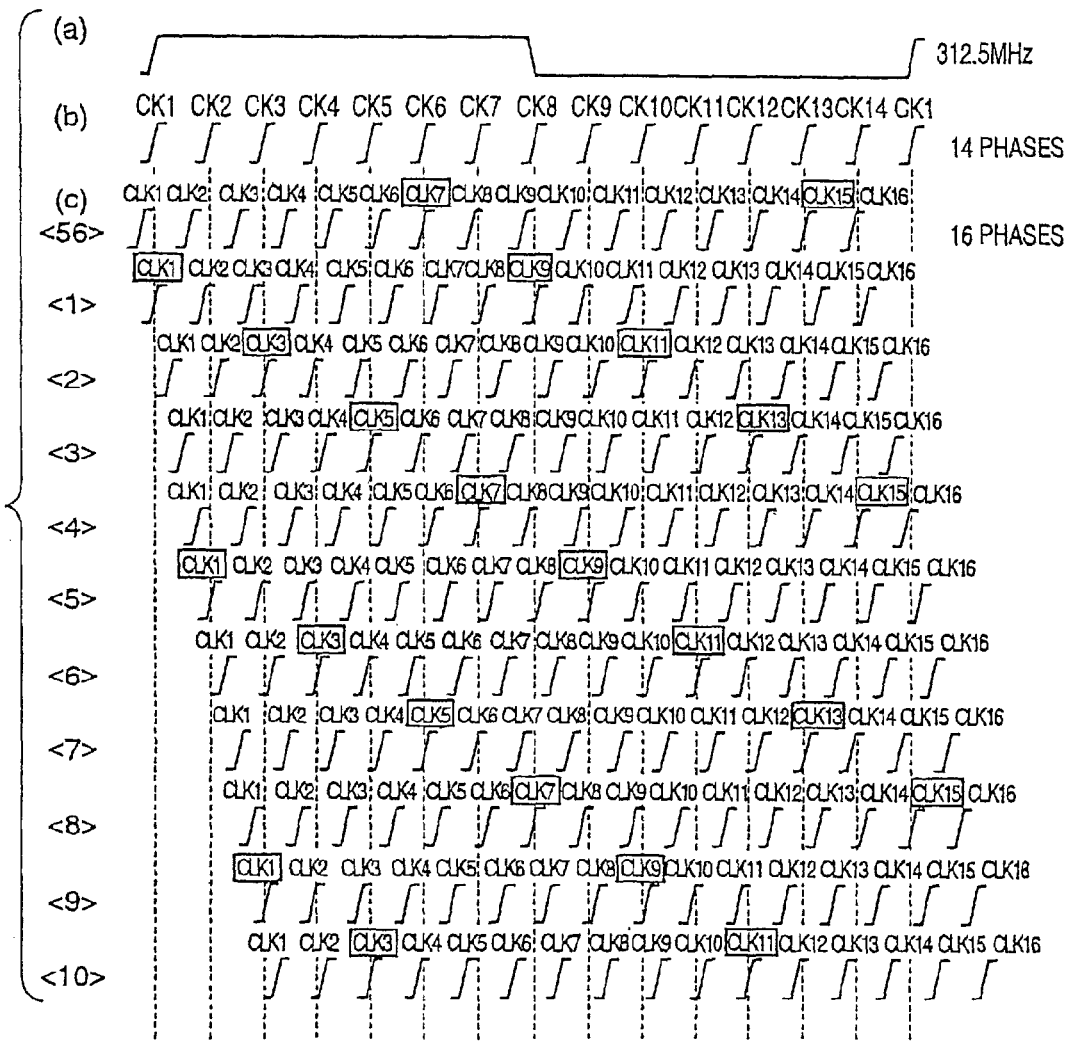
FIG. 4 is a time chart showing schematic waveforms indicative of position relationship of clock edges in the oversampling clock recovery circuit illustrated in FIG. 3.

A prior art for over-sampling using non-uniform four-phase clock signals is disclosed in an article which is contributed by Yongsam Moon and Deog-Kyoon Jeong (Seoul National University, Seoul 151–742, Korea) to 1999 Symposium on VLSI Circuit Digest of Technical Papers, and which has a title of "A 1 Gbps Transceiver with Receiver-End Deskewing Capability using Non-Uniform Tracked Oversampling and a 250–750 MHz Four-Phase DLL" (See FIG. 4 of the article). According to this prior art, it is unnecessary to pass eight clock edges within one bit of data.

However, according to the prior art, to generate the non-uniform four-phase clock signals uses a DLL comprising ten-stage delay buffers which are linked each other (See FIG. 5(a) of the article). That is, to generate the non-uniform four-phase clock signals uses the DLL which has an ability of generating uniform ten-phase clock signals. Central two-stage delay buffers thereamong form two-phase phase intervals where a center of the non-uniform four-phase clock signals is narrowed.

Accordingly, although the prior art is used, it is impossible to generate clock signals having a phase interval shorter than a propagation delay time interval of the delay buffer in the DLL.

According to the prior art, for example, when ten bits of input data having a data rate of 2.5 Gbps are over-sampled at a clock signal having a clock frequency of 250 MHz, 10-by-10 or 100 delay buffers are required:

As a result, a lot of delay buffers are required in the prior art also and it is impossible for the prior art to solve a problem where a circuit becomes on a large scale.

In the manner as described above, a buffer or inverter for responding at 50 ps is required in a case where the data rate is equal to 2.5 Gbps. It is impossible to implement such a buffer or inverter using the existing CMOS process. Accordingly, it is really impossible by the prior art to over-sample the ten bits of the input data having the data rate of 2.5 Gbps using the clock signal having the clock frequency of 250 MHz.

Referring now to FIG. 1B, description will be directed to a conventional 2-times oversampling. FIG. 1B is a time chart schematically showing waveforms of data and leading edges of clock signals in the conventional 2-times oversampling.

In the 2-times oversampling, two clock edges 2 match with one bit of the serial input data i. That is, in the 2-times oversampling, a phase interval between clock signals may be set in one-second of a length of one bit of the serial input data i. For example, it will be assumed that the data rate is equal to 2.5 Gbps. In this event, inasmuch as one bit of the serial input data has 400 ps in length, the phase interval is set in (400 ps/2) or 200 ps. The phase interval of 200 ps may be sufficiently implemented. The 2-times oversampling may be implemented at an existing technical level for the input data i having the data rate not only of hundreds of Mbps but also of several Gbps.

However, the 2-times oversampling is different from the 8-times oversampling and has only two clock edges within a range of one bit of the data. Accordingly, a transition point of the data positions between the two clock edges 2. As a result, the 2-times oversampling is different from the 8-times oversampling and cannot detect a position relationship between a phase of the input data i and a phase of the clock signal or a degree of lead or lag in the input data i compared with the clock signal although it is determined that a transition point of the input data i positions between the clock edges.

So, the 2-times oversampling detects the position relationship between the phase of the data and the phase of the clock signal using a following mechanism which is quite different from that of the 8-times oversampling.

The 2-times oversampling can detect a timing of a start of lead in the phase or a start of lag in the phase so that the transition point of the input data i passes the clock edge in a lead direction or a lag direction but cannot detect what degree is lead or lag.

Accordingly, the 2-times oversampling presumedly detects the degree of the lead or the lag in the input data i as follows.

It will be assumed that the input data i passes the clock edge by moving in the lead direction compared with the clock signal. In this event, the 2-times oversampling presumedly detects the degree of the lead in the input data i by counting a sampled count in a state where the transition point of the input data i lies in a position leader than the clock signal thereafter.

Likewise, it will be assumed that the input data i passes the clock edge by moving in the lag direction compared with the clock signal. In this event, the 2-times oversampling presumedly detects the degree of the lag in the input data i by counting a sampled count in a state where the transition point of the input data i lies in a position lagged by the clock signal.

A phase control is performed so as to put the phase of the clock signal forward when the sampled count is successively counted up to a predetermined count in a state where the transition point of the input data i lies in the position leader than the clock signal. On the contrary, the phase control is performed so as to put the phase of the clock signal backward when the sampled count is successively counted up to the predetermined count in a state where the transition point of the input data i lies in the position lagged by the clock signal. As a result, phase synchronization between the input data i and the clock signal is carried out.

However, it is feared in the 2-times oversampling that it is impossible to sufficiently make the clock signal follow the input data i although the phase of the clock signal is shifted when the sampled count reaches the predetermined count in the manner which will presently be described.

More specifically, it will be presumed that the number of the transition points in the input data i passing the clock edge per a unit time interval is few (e.g. a case where there are a long succession of the same code in a train of data such as 000 . . . or 111 . . . ). In this event, inasmuch as the number of data elements passing until reaching the predetermined count is much (e.g. a response time is long), the input data i is lead or lag too compared with the clock signal before the sampled count reaches the predetermined count. In addition, it will be presumed that the number of the transition points in the input data i passing the clock edge per the unit time interval is much (e.g. a case where different codes are alternately arranged in the train of the data such as 010101 . . . ). Inasmuch as variation in the input data i until reaching the predetermined count is large when a movement of lead of lag in the transition point of the input data for the clock signal is fast (e.g. a variation speed of the input data is fast), the input data i is lead or lag too compared with the clock signal before the sampled count reaches the predetermined count.

Inasmuch as it is impossible to sufficiently make the clock signal follow the input data i in the manner which is described above, namely, clock recovery is not good, the clock signal does not synchronize with a desired phase and it results in generating reading errors in the data or the like.

First Embodiment

Referring to FIGS. 2A, 2B, 2C, 2D, 2E, and 2F, the description will proceed to an oversampling clock recovery method according to a first embodiment of this invention. FIGS. 2A through 2F are time charts showing waveforms for use in describing the oversampling clock recovery method according to the first embodiment of this invention.

The illustrated oversampling clock recovery method generates three-phase clock signals CLKa, CLKb, and CLKc having non-uniform intervals for one bit of an input data i. In addition, clock signals CLKb, CLKc, and CLKd also are three-phase clock signals having non-uniform intervals for the one bit of the input data i. Four-phase clock signals CLKa, CLKb, and CLKc, and CLKd are called first through fourth clock signals, respectively. The oversampling clock recovery method comprises the steps of sampling the input data i using the four-phase clock signals CLKa, CLKb, CLKc, and CLKd, of detecting phase differences between the input data i and the clock signals on the basis of its sampling result, and of controlling phases of the four-phase clock signals CLKa, CLKb, CLKc, and CLKd so that either phase between edges of two-phase clock signals CLKb and CLKc having a relatively narrower interval synchronizes with a phase of a transition point of the input data i.

As shown in FIGS. 2A through 2F, the oversampling clock recovery method carries out sampling using the four-phase clock signals CLKa, CLKb, CLKc, and CLKd where three leading clock edges correspond for one bit of the input data i and detects lead/lag in the clock signals for the input data i.

A phase interval between the first clock signal CLKa and the fourth clock signal CKLd is equal to a length of the one bit of the input data i. A phase interval between the second clock signal CLKb and the third clock signal CLKc is narrower than a phase interval between the first clock signal CLKa and the second clock signal CLKb and than a phase interval between the third clock signal CLKc and the fourth clock signal CLKd. The phase interval between the first clock signal CLKa and the second clock signal CLKb is substantially equal to the phase interval between the third clock signal CLKc and the fourth clock signal CLKd. In other words, the second and the third clock signals CLKb and CLKc are arranged between the first and the fourth clock signals CLKa and CLKd at nearly center thereof and the phase interval between the second and the third clock signals CLKb and CLKc is relatively narrow. The phase difference between the second and the third clock signals CLKb and CLKc is narrower than one-fourth of a bit length of the input data i. In the example being illustrated, the phase difference between the second and the third clock signals CLKb and CLKc is equal to about one-eighth of the bit length of the input data i. The first and the fourth clock signals CLKa and CLKd are clock signals for use in actually picking up data.

In a state where the four-phase clock signals CLKa to CLKd are arranged at the above-mentioned phase intervals, sampling of the input data i is carried out. The oversampling clock recovery method carries out clock recovery by detecting (determining) lag/lead of the clock signals for the data on the basis of sampled data and by controlling so that the clock signals follow the data. In the over-sampling clock recovering method, if the four-phase clock signals CLKa to CLKd are controlled so that a transition point of the input data i positions between a leading edge of the second clock signal CLKb and a leading edge of the third clock signal CLKc, leading edges of the first and the fourth clock signals CLKa and CLKd automatically synchronize with a center of the bit of the input data i.

In order to control the phases of the four-phase clock signals CLKa to CLKd, the phases of the four-phase clock signals CLKa to CLKd are shifted by a length equal to the phase interval between the second and the third clock signals CLKb and CLKc as one resolution (one unit) with those phase intervals maintained.

Figure 2B:
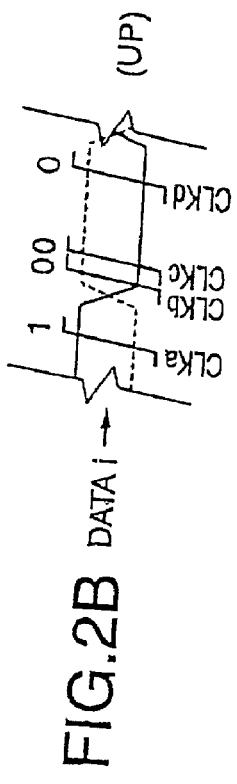
FIGS. 2A through 2F collectively show time charts schematically showing waveforms for use in describing an oversamling clock recovery method according to a first embodiment of this invention.
Figure 2D:
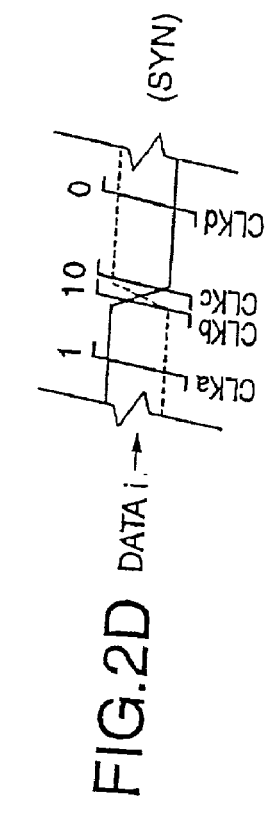
Figure 2F:
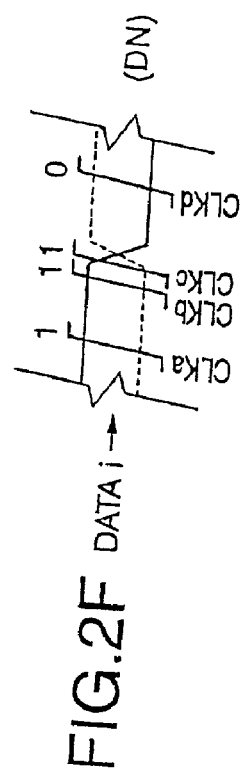
Figure 2A:
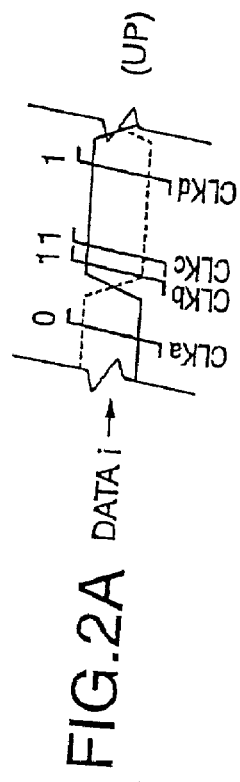

As shown in FIGS. 2A and 2B, it will be assumed that sampled data sampled by the four-phase clock signals CLKa to CLKd are <0111> or <1000>. In this event, the over-sampling clock recovery method determines that the phases of the four-phase clock signals CLKa to CLKd should be put "forward (UP)." This is because the transition point of the input data i lies between the first and the second clock signals CLKa and CLKb and therefore the four-phase clock signals CLKa to CLKd are delayed compared with the input data i. On the basis of its determination, the over-sampling clock recovery method puts the phases of the four-phase clock signals CLKa to CLKd forward by the one resolution.

Figure 2C:
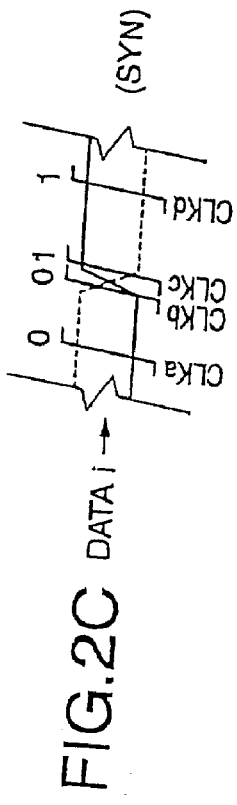

As shown in FIGS. 2C and 2D, it will be assumed that the sampled data sampled by the four-phase clock signals CLKa to CLKd are <0011> or <1100>. In this event, the over-sampling clock recovery method determines that phases between the four-phase clock signals CLKa to CLKd and the input data i are "synchronized (SYN)" with each other. This is because the transition point of the input data i lies between the second and the third clock signals CLKb and CLKc and therefore leading edges of the first and the fourth clock signals CLKa and CLKd synchronize with a center of the bit of the input data i.

Figure 2E:
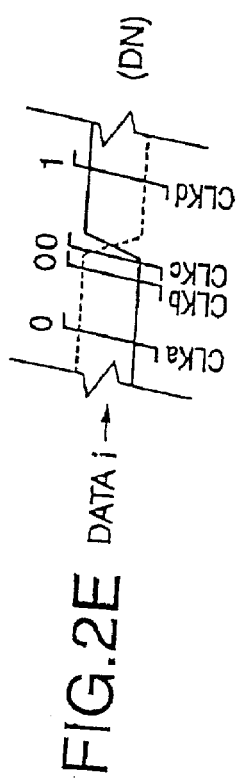

As shown in FIGS. 2E and 2F, it will be assumed that the sampled data sampled by the four-phase clock signals CLKa to CLKd are <0001> or <1110>. In this event, the over-sampling clock recovery method determines that the phases of the four-phase clock signals CLKa to CLKd should be put "backward (DN)." This is because the transition point of the input data i lies between the third and the fourth clock signals CLKc and CLKd and therefore the four-phase clock signals CLKa to CLKd run fast compared with the input data i. On the basis of its determination, the oversampling clock recovery method puts the phases of the four-phase clock signals CLKa to CLKd backward by the one resolution.

Table 1 shows a correspondence table of sampled data train and determination.

TABLE 1

| sampled data train | | determination |
| --- | --- | --- |
| 0111 | 1000 | UP |
| 0011 | 1100 | SYN |
| 0001 | 1110 | DN |
| 1111 | 0000 | |
| 1011 | 0100 | |
| 1101 | 0010 | invalid |
| 1001 | 0110 | |
| 1010 | 0101 | |

In the manner as described above, the oversampling clock recovery method determines that <0111> and <1000> are UP, <0011> and <1100> and SYN, and <0001> and <1110> are DN and deals with others as invalid.

By controlling the four-phase clock signals CLKa to CLKd in the manner which is described above, it is possible to make the first and the fourth clock signals CLKa and CLKd used in picking up real data synchronize with a center of a bit of the input data that has a stable value.

According to the oversampling clock recovery method, it is unnecessary to pass eight clock edges within one bit of an input data in a case of the 8-times oversampling but may pass three clock edges within the one bit of the input data. Nevertheless, it is possible to realize a high follow-up character because the phase interval between the second and the third clock signals CLKb and CLKc is relatively narrow. If the phase interval between the second and the third clock signals CLKb and CLKc is narrowed to one-eighth of a length of one bit of the input data, it is possible to obtain follow-up character equivalent to that of the 8-times oversampling. Similarly, if the phase interval between the second and the third clock signals CLKb and CLKc is narrowed to one-sixteenth of the length of the one bit of the input data, it is possible to obtain follow-up character equivalent to that of an 16-times oversampling. The follow-up character of the oversampling of higher times such as 8-times, 16-times, and so on is obtained using three-phase clock signals per one bit. Although the follow-up character of the oversampling of the higher times is realized, it is possible to relatively easily make phase control of the clock signals because phase number of the clock signals for phase controlling is small such as three-phase per one bit.

Second Embodiment

Figure 3:
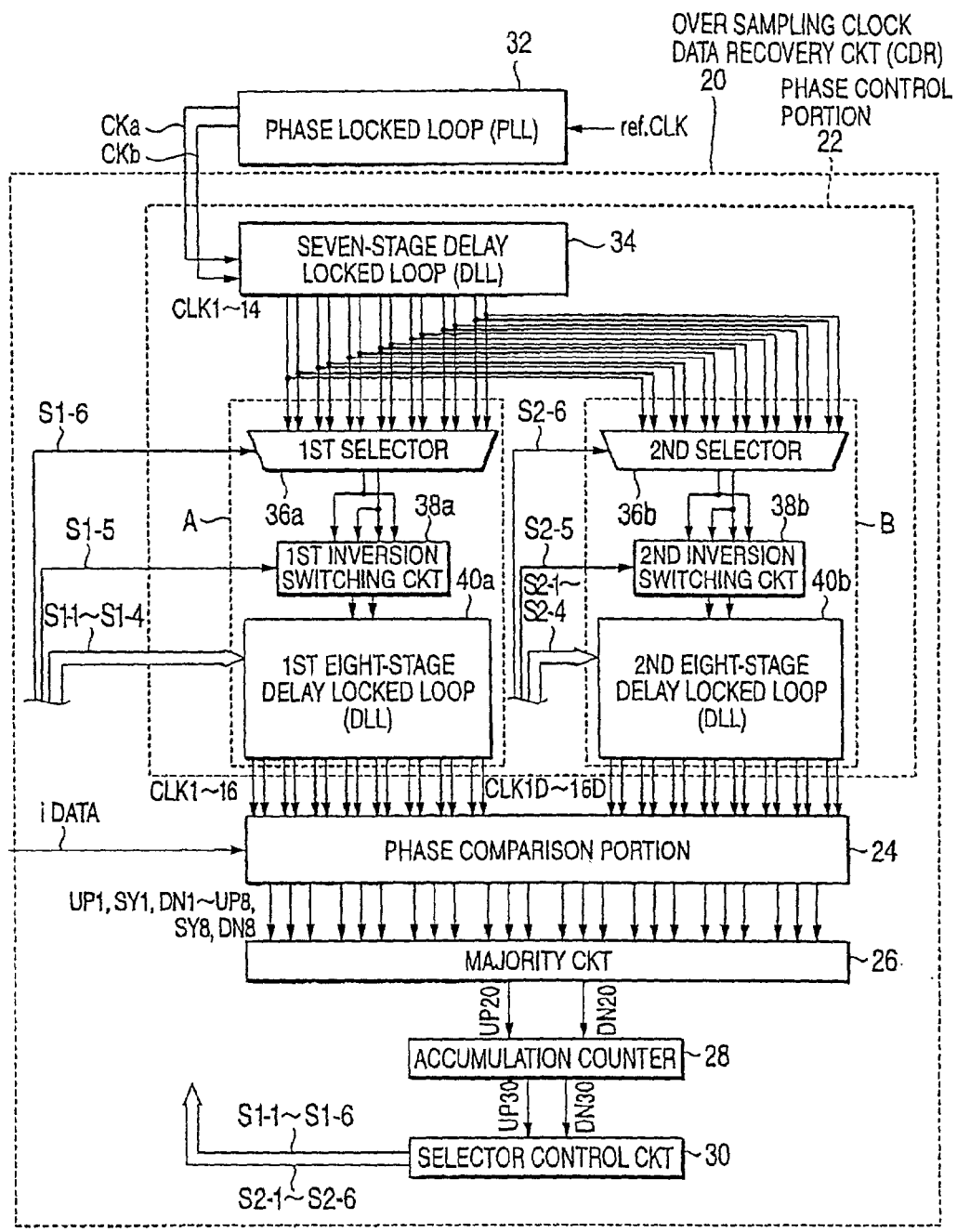
FIG. 3 is a block diagram showing an oversampling clock recovery circuit according to a second embodiment of this invention.

Referring to FIGS. 3 through 10, the description will proceed to an oversampling clock data recovery circuit according to a second embodiment of this invention. FIG. 3 is a block diagram showing the oversampling clock data recovery circuit according to the second embodiment of this invention.

The first embodiment does not describe about realization of circuitry. The illustrated oversampling clock data recovery circuit (which may be called "CDR" for short) is a circuit for implementing the oversampling clock recovery method of the first embodiment. In the second embodiment, description exemplifies a case of dealing with an 8-bit serial input data having a data rate of 2.5 Gbps and a differential clock signal having a clock frequency of 312.5 MHz (a period of 3200 ps).

The oversampling clock recovery circuit according to the second embodiment generates, as first multi-phase clock signals, fourteen multi-phase clock signals CK1 to CCK14, as second multi-phase clock signals, sixteen multi-phase clock signals CLK1 to CLK16, and as third multi-phase clock signals, sixteen multi-phase clock signals CLK1D to CLK16D.

The oversampling clock recovery circuit comprises first through third delay locked loops (DLLs), first through fourth selection circuits. A seven-stage DLL 34 is used as the first DLL. An eight-stage DLL 40a is used as the second DLL. An eight-stage DLL 40b is used as the third DLL. A selector 36a is used as the first selection circuit. A selector 36a is used as the second selection circuit. Selectors 61a, 62a, 63a, and 64a are collectively used as the third selection circuit. Selectors 61b, 62b, 63b, and 64b are collectively used as the fourth selection circuit.

[1. General Structure]

As shown in FIG. 3, the oversampling clock data recovery circuit depicted at 20 comprises a phase control portion 22, a phase comparison portion 24, a majority circuit 26, an accumulation counter 28, and a selector control circuit 30. The oversampling clock data recovery circuit 20 is supplied with clock signals CKa and CKb from an external phase locked loop (PLL) 32. The selector control circuit 30 generates first through sixth primary selection control signals S1-1 to S1-6 and first through sixth secondary selection control signals S2-1 to S2-6.

The phase control portion 22 comprises a seven-stage delay locked loop (DLL) 34, first and second selectors 36a and 36b, first and second inversion switching circuits 38a and 38b, and first and second eight-stage delay locked loops (DLLs) 40a and 40b. The first and the second selectors 36a and 36b are similar in structure. The first and the second inversion switching circuits 38a and 38b are similar in structure. The first and the second eight-stage delay locked loops 40a and 40b are similar in structure. A combination of the first selector 36a, the first inversion switching circuit 38a, and the first eight-stage delay locked loop 40a constitutes a side A while a combination of the second selector 36b, the second inversion switching circuit 38b, and the second eight-stage delay locked loop 40b constitutes a side B.

[2. General Processing Flow]

Now, description will be made about schematic processing of the phase locked loop 32 and the oversampling clock data recovery circuit 20.

The phase locked loop 32 generates differential clock signals CKa and CKb each having a clock frequency of 312.5 MHz. The differential clock signals CKa and CKb have a clock period of 3200 ps and are different in phase from each other by a half period or 1600 ps. That is, the differential clock signals CKa and CKb have an inverted relationship. The seven-stage delay locked loop 34 expands the differential clock signals CKa and CKb into fourteen-phase clock signals (seven pairs of differential clock signals) CK1 to CK14 having a first uniform phase interval of 3200 ps/14 or about 228.8 ps. The seven-stage delay locked loop 34 sends the fourteen-phase clock signals CK1 to CK14 to the first and the second selectors 36a and 36b.

The first and the second selectors 36a and 36b are supplied with the sixth primary selection control signal S1-6 and the sixth secondary selection control signal S2-6 from the selector control circuit 30, respectively. On the basis of the sixth primary selection control signal S1-6, the first selector 36a selects, as a pair of primary selected differential clock signals, a first pair of differential clock signals from the fourteen-phase clock signals CK1 to CK14 to send the pair of the primary selected differential clock signals to the first inversion switching circuit 38a. Likewise, on the basis of the sixth secondary selection control signal S2-6, the second selector 36b selects, as a pair of secondary selected differential clock signals, a second pair of differential clock signals from the fourteen-phase clock signals CK1 to CK14 to send the pair of the secondary selected differential clock signals to the second inversion switching circuit 38a.

The first and the second inversion switching circuits 38a and 38b are supplied with the fifth primary selection control signal S1-5 and the fifth secondary selection control signal S2-5 from the selector control circuit 30, respectively. On the basis of the fifth primary selection control signal S1-5, the first inversion switching circuit 38a switches, as a pair of primary switched differential clock signals, either inversion or noninversion of the pair of the primary selected differential clock signals to send the pair of the primary switched differential clock signals to the first eight-stage delay locked loop 40a. That is, when the first primary selection control signal S1-5 indicates inversion, the first inversion switching circuit 38a inverts the pair of the primary selected differential clock signals to make a pair of primary inverted differential clock signals pass as the pair of the primary switched differential clock signals. When the first primary selection control signal S1-5 indicates noninversion, the first inversion switching circuit 38a makes the pair of the primary selected differential clock signals pass the pair of the primary switched differential clock signals as it is.

Likewise, on the basis of the fifth secondary selection control signal S2-5, the second inversion switching circuit 38b switches, as a pair of secondary switched differential clock signals, either inversion or noninversion of the pair of the secondary selected differential clock signals to send the pair of the secondary switched differential clock signals to the second eight-stage delay locked loop 40b. That is, when the fifth secondary selection control signal S2-5 indicates inversion, the second inversion switching circuit 38b inverts the pair of the secondary selected differential clock signals to make a pair of secondary inverted differential clock signals pass as the pair of the secondary switched differential clock signals. When the first secondary selection control signal S2-5 indicates noninversion, the second inversion switching circuit 38b makes the pair of the secondary selected differential clock signals pass the pair of the secondary switched differential clock signals as it is.

The first eight-stage delay locked loop 40a is supplied with the first through the fourth primary selection signals S1-1 to S1-4 from the selector control circuit 30 while the second eight-stage delay locked loop 40b is supplied with the first through the fourth secondary selection signals S2-1 to S2-4 from the selector control circuit 30.

The first eight-stage delay locked loop 40a expands the pair of the primary switched clock signals into primary sixteen-phase clock signals (eight pairs of primary differential clock signals) CLK1 to CLK16 having a second uniform phase intervals of 3200 ps/16 or 200 ps. The first eight-stage delay locked loop 40a sends the primary sixteen-phase clock signals CLK1 to CLK16 to the phase comparison circuit 24. In this event, the first eight-stage delay locked loop 40a switches, on the first through the fourth primary selection control signals S1-1 to S1-4, the primary sixteen-phase clock signals CLK1 to CLK16 which should be phase locked with the pair of the primary switched clock signals.

Similarly, the second eight-stage delay locked loop 40b expands the pair of the secondary switched clock signals into secondary sixteen-phase clock signals (eight pairs of secondary differential clock signals) CLK1D to CLK16D having the second uniform phase intervals of 3200 ps/16 or 200 ps. The second eight-stage delay locked loop 40b switches, on the first through the fourth secondary selection control signals S2-1 to S2-4, the secondary sixteen-phase clock signals CLK1D to CLK16D which should be phase locked with the pair of the primary switched clock signals.

By the above-mentioned operation of the first selector 36a, the first inversion switching circuit 38a, and the first eight-stage delay locked loop 40a on the basis of the first through the sixth primary selection control signals S1-1 to S1-6, the pair of the primary selected differential clock signals among the fourteen-phase clock signals CK1 to CK14 and a pair of differential clock signals selected from the primary sixteen-phase clock signals CLK1 to CLK16 are phase locked with each other and a combination of clock signals to be phase locked is changed.

Likewise, by the above-mentioned operation of the second selector 36b, the second inversion switching circuit 38b, and the second eight-stage delay locked loop 40b on the basis of the first through the sixth secondary selection control signals S2-1 to S2-6, the pair of the secondary selected differential clock signals among the fourteen-phase clock signals CK1 to CK14 and a pair of differential clock signals selected from the secondary sixteen-phase clock signals CLK1D to CLK16D are phase locked with each other and a combination of clock signals to be phase locked is changed.

By this switching operation, the phase control portion 22 shifts the primary sixteen-phase clock signals CLK1 to CLK16 and the secondary sixteen-phase clock signals CLK1D to CLK16D as a whole with respective phase intervals therebetween maintained. In the example being illustrated, the phase control portion 22 carries out a phase shift operation at a resolution of 57 ps. In other words, the phase control portion 22 carries out a phase control with the period of 3600 ps divided into fifty-six pieces at the resolution of 57 ps. In addition, the phase control portion 22 controls the primary sixteen-phase clock signals CLK1 to CLK16 and the secondary sixteen-phase clock signals CLK1D to CLK16D so as to put the secondary sixteen-phase clock signals CLK1D to CLK16D forward for the primary sixteen-phase clock signals CLK1 to CLK16 by one resolution of 57 ps. That is, the phase control portion 22 controls so that a circuitry of the side B always puts forward for a circuitry of the side A at the one resolution of 57 ps.

Supplied with the primary sixteen-phase clock signals CLK1 to CLK16 and the secondary sixteen-phase clock signals CLK1D to CLK16D, the phase comparison portion 24 samples the 8-bit serial input data i having the data rate of 2.5 Gbps into sampled input data, phase compares the sampled input data i with the clock signals CLK1 to CLK16 and CLK1D to CLK16D, determines lead/lag of the clock signals in reference with the sampled input data i every each bit, and produces first through eighth UP signals UP1 to UP8, first through eighth synchronization signals SY1 to SY8, and first through eighth DOWN signals DN1 to DN8 which are supplied to the majority circuit 26.

More specifically, the phase comparison portion 24 comprises first through eighth comparators (not shown) which are arranged in parallel with each other. The first comparator produces either one of the first UP signal UP1, the first synchronization signal SY1, and the first DOWN signal DN1. Likewise, the second comparator produces either one of the second UP signal UP2, the second synchronization signal SY2, and the second DOWN signal DN2. In general, an n-th comparator produces either one of an n-th UP signal UPn, an n-th synchronization signal SYn, and an n-th DOWN signal DNn, where n represents a positive integer between 1 and 8, both inclusive. When there is no variation in the data, it is impossible to determine lag/lead of the clock signal for the input data i. In this event, any comparator does not produce any one of the UP signal, the synchronization signal, and the DOWN signal.

The UP signal is a signal indicating that the phases of the clock signals CLK1 to CLK16 and CLK1D to CLK16D should be put forward or up by determining that the clock signals are late for the input data i. The synchronization signal is a signal indicative of a result where the input data i and the clock signals are synchronized with each other. The DOWN signal is a signal indicating that the phases of the clock signals CLK1 to CLK16 and CLK1D to CLK16D should be put backward or down by determining that the clock signals are earlier than the input data i.

The majority circuit 26 decides by majority of eight ones in the first through the eighth UP signals UP1 to UP8, the first through the eighth synchronization signals SY1 to SY8, and the first through the eighth DOWN signals DN1 to DN8 that produced by the phase comparison portion 24. The majority circuit 26 supplies, as a majority result, either a decided UP signal UP20 or a decided DOWN signal DN20 to the accumulation counter 28. When the majority result indicates synchronization, the majority circuit 26 does not any one of the decided UP signal UP20 and the decided DOWN signal DN20. That is:

UP20=0, DN20=0.

The accumulation counter 28 carries out a count operation on the decided UP signal UP20 or the decided DOWN signal DN20 in the manner which will presently be described. The accumulation counter 28 supplies the selector control circuit 30 with an accumulated UP signal UP30 or an accumulated DOWN signal DN30.

More specifically, the accumulation counter 28 initially has an accumulated value of zero. Responsive to the decided UP signal UP20, the accumulation counter 28 adds one to the accumulated value or counts the accumulated value up by one. Responsive to the decided DOWN signal DN20, the accumulation counter 28 subtracts one from the accumulated value or counts the accumulated value down by one. When the accumulated value is equal to 4, the accumulation counter 28 initializes the accumulated value to reset the accumulated value to 0 and supplies the accumulated UP signal UP30 to the selector control circuit 30. When the accumulated value is equal to −4, the accumulation counter 28 initializes the accumulated value to reset the accumulated value to 0 and supplies the accumulated DOWN signal DN30 to the selector control circuit 30.

In the manner which is described above, the accumulation counter 28 carries out processing so as to weight the decided UP signal UP20 or the decided DOWN signal DN20 with 0.25. This is because it makes the oversampling clock data recovery circuit (CDR) 20 respond to a large jitter having a low frequency in the input data i so as to never make the oversampling clock data recovery circuit (CDR) 20 respond to a small jitter having a high frequency in the input data i that is unnecessary to follow up the clock signals. A weighing factor of 0.25 per one time is exemplified to carry out optimal clock recovery. Accordingly, an optimal weighting factor differs in dependency on a date late or a jitter frequency.

Responsive to the accumulated UP signal UP30, the selector control circuit 30 selects the first through the sixth primary selection control signals S1-1 to S1-6 and the first through the sixth secondary selection control signals S2-1 to S2-6 for putting the primary sixteen-phase clock signals CLK1 to CLK16 and the secondary sixteen-phase clock signals CLK1D to CLK16D forward by one resolution of 57 ps and supplies them to the phase control portion 22.

Responsive to the accumulated DOWN signal DN30, the selector control circuit 30 selects the first through the sixth primary selection control signals S1-1 to S1-6 and the first through the sixth secondary selection control signals S2-1 to S2-6 for putting the primary sixteen-phase clock signals CLK1 to CLK16 and the secondary sixteen-phase clock signals CLK1D to CLK16D backward by one resolution of 57 ps and supplies them to the phase control portion 22.

In the manner which is described above, the phase control portion 22 switches, on the basis of the first through the sixth primary selection control signals S1-1 to S1-6 and the first through the sixth secondary selection control signals S2-1 to S2-6, a combination of a pair of differential clock signals for constructing the fourteen-phase clock signals CK1 to CK14 and a pair of differential clock signals for constructing the sixteen-phase clock signals CLK1 to CLK16 (CLK1D to CLK16D) which should be phase locked. As a result, the phase control portion 22 shifts the primary sixteen-phase clock signals CLK1 to CLK16 and the secondary sixteen-phase clock signals CLK1D to CLK16D by one resolution.

[3. Digital Phase Control in View of Waveforms and a Phase Chart]

Referring now to FIG. 4 and Table 2, the description will proceed. FIG. 4 is a timing chart showing schematic waveforms indicative of position relationship of clock edges in the second embodiment of this invention. In FIG. 4, a first or top line depicted at (a) shows a waveform of a clock signal having a clock frequency of 312.5 MHz, a second line depicted at (b) shows waveforms indicating leading edges of the fourteen multi-phase clock signals CK1 to CK14, a third line depicted at (c) shows waveforms indicating leading edges of the primary sixteen multi-phase clock signals CLK1 to CLK16.

As described above, the fourteen multi-phase clock signals CK1 to CK14 shown as (b) in FIG. 4 are clock signals generated by the seven-stage delay locked loop 34 and have a first phase interval of 3200 ps/14≈228.6 ps. The primary sixteen multi-phase clock signals CLK1 to CLK16 shown as (c) in FIG. 4 are clock signals generated by the first eight-stage delay locked loop 40a and have a second phase interval of 3200 ps/16=200 ps. For example, the clock signal CK1 and the clock signal CK8 have a phase difference equal to a half-period of 1600 ps. That is, a combination of the clock signal CK1 and the clock signal CK8 serves as a pair of differential clock signals. This pair of differential clock signals are depicted at a first pair of differential clock signals CK1–CK8. Likewise, the seven-stage delay locked loop 34 generates not only the first pair of differential clock signals CK1–CK8 but also second through seventh pairs of differential clock signals CK2–CK9, CK3–CK10, CK4–CK11, CK5–CK12, CK6–CK13, and CK7–CK15.

Similarly, the first eight-stage delay locked loop 40a generates first through eighth pairs of differential clock signals CLK1–CLK9, CLK2–CLK10, CLK3–CLK11, CLK4–CLK12, CLK5–CLK13, CLK6–CLK14, CLK7–CLK15, and CLK8–CLK16. On notation, it will be assumed that a pair of differential clock signals A-B and a pair of differential clock signals B-A are inverted to each other.

The phase control portion 22 changes a combination of clock signals to be phase-locked at a first cycle of pairs of differential clocks CK1–CK8→CK3–CK10→CK5–CK12→CK7–CK14→CK9–CK2→CK11–CK4→CK13–CK6 as regards the fourteen multi-phase clock signals CK1 to CK14 and at a second cycle of pairs of differential clocks CLK1–CLK9→CLK3–CLK11→CLK5–CLK13→CLK7–CLK15→CLK9–CLK1→CLK11–CLK3→CLK13–CLK5→CLK15–CLK7 as regards the primary sixteen multi-phase clock signals CLK1 to CLK16.

By changing the combination of the clock signals, it is possible to successively shift a phase of the primary sixteen multi-phase clock signals CLK1 to CLK16 57 ps by 57 ps with the second phase interval maintained to 200 ps. Fifty-six synchronization states obtained by combining the first cycle with the second cycle will be described with symbols or number <1> to <56>. A list of combination of the symbols (number) for the synchronization states and the clock signals is illustrated in Table 2 as follows.

TABLE 2

| A | B | C | D | E | F (C − E) |
|---|---|---|---|---|---|
| <1> | CK1–CK8 | 0.0 | CLK1–CLK9 | 0.0 | 0.0 |
| <2> | CK3–CK10 | 457.2 | CLK3–CLK11 | 400.0 | 57.2 |
| <3> | CK5–CK12 | 914.4 | CLK5–CLK13 | 800.0 | 114.4 |
| <4> | CK7–CK14 | 1371.6 | CLK7–CLK15 | 1200.0 | 171.6 |
| <5> | CK9–CK2 | 1828.8 | CLK9–CLK1 | 1600.0 | 228.8 |
| <6> | CK11–CK4 | 2286.0 | CLK11–CLK3 | 2000.0 | 286.0 |
| <7> | CK13–CK6 | 2743.2 | CLK13–CLK5 | 2400.0 | 343.2 |
| <8> | CK1–CK8 | 0.0 | CLK15–CLK7 | 2800.0 | 400.0 |
| <9> | CK3–CK10 | 457.2 | CLK1–CLK9 | 0.0 | 457.2 |
| <10> | CK5–CK12 | 914.4 | CLK3–CLK11 | 400.0 | 514.4 |
| <11> | CK7–CK14 | 1371.6 | CLK5–CLK13 | 800.0 | 571.6 |
| <12> | CK9–CK2 | 1828.8 | CLK7–CLK15 | 1200.0 | 628.8 |
| <13> | CK11–CK4 | 2286.0 | CLK9–CLK1 | 1600.0 | 686.0 |
| <14> | CK13–CK6 | 2743.2 | CLK11–CLK3 | 2000.0 | 743.2 |
| <15> | CK1–CK8 | 0.0 | CLK13–CLK5 | 2400.0 | 800.0 |
| <16> | CK3–CK10 | 457.2 | CLK15–CLK7 | 2800.0 | 857.2 |
| <17> | CK5–CK12 | 914.4 | CLK1–CLK9 | 0.0 | 914.4 |
| <18> | CK7–CK14 | 1371.6 | CLK3–CLK11 | 400.0 | 971.6 |
| <19> | CK9–CK2 | 1828.8 | CLK5–CLK13 | 800.0 | 1028.8 |
| <20> | CK11–CK4 | 2286.0 | CLK7–CLK15 | 1200.0 | 1086.0 |
| <21> | CK13–CK6 | 2743.2 | CLK9–CLK1 | 1600.0 | 1143.2 |
| <22> | CK1–CK8 | 0.0 | CLK11–CLK3 | 2000.0 | 1200.0 |
| <23> | CK3–CK10 | 457.2 | CLK13–CLK5 | 2400.0 | 1257.2 |
| <24> | CK5–CK12 | 914.4 | CLK15–CLK7 | 2800.0 | 1314.4 |
| <25> | CK7–CK14 | 1371.6 | CLK1–CLK9 | 0.0 | 1371.6 |
| <26> | CK9–CK2 | 1828.8 | CLK3–CLK11 | 400.0 | 1428.8 |
| <27> | CK11–CK4 | 2286.0 | CLK5–CLK13 | 800.0 | 1486.0 |
| <28> | CK13–CK6 | 2743.2 | CLK7–CLK15 | 1200.0 | 1543.2 |
| <29> | CK1–CK8 | 0.0 | CLK9–CLK1 | 1600.0 | 1600.0 |
| <30> | CK3–CK10 | 457.2 | CLK11–CLK3 | 2000.0 | 1657.2 |
| <31> | CK5–CK12 | 914.4 | CLK13–CLK5 | 2400.0 | 1714.4 |
| <32> | CK7–CK14 | 1371.6 | CLK15–CLK7 | 2800.0 | 1771.6 |
| <33> | CK9–CK2 | 1828.8 | CLK1–CLK9 | 0.0 | 1828.8 |
| <34> | CK11–CK4 | 2286.0 | CLK3–CLK11 | 400.0 | 1886.0 |
| <35> | CK13–CK6 | 2743.2 | CLK5–CLK13 | 800.0 | 1943.2 |
| <36> | CK1–CK8 | 030 | CLK7–CLK15 | 1200.0 | 2000.0 |
| <37> | CK3–CK10 | 457.2 | CLK9–CLK1 | 1600.0 | 2057.2 |
| <38> | CK5–CK12 | 914.4 | CLK11–CLK3 | 2000.0 | 2114.4 |
| <39> | CK7–CK14 | 1371.6 | CLK13–CLK5 | 2400.0 | 2171.6 |
| <40> | CK9–CK2 | 1828.8 | CLK15–CLK7 | 2800.0 | 2228.8 |

TABLE 2-continued

| A | B | C | D | E | F (C - E) |
|---|---|---|---|---|---|
| <41> | CK11–CK4 | 2286.0 | CLK1–CLK9 | 0.0 | 2286.0 |
| <42> | CK13–CK6 | 2743.2 | CLK3–CLK11 | 400.0 | 2343.2 |
| <43> | CK1–CK8 | 0.0 | CLK5–CLK13 | 800.0 | 2400.0 |
| <44> | CK3–CK10 | 457.2 | CLK7–CLK15 | 1200.0 | 2457.2 |
| <45> | CK5–CK12 | 914.4 | CLK9–CLK1 | 1600.0 | 2514.4 |
| <46> | CK7–CK14 | 1371.6 | CLK11–CLK3 | 2000.0 | 2571.6 |
| <47> | CK9–CK2 | 1828.8 | CLK13–CLK5 | 2400.0 | 2628.8 |
| <48> | CK11–CK4 | 2286.0 | CLK15–CLK7 | 2800.0 | 2686.0 |
| <49> | CK13–CK6 | 2743.2 | CLK1–CLK9 | 0.0 | 2743.2 |
| <50> | CK1–CK8 | 0.0 | CLK3–CLK11 | 400.0 | 2800.0 |
| <51> | CK3–CK10 | 457.2 | CLK5–CLK13 | 800.0 | 2857.2 |
| <52> | CK5–CK12 | 914.4 | CLK7–CLK15 | 1200.0 | 2914.4 |
| <53> | CK7–CK14 | 1371.6 | CLK9–CLK1 | 1600.0 | 2971.6 |
| <54> | CK9–CK2 | 1828.8 | CLK11–CLK3 | 2000.0 | 3028.8 |
| <55> | CK11–CK4 | 2286.0 | CLK13–CLK5 | 2400.0 | 3086.0 |
| <56> | CK13–CK6 | 2743.2 | CLK15–CLK7 | 2800.0 | 3143.2 |

In Table 2, an item A represents the number of the synchronization state, an item B represents a reference number of a pair of differential clock signals to be locked among the fourteen multi-phase clock signals CK1 to CK14, and an item C represents a phase of one described at a head (left-side) in the pair of the differential clock signals. An item D represents a reference number of a pair of differential clock signals to be locked among the primary sixteen multi-phase clock signals CLK1 to CLK16, an item E represents a phase difference between the clock signal CLK1 and one described at a head (left-side) in the pair of the differential clock signals, and item F represents a phase of the clock signal CLK1.

It will be assumed that a reference clock signal is the clock signal CLK1.

Now, examination is made about the phase of the primary sixteen multi-phase clock signals CLK1 to CLK16 in each synchronization state. Inasmuch as the primary sixteen multi-phase clock signals CLK1 to CLK16 have the second phase interval of 200 ps, the phase of the clock signal CLK1 will be checked on behalf of the primary sixteen multi-phase clock signals CLK1 to CLK16. When the phase of the clock signal CLK1 is specified or fixed as a specified phase, remaining fifteen clock signals CLK2 to CLK16 have phases obtained by successively adding 200 ps by 200 ps to the specified phase in this order.

The fourteen multi-phase clock signals CK1 to CK14 have the first phase interval of 228.6 ps and have fixed phases. It will be assumed that the clock signal CK1 has a reference phase of 0 ps. In this event, as illustrated in Table 2, seven clock signals having odd number in the fourteen multi-phase clock signals CK1 to CK14 have phases in this order as follows: CK1: 0 ps, CK3: 457.2 ps, CK5: 914.4 ps, CK7: 1371.6 ps, CK9: 1828.8 ps, CK11: 2286 ps, and CK13: 2743.2 ps.

In a first synchronization state <1>, inasmuch as the clock signal CK1 and the clock signal CLK1 are phase-locked with each other, the clock signal CLK1 has the specified phase of 0 ps. In a second synchronization state <2>, inasmuch as clock signal CK3 and the clock signal CLK3 are phase-locked with each other, the reference clock signal CLK4 has the specified phase of 57.2 ps obtained by subtracting a phase difference of 400 ps between the clock signal CK3 and the clock signal CLK1 from a phase of 457.2 ps of the clock signal CK3. In similar manner, the specified phase of the reference clock signal CLK1 in third through fifty-sixth synchronization states <3> to <56> is calculated as shown in the item F of Table 2. For example, attention will be directed to the eighth synchronization state <8>. Inasmuch as the clock signal CK1 and the clock signal CLK15 are phase-locked with each other, the reference clock signal CLK1 has the specified phase of −2800 ps obtained by subtracting a phase difference of 2800 ps between the clock signal CLK15 and the clock signal CLK1 from a phase of 0 ps of the clock signal CK1. In such a case where the specified phase has a value beyond a range of numerical values of one period, in terms of the range (0≦x<3200) of numerical values of one period, the specified phase of the reference clock signal CLK1 is equal to 400 ps. In the manner which is understood by referring to the item F of Table 2, the reference clock signal CLK1 is phase shifted at the resolution of 57 ps. This means that the primary sixteen multi-phase clock signals CLK1 to CLK16 are phase shifted at the resolution of 57 ps with the second phase interval maintained to keep 200 ps.

By successively changing the synchronization state in the forward direction of <1>→<2>→ . . . →<55>→<56>→<1>→ . . . , it is possible to delay the phases of the primary sixteen multi-phase clock signals CLK1 to CLK16 at the resolution of 57 ps. Conversely, by successively changing the synchronization state in the reverse direction of <1>→<56>→<55>→ . . . →<2>→<1>→ . . . , it is possible to advance the phases of the primary sixteen multi-phase clock signals CLK1 to CLK16 at the resolution of 57 ps.

In FIG. 4, (c) illustrates the fifty-sixth, the first through the tenth synchronization states <56> and <1> to <10>. In each synchronization state of (c) in FIG. 4, symbols of the phase-locked clock signals are set in a frame.

As shown in FIG. 4, in the first synchronization state <1>, the pair of the differential clock signals CK1–CK8 among the fourteen multi-phase clock signals CK1 to CK14 and the pair of the differential clock signals CLK1–CLK9 among the primary sixteen multi-phase clock signals CLK1 to CLK16 are phase-locked with each other. That is, the clock signal CK1 and the clock signal CLK1 are phase-locked with each other while the clock signal CK8 and the clock signal CLK9 are phase-locked with each other.

In the first synchronization state <1>, attention will be directed to the pair of the differential clock signals CK3–CK11. The phase of the pair of the differential clock signals CK3–CK11 advances from the phase of the pair of the differential clock signals CK3–CK10 by 57 ps. Accordingly, by synchronizing the pair of the differential clock signals CK3–CK10 with the pair of the differential clock signals CLK3–CLK11 (making the second synchronization state <2>), it is possible to delay the phases of the primary sixteen multi-phase clock signals CLK1 to CLK16 by 57 ps in regard to the first synchronization state <1>.

In the first synchronization state <1>, the phase of the pair of the differential clock signals CLK7–CLK15 delays from the phase of the pair of the differential clock signals CK6–CK13 by 57 ps. Accordingly, by synchronizing the pair of the differential clock signals CK6–CK13 with the pair of the differential clock signals CLK7–CLK15 (making the fifty-sixth synchronization state <56>), it is possible to advance the phases of the primary sixteen multi-phase clock signals CLK1 to CLK16 by 57 ps in regard to the first synchronization state <1>.

In regard of other all of the synchronization states, the principle of the phase shift in the manner as described above is realized.

According to the digital phase control method in the manner which is described above, it is possible to infinitely (cyclically) phase shift (phase control) the primary sixteen multi-phase clock signals CLK1 to CLK16 at the resolution of 57 ps as a whole with the second phase interval maintained to keep 200 ps both in an advance or lead direction and in a delay or lag direction.

[4. Detailed Description of the Phase Locked Loop (PLL) 32 and the Phase Control Portion 22]

Subsequently, the description will be made about the phase locked loop (PLL) 32 and the phase control portion 22 with reference to figures in detail.

Figure 5:
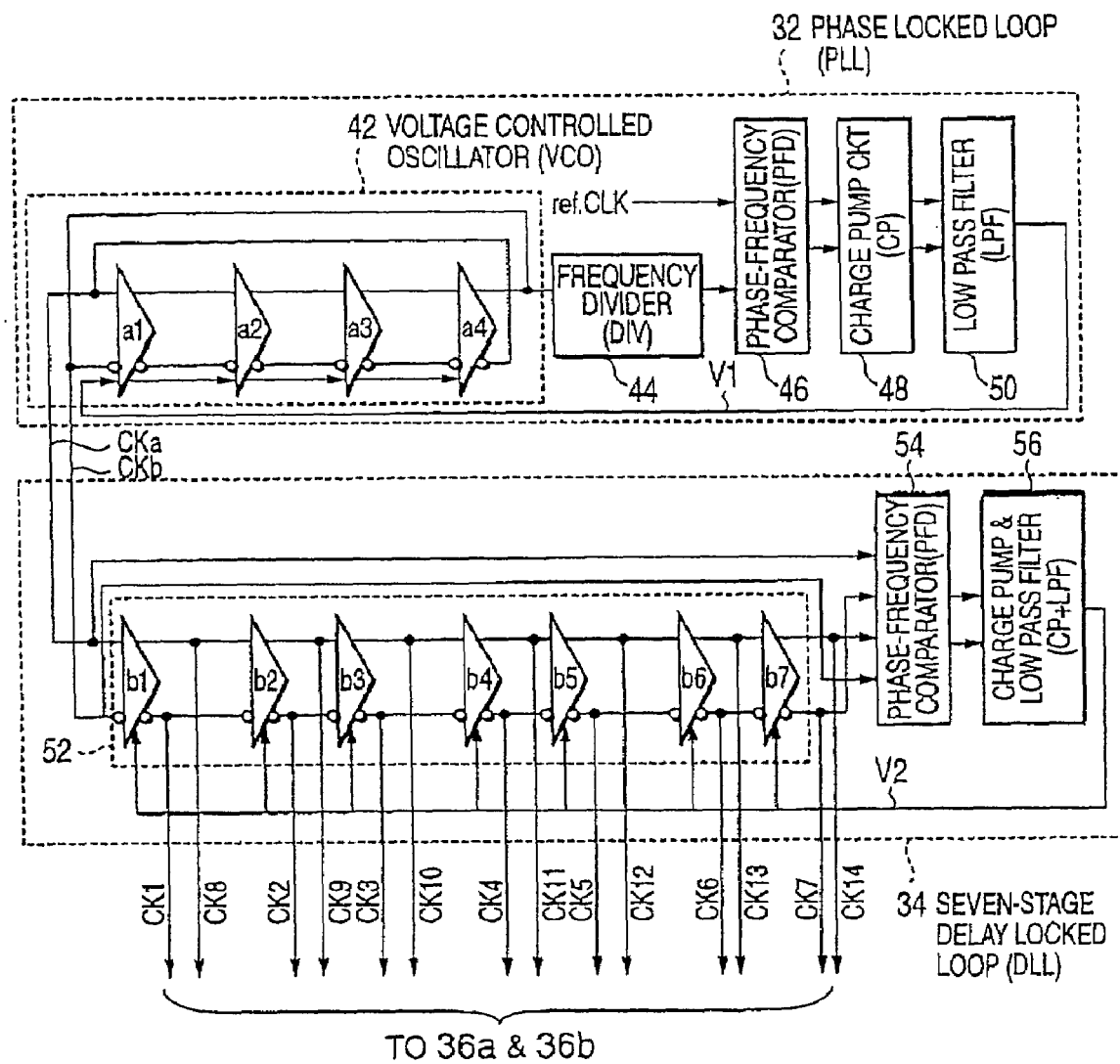
FIG. 5 is a schematic block diagram of a phase locked loop and a seven-stage delay locked loop for use in the oversampling clock recovery circuit illustrated in FIG. 3.

Referring now to FIG. 5, the description will proceed to the phase locked loop (PLL) 32 and the seven-stage delay locked loop (DLL) 34. FIG. 5 is a schematic block diagram showing the phase locked loop (PLL) 32 and the seven-stage delay locked loop (DLL) 34 according to the second embodiment of this invention.

[4-1. Phase Locked Loop (PLL) 32]

In the second embodiment of this invention, the pair of the differential clock signals CKa–CKb are generated by the phase locked loop (PLL) 32. The phase locked loop (PLL) 32 comprises a voltage controlled oscillator (VCO) 42, a frequency divider (DIV) 44 connected to the voltage controlled oscillator 42, a phase-frequency comparator (PFD) 46, a charge pump (CP) 48, and a low pass filter (LPF) 50.

In the phase locked loop (PLL) 32, the phase-frequency comparator 46 is supplied with a reference clock signal ref.CLK. The phase-frequency comparator 46 is also with a divided clock signal from the frequency divider 44. The phase-frequency comparator 46 phase compares the divided clock signal with the reference clock signal to produce an UP/DOWN signal which is supplied to the charge pump 48. A combination of the charge pump 48 and the low pass filter 50 generates a control voltage V1 which is supplied to the voltage controlled oscillator 42. The voltage controlled oscillator 42 comprises first through fourth differential buffers a1 to a4 which are connected to each other in cascade. By the control voltage, a clock signal having a frequency of 312.5 MHz (a period of 3200 ps) is compensated in the voltage controlled oscillator 42. From the voltage controlled oscillator 42, the above-mentioned pair of differential clock signals CKa–CKb are extracted or picked up and are supplied to the seven-stage delay locked loop (DLL) 34 in the over-sampling clock data recovery circuit (CDR) 20. It is possible to supply the clock signal having a stable frequency by using the phase locked loop (PLL) 32.

Now, the phase control portion 22 will be described. The phase control portion 22 comprises the seven-stage delay locked loop (DLL) 34, the side A, and side B. The side A comprises the first selector 36a, the first inversion switching circuit 38c, and the first eight-stage delay locked loop (DLL) 40a. The side B comprises the second selector 36b, the second inversion switching circuit 38b, and the second eight-stage delay locked loop (DLL) 40b.

[4-2. Seven-stage Delay Locked Loop (DLL) 34]

As shown in FIG. 5, the seven-stage delay locked loop 34 comprises a voltage-controlled delay line 52, a phase-frequency comparator (PFD) 54, and a charge pump and low pass filter (CP+LPF) 56. The voltage-controlled delay line 52 comprises a seven-stage differential delay buffer or first through seventh differential delay buffers b1, b2, b3, b4, b5, b6, and b7 which have a similar characteristic. The phase-frequency comparator 54 phase compares the clock signal CKa supplied to the first differential delay buffer b1 with a seventh delay output clock signal CK7 produced by the seventh differential delay buffer b1 to detect a first phase difference therebetween. The phase-frequency comparator 54 phase compares the clock signal CKb supplied with the first differential delay buffer b1 with a fourteenth delay output clock signal CK14 produced by the seventh differential delay buffer b7 to detect a second phase difference therebetween, The first and the second phase differences are supplied to the charge pump and low pass filter 56. On the basis of the first and the second phase differences, the charge pump and low pass filter 56 generates a second control voltage V2 which is supplied to the first through the seventh differential delay buffers b1 to b7. Therefore, the charge pump and low pass filter 56 feedback controls the delay line 52 so that the delay line 52 has a total delay equal to half period of 1600 ps of the clock signals CKa and CKb. As a result, each of the first through the seventh delay buffers b1 to b7 has a propagation delay to keep equal to (1600/7) ps≈228.6 ps and the fourteen multi-phase clock signals CK1 to CK14 have the first phase interval to keep equal to (1600/7)ps≈228.6 ps.

[4-3. Circuitry of Side A and Side B]

Figure 6:
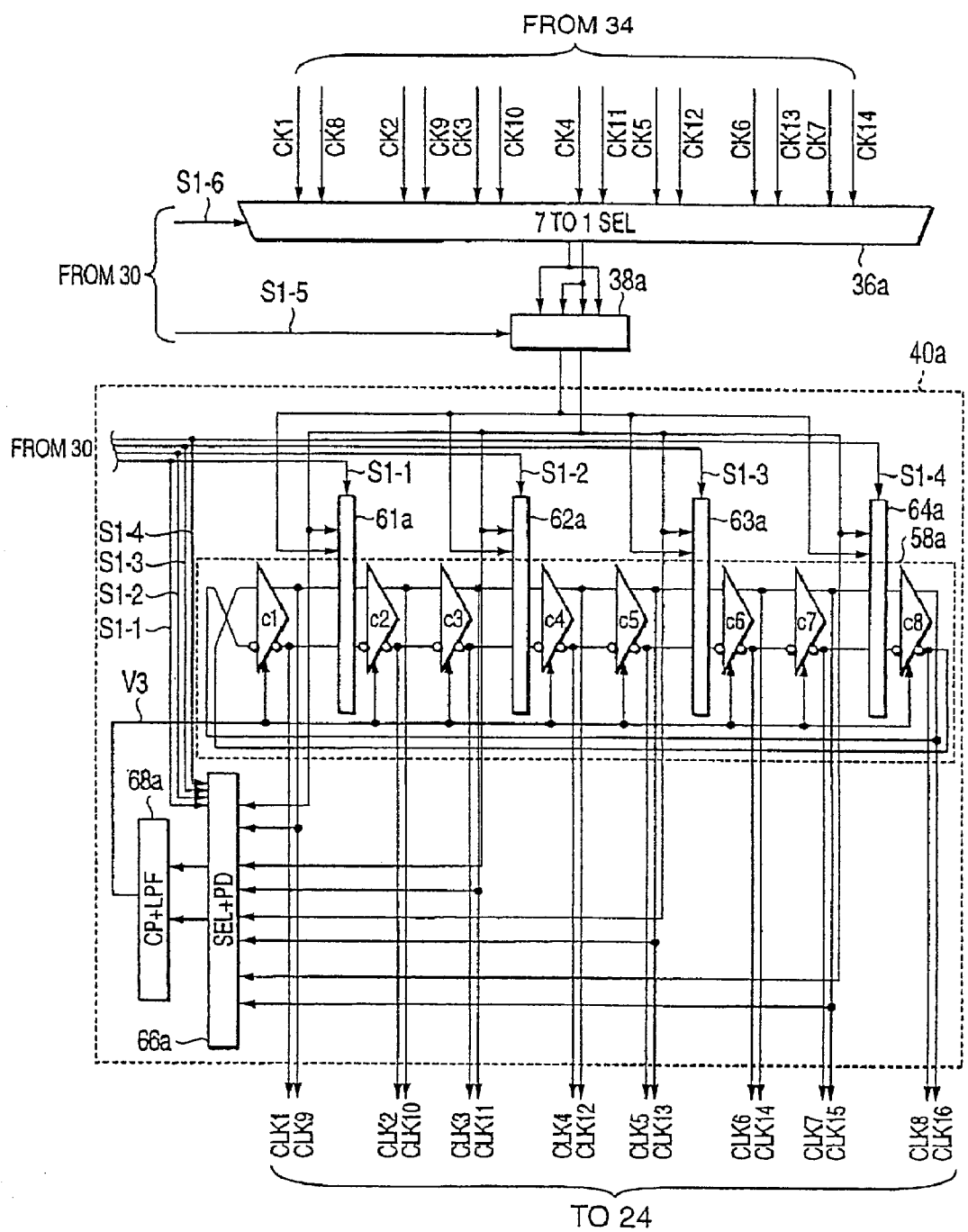
FIG. 6 is a schematic circuit diagram of a side A comprising a first selector, a first inversion switching circuit, and a first eight-stage delay locked loop for use in the oversampling clock recovery circuit illustrated in FIG. 3.
Figure 7:
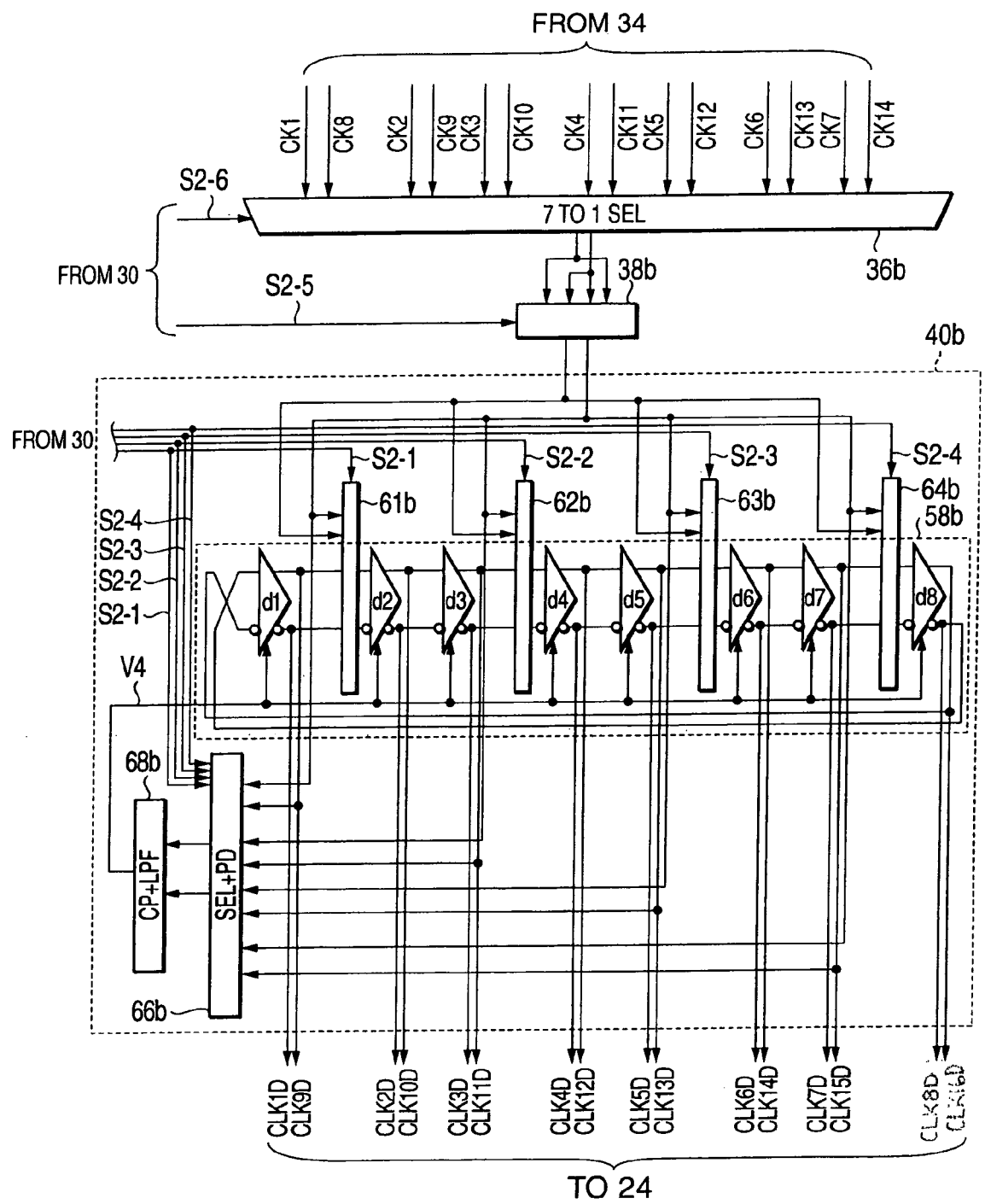
FIG. 7 is a schematic circuit diagram of a side B comprising a second selector, a second inversion switching circuit, and a second eight-stage delay locked loop for use in the oversampling clock recovery circuit illustrated in FIG. 3.
Figure 8:
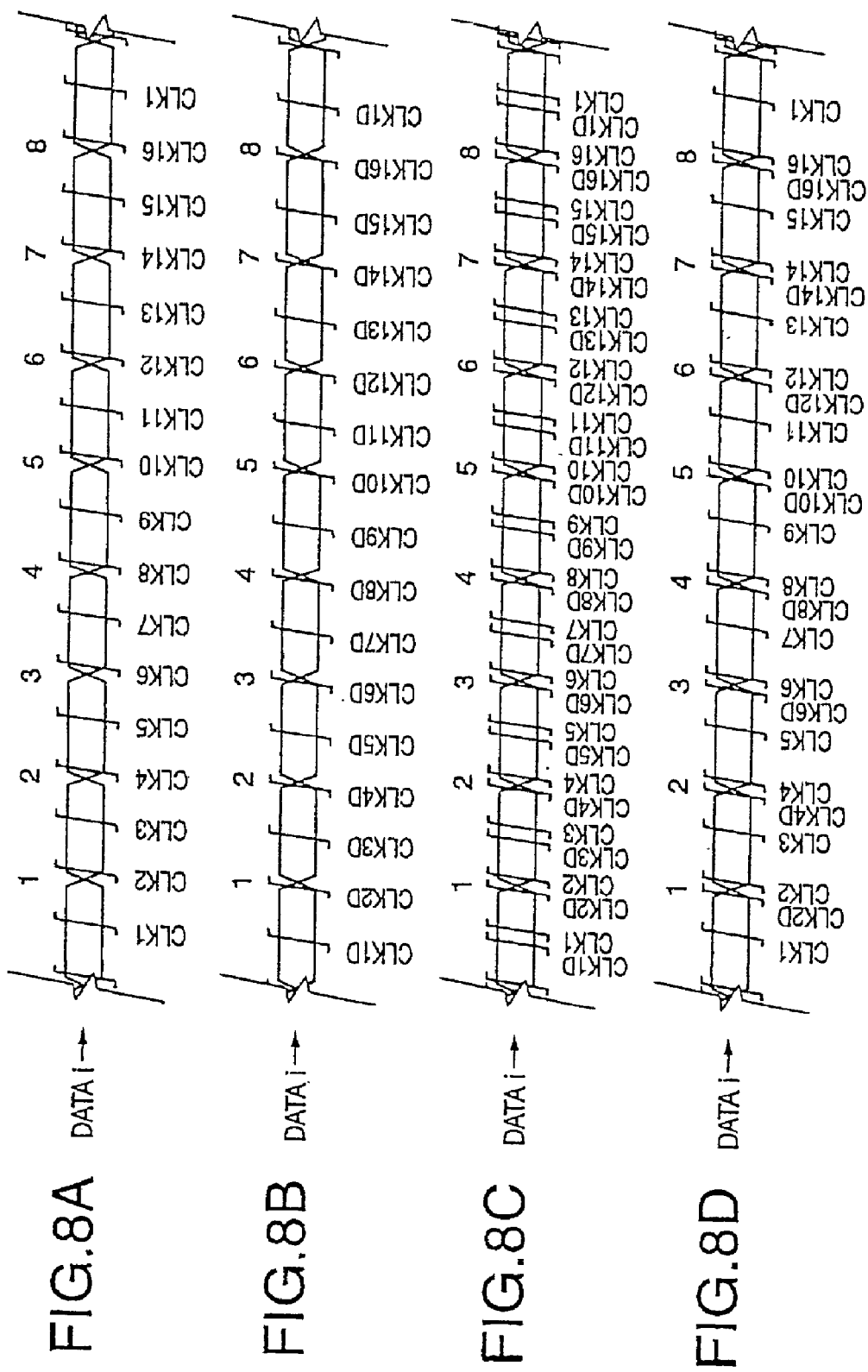
FIGS. 8A through 8D collectively show time charts schematically showing waveforms indicating position relationship between an input data i and leading clock edges in the oversampling clock recovery circuit illustrated in FIG. 3.

Referring now to FIGS. 6 and 7, the description will proceed to the side A and the side B. FIG. 6 is a schematic block diagram showing the first selector 36a, the first inversion switching circuit 38a, and the first eight-stage delay locked loop (DLL) 40a which constitute the side A illustrated in FIG. 3. FIG. 7 is a schematic block diagram showing the second selector 36b, the second inversion switching circuit 38b, and the second eight-stage delay locked loop (DLL) 40b which constitute the side B illustrated in FIG. 3.

In the manner which is described above, the side A and the side B are similar in structure to each other except that the phases of the secondary sixteen multi-phase clock signals CLK1D to CLK16D are controlled, on the basis of different control signals, so as to put the phases of the secondary sixteen multi-phase clock signals CLK1D to CLK16D forward by one resolution of 57 ps as a whole regards to the phases of the primary sixteen multi-phase clock signals CLK1 to CLK16.

[4-3-1. Selectors 36a and 36b, Inversion Switching Circuits 38a and 38b]

In the manner which is described above, the first selector 36a selects, on the basis of the sixth primary selection control signal S1-6, the pair of the primary selected differential clock signals from seven pairs of the differential clock signals CK1–CK8, CK2–CK9, CK3–CK10, CK4–CK11, CK5–CK12, CK6–CK13, and CK7–CK14 to send the pair of the primary selected differential clock signals to the first inversion switching circuit 38a. Likewise, on the basis of the sixth secondary selection control signal S2-6, the second selector 36b selects the pair of the secondary selected differential clock signals from the seven pairs of the differential clock signals CK1–CK8, CK2–CK9, CK3–CK10, CK4–CK11, CK5–CK12, CK6–CK13, and CK7–CK14 to send the pair of the secondary selected differential clock signals to the second inversion switching circuit 38b.

On the basis of the fifth primary selection control signal S1-5, the first inversion switching circuit 38a switches, as the pair of the primary switched differential clock signals, either inversion or noninversion of the pair of the primary selected differential clock signals to send the pair of the primary switched differential clock signals to the first eight-stage delay locked loop 40a. That is, when the fifth primary selection control signal S1-5 indicates inversion, the first inversion switching circuit 38a inverts the pair of the primary selected differential clock signals to make a pair of primary inverted differential clock signals pass as the pair of the primary switched differential clock signals. When the fifth primary selection control signal S1-5 indicates noninversion, the first inversion switching circuit 38a makes the pair of the primary selected differential clock signals pass the pair of the primary switched differential clock signals as it is.

Likewise, on the basis of the fifth secondary selection control signal S2-5, the second inversion switching circuit 38b switches, as the pair of the secondary switched differential clock signals, either inversion or noninversion of the pair of the secondary selected differential clock signals to send the pair of the secondary switched differential clock signals to the second eight-stage delay locked loop 40b. That is, when the fifth secondary selection control signal S2-5 indicates inversion, the second inversion switching circuit 38b inverts the pair of the secondary selected differential clock signals to make a pair of secondary inverted differential clock signals pass as the pair of the secondary switched differential clock signals. When the first secondary selection control signal S2-5 indicates noninversion, the second inversion switching circuit 38b makes the pair of the secondary selected differential clock signals pass the pair of the secondary switched differential clock signals as it is.

[4-3-2. Eight-stage Delay Locked Loops (DLLs) 40a and 40b]

As shown in FIG. 6, the first eight-stage delay locked loop (DLL) 40a comprises a primary delay buffer train 58a, first through fourth primary selectors 61a, 62a, 63a, and 64a, a primary selector and phase comparator (SEL+PD) 66a, and a primary charge pump and low pass filter (CP+LPF) 68a. Likewise, as shown in FIG. 7, the second eight-stage delay locked loop (DLL) 40b comprises a secondary delay buffer train 58b, first through fourth secondary selectors 61b, 62b, 63b, and 64b, a secondary selector and phase comparator (SEL+PD) 66b, and a secondary charge pump and low pass filter (CP+LPF) 68b.

The primary delay buffer train 58a comprises an eight-stage primary differential delay buffer or first through eighth primary differential delay buffers c1, c2, c3, c4, c5, c6, c7, and c8 which are chained with each other in a ring-shaped fashion. As shown in FIG. 6, the eighth primary differential delay buffer c8 has an upper output terminal connected to a lower input terminal of the first primary differential delay buffer c1 while the eighth primary differential delay buffer c8 has a lower output terminal connected to an upper input terminal of the first primary differential delay buffer c1.

Likewise, the secondary delay buffer train 58b comprises an eight-stage secondary differential delay buffer or first through eighth secondary differential delay buffers d1, d2, d3, d4, d5, d6, d7, and d8 which are chained with each other in a ring-shaped fashion. As shown in FIG. 7, the eighth secondary differential delay buffer d8 has an upper output terminal connected to a lower input terminal of the first secondary differential delay buffer d1 while the eighth secondary differential delay buffer d8 has a lower output terminal connected to an upper input terminal of the first secondary differential delay buffer d1.

The first primary selector 61a is disposed between the first primary differential delay buffer c1 and the second primary differential delay buffer c2. The second primary selector 62a is disposed between the third primary differential delay buffer c3 and the fourth primary differential delay buffer c4. The third primary selector 63a is disposed between the fifth primary differential delay buffer c5 and the sixth primary differential delay buffer c6. The fourth primary selector 64a is disposed between the seventh primary differential delay buffer c7 and the eighth primary differential delay buffer c8. Similarly, the first secondary selector 61b is disposed between the first secondary differential delay buffer d1 and the second secondary differential delay buffer d2. The second secondary selector 62b is disposed between the third secondary differential delay buffer d3 and the fourth secondary differential delay buffer d4. The third secondary selector 63b is disposed between the fifth secondary differential delay buffer d5 and the sixth secondary differential delay buffer d6. The fourth secondary selector 64b is disposed between the seventh secondary differential delay buffer d7 and the eighth secondary differential delay buffer d8.

Responsive to the first primary selection control signal S1-1, the first primary selector 61a inputs the pair of the primary switched differential clock signals from the first inversion switching circuit 38a to the second primary differential delay buffer c2 and intercepts clock propagation from the first primary differential delay buffer c1 to the second primary differential delay buffer c2. As a result, a primary delay line having the second primary differential delay buffer c2 as a first-stage delay buffer and the first primary differential delay buffer c1 as a final-stage delay buffer is electrically constructed.

The primary selector and phase comparator 66a phase compares an input signal of the primary delay line with an output signal of the primary delay line. As shown in FIG. 6, the primary selector and phase comparator 66a is supplied with the first through the fourth primary selection control signals S1-1 to S1-4. In synchronism with operation of the first primary selector 61a, the primary selector and phase comparator 66a phase compares, on the basis of the first primary selection control signal S1-1, an input clock signal supplied to an upper input terminal of the first-stage delay buffer c2 with an output clock signal produced by an upper output terminal of the final-stage delay buffer c1 to detect a phase difference therebetween.

Similarly, responsive to the second through the fourth primary selection control signals S1-2, S1-3, and S1-4, the second through the fourth primary selectors 62a, 63a, and 64a input clock signals and intercept clock propagation. Only one of the first through the fourth primary selectors 61a to 64a is activated. When the second primary selector 62a is activated, the primary delay line having the fourth primary differential delay buffer c4 as the first-stage delay buffer and the third primary differential delay buffer c3 as the final-stage delay buffer is electrically constructed. When the third primary selector 63a is activated, the primary delay line having the sixth primary differential delay buffer c6 as the first-stage delay buffer and the fifth primary differential delay buffer c5 as the final-stage delay buffer is electrically constructed. When the fourth primary selector 64a is activated, the primary delay line having the eighth primary differential delay buffer c8 as the first-stage delay buffer and the seventh primary differential delay buffer c7 as the final-stage delay buffer is electrically constructed. The primary selector and phase comparator 66a phase compares an input signal of the primary delay line with an output signal of the primary delay line to detect the first phase difference therebetween.

Likewise, responsive to the first secondary selection control signal S2-1, the first secondary selector 61b inputs the pair of the secondary switched differential clock signals from the second inversion switching circuit 38b to the second secondary differential delay buffer d2 and intercepts clock propagation from the first secondary differential delay buffer d1 to the second secondary differential delay buffer d2.

As a result, a secondary delay line having the second secondary differential delay buffer d2 as a first-stage delay buffer and the first secondary differential delay buffer d1 as a final-stage delay buffer is electrically constructed.

The secondary selector and phase comparator 66b phase compares an input signal of the secondary delay line with an output signal of the secondary delay line. As shown in FIG. 7, the secondary selector and phase comparator 66b is supplied with the first through the fourth secondary selection control signals S2-1 to S2-4. In synchronism with operation of the first secondary selector 61b, the secondary selector and phase comparator 66b phase compares, on the basis of the first secondary selection control signal S2-1, an input clock signal supplied to an upper input terminal of the first-stage delay buffer d2 with an output clock signal produced by an upper output terminal of the final-stage delay buffer d1 to detect a second phase difference therebetween.

Similarly, responsive to the second through the fourth secondary selection control signals S2-2, S2-3, and S2-4, the second through the fourth secondary selectors 62b, 63b, and 64b input clock signals and intercept clock propagation. Only one of the first through the fourth secondary selectors 61b to 64b is activated. When the second secondary selector 62b is activated, the secondary delay line having the fourth secondary differential delay buffer d4 as the first-stage delay buffer and the third secondary differential delay buffer d3 as the final-stage delay buffer is electrically constructed. When the third secondary selector 63b is activated, the secondary delay line having the sixth secondary differential delay buffer d6 as the first-stage delay buffer and the fifth secondary differential delay buffer d5 as the final-stage delay buffer is electrically constructed. When the fourth secondary selector 64b is activated, the secondary delay line having the eighth secondary differential delay buffer d8 as the first-stage delay buffer and the seventh secondary differential delay buffer d7 as the final-stage delay buffer is electrically constructed. The secondary selector and phase comparator 66b phase compares an input signal of the secondary delay line with an output signal of the secondary delay line to detect the second phase difference therebetween.

The primary charge pump and low pass filter 68a generates a third control voltage V3 on the basis of the first phase difference detected by the primary selector and phase comparator 66a to supply the third control voltage V3 to the first through the eighth primary differential delay buffers c1 to c8. Therefore, the primary charge pump and low pass filter 68a feedback controls the primary delay buffer train 58a so that the primary delay line has a total delay equal to half period of 1600 ps of the clock signal. As a result, each of the first through the eighth primary differential delay buffers c1 to c8 has a propagation delay which is kept equal to (1600/8)ps=200 ps and the primary sixteen multi-phase clock signals CLK1 to CLK16 have the first phase interval which is kept equal to (1600/8)ps=200 ps.

Likewise, the secondary charge pump and low pass filter 68b generates a fourth control voltage V4 on the basis of the second phase difference detected by the secondary selector and phase comparator 66b to supply the fourth control voltage V4 to the first through the eighth secondary differential delay buffers d1 to d8. Therefore, the secondary charge pump and low pass filter 68b feedback controls the secondary delay buffer train 58b so that the secondary delay line has a total delay equal to half period of 1600 ps of the clock signal. As a result, each of the first through the eighth secondary differential delay buffers d1 to d8 has a propagation delay which is kept equal to (1600/8)ps=200 ps and the secondary sixteen multi-phase clock signals CLK1D to CLK16D have the second phase interval which is kept equal to (1600/8)ps=200 ps.

[5. Selector Control]

Referring now to Tables 3, 4, and 5, the description will proceed to control in the selector control circuit 30.

[5-1. Selector Control Rules]

The selector control circuit 30 switches the above-mentioned first through fifty-sixth synchronization states <1> to <56> in accordance with rules illustrated in Tables 3, 4, and 5.

TABLE 3

| Control signals S1-6, S2-6 | First Selection names A |
| --- | --- |
| Selects CK1-CK8 | 1 |
| Selects CK3-CK10 | 2 |
| Selects CK5-CK12 | 3 |
| Selects CK7-CK14 | 4 |
| Selects CK9-CK2 | 5 |
| Selects CK11-CK4 | 6 |
| Selects CK13-CK6 | 7 |

Table 3 is a mapping table between a selected state according to the sixth primary selection control signal S1-6 or the sixth secondary selection control signal S2-6 and a first selection name A. Each of the sixth primary selection control signal S1-6 and the sixth secondary sixth selection control signal S2-6 consists of a digital signal having 3 bits in length and indicates of selection of the seven pairs of differential clock signals CK1–CK8, CK3–CK10, CK5–CK12, CK7–CK14, CK9–CK2, CK11–CK4, and CK13–CK6. As shown in Table 3, selected states are attached with names of 1–7 as the first selection names A.

TABLE 4

| Control signals | | | | | Second Selection names B |
| --- | --- | --- | --- | --- | --- |
| S1-1 S2-1 | S1-2 S2-2 | S1-3 S2-3 | S1-4 S2-4 | S1-5 S2-5 | |
| ON | OFF | OFF | OFF | Noninversion | 1 |
| OFF | ON | OFF | OFF | Noninversion | 2 |
| OFF | OFF | ON | OFF | Noninversion | 3 |
| OFF | OFF | OFF | ON | Noninversion | 4 |
| ON | OFF | OFF | OFF | Inversion | 5 |
| OFF | ON | OFF | OFF | Inversion | 6 |
| OFF | OFF | ON | OFF | Inversion | 7 |
| OFF | OFF | OFF | ON | Inversion | 8 |

Table 4 is a mapping table between a selected state according to the first through the fifth primary selection control signals S1-1 to S1-5 or the first through the fifth secondary selection control signals S2-1 to S2-5 and a second selection name B. Each of the first through the fifth primary selection control signals S1-1 to S1-5 and the first through the fifth secondary selection control signals s2-1 to S2-5 consists of a digital signal having one bit in length. The first through the fourth primary selection control signals S1-1 to S1-4 indicate ON/OFF of the first through the fourth primary selectors 61a to 64a, respectively, while the first through fourth secondary selection control signals S2-1 to S2-4 indicate ON/OFF of the first through the fourth secondary selectors 61b to 64b, respectively. The fifth primary selection control signal S1-5 indicates inversion/noninversion of the first inversion switching circuit 38a while the fifth secondary selection control signal S2-5 indicates inversion/noninversion of the second inversion switching circuit 38b. As shown in Table 4, selected states are attached with names of 1–8 as the second selection names B.

TABLE 5

| FIRST SELECTION NAMES | SECOND SELECTION NAMES | COMPOSITE SELECTION NAMES |
|---|---|---|
| 1 | 1 | 1 |
| 2 | 2 | 2 |
| 3 | 3 | 3 |
| 4 | 4 | 4 |
| 5 | 5 | 5 |
| 6 | 6 | 6 |
| 7 | 7 | 7 |
| 1 | 8 | 8 |
| 2 | 1 | 9 |
| 3 | 2 | 10 |
| 4 | 3 | 11 |
| 5 | 4 | 12 |
| 6 | 5 | 13 |
| 7 | 6 | 14 |
| 1 | 7 | 15 |
| 2 | 8 | 16 |
| 3 | 1 | 17 |
| 4 | 2 | 18 |
| 5 | 3 | 19 |
| 6 | 4 | 20 |
| 7 | 5 | 21 |
| 1 | 6 | 22 |
| 2 | 7 | 23 |
| 3 | 8 | 24 |
| 4 | 1 | 25 |
| 5 | 2 | 26 |
| 6 | 3 | 27 |
| 7 | 4 | 28 |
| 1 | 5 | 29 |
| 2 | 6 | 30 |
| 3 | 7 | 31 |
| 4 | 8 | 32 |
| 5 | 1 | 33 |
| 6 | 2 | 34 |
| 7 | 3 | 35 |
| 1 | 4 | 36 |
| 2 | 5 | 37 |
| 3 | 6 | 38 |
| 4 | 7 | 39 |
| 5 | 8 | 40 |
| 6 | 1 | 41 |
| 7 | 2 | 42 |
| 1 | 3 | 43 |
| 2 | 4 | 44 |
| 3 | 5 | 45 |
| 4 | 6 | 46 |
| 5 | 7 | 47 |
| 6 | 8 | 48 |
| 7 | 1 | 49 |
| 1 | 2 | 50 |
| 2 | 3 | 51 |
| 3 | 4 | 52 |
| 4 | 5 | 53 |
| 5 | 6 | 54 |
| 6 | 7 | 55 |
| 7 | 8 | 56 |

Table 5 is a matching table between a combination of the first selection name A and the second selection name B and a composite selection name. As shown in Table 5, respective combinations of the first selection names A and the second selection names B are attached with composite selection names of 1–56. The composite selection names of 1–56 are attached so as to correspond to the above-mentioned first through fifty-sixth synchronization states <1> to <56>. That is, when the composite selection is represented by n, an n-th synchronization state <n> is established, where n represents a positive integer between 1 and 56, both inclusive in this sentence.

When the composite selection in the circuitry of the side A controlled by the first through the sixth primary selection control signals S1-1 to S1-6 is represented by 1, the composite selection in the circuitry of the side B controlled by the first through the sixth secondary selection control signals S2-1 to S2-6 is represented by 56. When the composite selection in the circuitry of the side A controlled by the first through the sixth primary selection control signals S1-1 to S1-6 is represented by n, the composite selection in the circuitry of the side B controlled by the first through the sixth secondary selection control signals S2-1 to S2-6 is represented by (n−1), where n represents a positive integer between 2 and 56, both inclusive in this sentence.

[5-2. Examples of Selector Control]

Referring now to Tables 2–5 and FIGS. 4, 6, and 7, control by the selector control circuit 30 will be confirmed. It will be assumed that each of the first through the fourth primary selectors 61a to 64a in FIG. 6 and the first through the fourth secondary selectors 61b to 64b has a negligible delay.

It will be assumed that the composite selection name is 1. In this event, the first selection name A is 1 and the second selection name B is 1. Referring to Table 3, when the first selection name A is 1, the first selector 36a (the second selector 36b) is controlled by the sixth primary selection control signal S1-6 (the sixth secondary selection control signal S2-6) so as to select the pair of the differential clock signals CK1–CK8.

Referring to Table 4, when the second selection name B is 1, the first inversion switching circuit 38a (the second inversion switching circuit 38b) is controlled by the fifth primary selection control signal S1-5 (the fifth secondary selection control signal S2-5) so as to pass the pair of the differential clock signals CK1–CK8 in a noninversion fashion. Accordingly, the pair of the differential clock signals CK1–CK8 pass through the first inversion switching circuit 38a (the second inversion switching circuit 38b) without inverting at it is. Responsive to the first primary selection control signal S1-1 (the first secondary selection control signal S2-1), the first primary selector 61a (the first secondary selector 61b) is turned ON to be activated. Responsive to the second through the fourth primary selection control signals S1-2 to S1-4 (the second through the fourth secondary selection control signals S2-2 to S24), the second through the fourth primary selectors 62a to 64a (the second through the fourth secondary selectors 62b to 64b) are turned OFF. Under the circumstances, the second through the fourth primary selectors 62a to 64a (the second through the fourth secondary selectors 62b to 64b) do not carry out input of the clock signals and interception of clock propagation.

The first primary selector 61a (the first secondary selector 61b) is activated to supply the pair of the differential clock signals CK1–CK8 to the second primary differential delay buffer c2 (the second secondary differential delay buffer d2). In this event, the clock signal CK1 is supplied to a lower input terminal of the second primary differential delay buffer c2 (the second secondary differential delay buffer d2) while the clock signal CK8 is supplied to an upper input terminal of the second primary differential delay buffer c2 (the second secondary differential delay buffer d2). Accordingly, the clock signal CK1 and the clock signal CLK1 (CLK1D) are phase-locked with each other while the clock signal CK8 and the clock signal CLK9 (CLK9D) are phase-locked with each other. That is, the pair of the differential clock signals CK1–CK8 are phase-locked with the pair of the differential clock signals CKL1–CKL9 (CLK1D–CLK9D). Accordingly, it is understood, in reference with Table 2 and FIG. 4, that the first synchronization state <1> is established when the composite selection is represented by 1.

The primary selector and phase comparator 66a (the secondary selector and phase comparator 66b) detects the first phase difference between the clock signal CK8 and the clock signal CLK9 (the second phase difference between the clock signal CK8 and the clock signal CLK9D). The primary charge pump and low pass filter 68a (the secondary charge pump and low pass filter 68b) generates the third control voltage V3 (the fourth control voltage V4) on the basis of the first phase difference (the second phase difference) to supply the third control voltage V3 (the fourth control voltage V4) to the first through the eighth primary differential delay buffers c1 to c8 (the first through the eighth secondary differential delay buffers d1 to d8). Therefore, the first delay line having the second primary differential delay buffer c2 as the first-stage delay buffer and the first primary differential delay buffer c1 as the final-stage delay buffer (the second delay line having the second secondary differential delay buffer d2 as the first-stage delay buffer and the first secondary differential delay buffer d1 as the final-stage delay buffer) is feedback controlled so that the first through the eighth primary differential delay buffers c1 to c8 (the first through the eighth secondary differential delay buffers d1 to d8) are kept to have the equal propagation delay.

It will be assumed that the composite selection name is 2. In this event, the first selection name A is 2 and the second selection name B is 2. Referring to Table 3, when the first selection name A is 1 the first selector 36a (the second selector 36b) is controlled by the sixth primary selection control signal S1-6 (the sixth secondary selection control signal S2-6) so as to select the pair of the differential clock signals CK3–CK10.

Referring to Table 4, when the second selection name B is 2, the first inversion switching circuit 38a (the second inversion switching circuit 38b) is controlled by the fifth primary selection control signal S1-5 (the fifth secondary selection control signal S2-5) so as to pass the pair of the differential clock signals CK3–CK10 in a noninversion fashion. Accordingly, the pair of the differential clock signals CK3–CK10 pass through the first inversion switching circuit 38a (the second inversion switching circuit 38b) without inverting at it is. Responsive to the second primary selection control signal S1-2 (the second secondary selection control signal S2-2), the second primary selector 62a (the second secondary selector 62b) is turned ON to be activated. Responsive to the first, the third, and the fourth primary selection control signals S1-1, S1-3, and S1-4 (the first, the third, and the fourth secondary selection control signals S2-1, S2-3, and S2-4), the first, the third, and the fourth primary selectors 61a, 63a, and 64a (the first, the third, and the fourth secondary selectors 61b, 63b, and 64b) are turned OFF. Under the circumstances, the first, the third, and the fourth primary selectors 61a, 62a, and 64a (the first, the third, and the fourth secondary selectors 61b, 63b, and 64b) do not carry out input of the clock signals and interception of clock propagation.

The second primary selector 62a (the second secondary selector 62b) is activated to supply the pair of the differential clock signals CK3–CK10 to the fourth primary differential delay buffer c4 (the fourth secondary differential delay buffer d4). In this event, the clock signal CK3 is supplied to a lower input terminal of the fourth primary differential delay buffer c4 (the fourth secondary differential delay buffer d4) while the clock signal CK10 is supplied to an upper input terminal of the fourth primary differential delay buffer c4 (the fourth secondary differential delay buffer d4). Accordingly, the clock signal CK3 and the clock signal CLK3 (CLK3D) are phase-locked with each other while the clock signal CK10 and the clock signal CLK11 (CLK11D) are phase-locked with each other. That is, the pair of the differential clock signals CK3–CK10 are phase-locked with the pair of the differential clock signals CKL3–CKL11 (CLK3D–CLK11D). Accordingly, it is understood, in reference with Table 2 and FIG. 4. that the first synchronization state <2> is established when the composite selection is represented by 2.

The primary selector and phase comparator 66a (the secondary selector and phase comparator 66b) detects the first phase difference between the clock signal CK10 and the clock signal CLK11 (the second phase difference between the clock signal CK10 and the clock signal CLK11D). The primary charge pump and low pass filter 68a (the secondary charge pump and low pass filter 68b) generates the third control voltage V3 (the fourth control voltage V4) on the basis of the first phase difference (the second phase difference) to supply the third control voltage V3 (the fourth control voltage V4) to the first through the eighth primary differential delay buffers c1 to c8 (the first through the eighth secondary differential delay buffers d1 to d8). Therefore, the first delay line having the fourth primary differential delay buffer c4 as the first-stage delay buffer and the third primary differential delay buffer d1 as the final-stage delay buffer (the second delay line having the fourth secondary differential delay buffer d4 as the first-stage delay buffer and the third secondary differential delay buffer d3 as the final-stage delay buffer) is feedback controlled so that the first through the eighth primary differential delay buffers c1 to c8 (the first through the eighth secondary differential delay buffers d1 to d8) are kept to have the equal propagation delay.

It will be assumed that the composite selection name is 3. In this event, the first selection name A is 3 and the second selection name B is 3. Referring to Table 3, when the first selection name A is 3, the first selector 36a (the second selector 36b) is controlled by the sixth primary selection control signal S1-6 (the sixth secondary selection control signal S2-6) so as to select the pair of the differential clock signals CK5–CK12.

Referring to Table 4, when the second selection name B is 3, the first inversion switching circuit 38a (the second inversion switching circuit 38b) is controlled by the fifth primary selection control signal S1-5 (the fifth secondary selection control signal S2-5) so as to pass the pair of the differential clock signals CK5–CK12 in a noninversion fashion. Accordingly, the pair of the differential clock signals CK5–CK12 pass through the first inversion switching circuit 38a (the second inversion switching circuit 38b) without inverting at it is. Responsive to the third primary selection control signal S1-3 (the third secondary selection control signal S2-3), the third primary selector 63a (the third secondary selector 63b) is turned ON to be activated. Responsive to the first, the second, and the fourth primary selection control signals S1-1, S1-2, and S1-4 (the first, the second, and the fourth secondary selection control signals S2-1, S2-2, and S2-4), the first, the second, and the fourth primary selectors 61a, 62a, and 64a (the first, the second, and the fourth secondary selectors 61b, 62b, and 64b) are turned OFF. Under the circumstances, the first, the second, and the fourth primary selectors 61a, 62a, and 64a (the first, the second, and the fourth secondary selectors 61b, 62b, and 64b) do not carry out input of the clock signals and interception of clock propagation.

The third primary selector 63a (the third secondary selector 63b) is activated to supply the pair of the differential clock signals CK5–CK12 to the sixth primary differential delay buffer c6 (the sixth secondary differential delay buffer d6). In this event, the clock signal CK5 is supplied to a lower input terminal of the sixth primary differential delay buffer c6 (the sixth secondary differential delay buffer d6) while the clock signal CK12 is supplied to an upper input terminal of the sixth primary differential delay buffer c6 (the sixth secondary differential delay buffer d6). Accordingly, the clock signal CK5 and the clock signal CLK5 (CLK5D) are phase-locked with each other while the clock signal CK12 and the clock signal CLK13 (CLK13D) are phase-locked with each other. That is, the pair of the differential clock signals CK5–CK12 are phase-locked with the pair of the differential clock signals CKL5–CKL13 (CLK5D–CLK13D). Accordingly, it is understood, in reference with Table 2 and FIG. 4, that the third synchronization state <3> is established when the composite selection is represented by 3.

The primary selector and phase comparator 66a (the secondary selector and phase comparator 66b) detects the first phase difference between the clock signal CK12 and the clock signal CLK13 (the second phase difference between the clock signal CK12 and the clock signal CLK13D). The primary charge pump and low pass filter 68a (the secondary charge pump and low pass filter 68b) generates the third control voltage V3 (the fourth control voltage V4) on the basis of the first phase difference (the second phase difference) to supply the third control voltage V3 (the fourth control voltage V4) to the first through the eighth primary differential delay buffers c1 to c8 (the first through the eighth secondary differential delay buffers d1 to d8). Therefore, the first delay line having the sixth primary differential delay buffer c6 as the first-stage delay buffer and the fifth primary differential delay buffer d5 as the final-stage delay buffer (the second delay line having the sixth secondary differential delay buffer d6 as the first-stage delay buffer and the fifth secondary differential delay buffer d5 as the final-stage delay buffer) is feedback controlled so that the first through the eighth primary differential delay buffers c1 to c8 (the first through the eighth secondary differential delay buffers d1 to d8) are kept to have the equal propagation delay.

It will be assumed that the composite selection name is 4. In this event, the first selection name A is 4 and the second selection name B is 4. Referring to Table 3, when the first selection name A is 4, the first selector 36a (the second selector 36b) is controlled by the sixth primary selection control signal S1-6 (the sixth secondary selection control signal S2-6) so as to select the pair of the differential clock signals CK7–CK14.

Referring to Table 4, when the second selection name B is 4, the first inversion switching circuit 38a (the second inversion switching circuit 38b) is controlled by the fifth primary selection control signal S1-5 (the fifth secondary selection control signal S2-5) so as to pass the pair of the differential clock signals CK7–CK14 in a noninversion fashion. Accordingly, the pair of the differential clock signals CK7–CK14 pass through the first inversion switching circuit 38a (the second inversion switching circuit 38b) without inverting at it is. Responsive to the fourth primary selection control signal S1-4 (the fourth secondary selection control signal S2-4), the fourth primary selector 64a (the fourth secondary selector 64b) is turned ON to be activated. Responsive to the first through the third primary selection control signals S1-1, S1-2, and S1-3 (the first through the third secondary selection control signals S2-1, S2-2, and S2-3), the first through the third primary selectors 61a, 62a, and 63a (the first through the third secondary selectors 61b, 62b, and 63b) are turned OFF. Under the circumstances, the first through the third primary selectors 61a, 62a, and 63a (the first through the third secondary selectors 61b, 62b, and 63b) do not carry out input of the clock signals and interception of clock propagation.

The fourth primary selector 64a (the fourth secondary selector 64b) is activated to supply the pair of the differential clock signals CK7–CK14 to the eighth primary differential delay buffer c8 (the eighth secondary differential delay buffer d8). In this event, the clock signal CK7 is supplied to a lower input terminal of the eighth primary differential delay buffer c8 (the eighth secondary differential delay buffer d8) while the clock signal CK14 is supplied to an upper input terminal of the eighth primary differential delay buffer c8 (the eighth secondary differential delay buffer d8). Accordingly, the clock signal CK7 and the clock signal CLK7 (CLK7D) are phase-locked with each other while the clock signal CK14 and the clock signal CLK15 (CLK15D) are phase-locked with each other. That is, the pair of the differential clock signals CK7–CK14 are phase-locked with the pair of the differential clock signals CKL7–CKL15 (CLK7D–CLK15D). Accordingly, it is understood, in reference with Table 2 and FIG. 4, that the fourth synchronization state <4> is established when the composite selection is represented by 4.

The primary selector and phase comparator 66a (the secondary selector and phase comparator 66b) detects the first phase difference between the clock signal CK14 and the clock signal CLK15 (the second phase difference between the clock signal CK14 and the clock signal CLK15D). The primary charge pump and low pass filter 68a (the secondary charge pump and low pass filter 68b) generates the third control voltage V3 (the fourth control voltage V4) on the basis of the first phase difference (the second phase difference) to supply the third control voltage V3 (the fourth control voltage V4) to the first through the eighth primary differential delay buffers c1 to c8 (the first through the eighth secondary differential delay buffers d1 to d8). Therefore, the first delay line having the eighth primary differential delay buffer c8 as the first-stage delay buffer and the seventh primary differential delay buffer c7 as the final-stage delay buffer (the second delay line having the eighth secondary differential delay buffer d8 as the first-stage delay buffer and the seventh secondary differential delay buffer d7 as the final-stage delay buffer) is feedback controlled so that the first through the eighth primary differential delay buffers c1 to c8 (the first through the eighth secondary differential delay buffers d1 to d8) are kept to have the equal propagation delay.

It will be assumed that the composite selection name is 5. In this event, the first selection name A is 5 and the second selection name B is 5. Referring to Table 3, when the first selection name A is 5, the first selector 36a (the second selector 36b) is controlled by the sixth primary selection control signal S1-6 (the sixth secondary selection control signal S2-6) so as to select the pair of the differential clock signals CK9–CK2, Referring to Table 4, when the second selection name B is 5, the first inversion switching circuit 38a (the second inversion switching circuit 38b) is controlled by the fifth primary selection control signal S1-5 (the fifth secondary selection control signal S2-5) so as to invert the pair of the differential clock signals CK9–CK2. Accordingly, the pair of the differential clock signals CK9–CK2 are inverted by the first inversion switching circuit 38a (the second inversion switching circuit 38b) to pass as a pair of differential clock signals CK2–CK9. Responsive to the first primary selection control signal S1-1 (the first secondary selection control signal S2-1), the first primary selector 61a (the first secondary selector 61b) is turned ON to be activated. Responsive to the second through the fourth primary selection control signals S1-2, S1-3, and S1-4 (the second through the fourth secondary selection control signals S2-2, S2-3, and S2-4), the second through the fourth primary selectors 62a, 63a, and 64a (the second through the fourth secondary selectors 62b, 63b, and 64b) are turned OFF. Under the circumstances, the second through the fourth primary selectors 62a, 63a, and 64a (the second through the fourth secondary selectors 62b, 63b, and 64b) do not carry out input of the clock signals and interception of clock propagation.

The first primary selector 61a (the first secondary selector 61b) is activated to supply the pair of the differential clock signals CK2–CK9 to the second primary differential delay buffer c2 (the second secondary differential delay buffer d2). In this event, the clock signal CK2 is supplied to the lower input terminal of the second primary differential delay buffer c2 (the second secondary differential delay buffer d2) while the clock signal CK9 is supplied to the upper input terminal of the second primary differential delay buffer c2 (the second secondary differential delay buffer d2). Accordingly, the second clock signal CK2 and the clock signal CLK1 (CLK1D) are phase-locked with each other while the clock signal CK9 and the clock signal CLK9 (CLK9D) are phase-locked with each other. That is, the pair of the differential clock signals CK9–CK2 are phase-locked with the pair of the differential clock signals CKL9–CKL1 (CLK9D–CLK1D). Accordingly, it is understood, in reference with Table 2 and FIG. 4, that the fifth synchronization state <5> is established when the composite selection is represented by 5.

The primary selector and phase comparator 66a (the secondary selector and phase comparator 66b) detects the first phase difference between the clock signal CK9 and the clock signal CLK9 (the second phase difference between the clock signal CK9 and the clock signal CLK9D). The primary charge pump and low pass filter 68a (the secondary charge pump and low pass filter 68b) generates the third control voltage V3 (the fourth control voltage V4) on the basis of the first phase difference (the second phase difference) to supply the third control voltage V3 (the fourth control voltage V4) to the first through the eighth primary differential delay buffers c1 to c8 (the first through the eighth secondary differential delay buffers d1 to d8). Therefore, the first delay line having the second primary differential delay buffer c2 as the first-stage delay buffer and the first primary differential delay buffer c1 as the final-stage delay buffer (the second delay line having the second secondary differential delay buffer d2 as the first-stage delay buffer and the first secondary differential delay buffer d1 as the final-stage delay buffer) is feedback controlled so that the first through the eighth primary differential delay buffers c1 to c8 (the first through the eighth secondary differential delay buffers d1 to d8) are kept to have the equal propagation delay.

It will be assumed that the composite selection name is 6. In this event, the first selection name A is 6 and the second selection name B is 6. Referring to Table 3, when the first selection name A is 6, the first selector 36a (the second selector 36b) is controlled by the sixth primary selection control signal S1-6 (the sixth secondary selection control signal S2-6) so as to select the pair of the differential clock signals CK11–CK4.

Referring to Table 4, when the second selection name B is 6, the first inversion switching circuit 38a (the second inversion switching circuit 38b) is controlled by the fifth primary selection control signal S1-5 (the fifth secondary selection control signal S2-5) so as to invert the pair of the differential clock signals CK11–CK4. Accordingly, the pair of the differential clock signals CK11–CK4 are inverted by the first inversion switching circuit 38a (the second inversion switching circuit 38b) to pass as a pair of differential clock signals CK4–CK11. Responsive to the second primary selection control signal S1-2 (the second secondary selection control signal S2-2), the second primary selector 62a (the second secondary selector 62b) is turned ON to be activated. Responsive to the first, the third, and the fourth primary selection control signals S1-1, S1-3, and S1-4 (the first, the third, and the fourth secondary selection control signals S2-1, S2-3, and S2-4), the first, the third, and the fourth primary selectors 61a, 63a, and 64a (the first, the third, and the fourth secondary selectors 61b, 63b, and 64b) are turned OFF. Under the circumstances, the first, the third, and the fourth primary selectors 61a, 63a, and 64a (the first, the third, and the fourth secondary selectors 61b, 63b, and 64b) do not carry out input of the clock signals and interception of clock propagation.

The second primary selector 62a (the second secondary selector 62b) is activated to supply the pair of the differential clock signals CK4–CK11 to the fourth primary differential delay buffer c4 (the fourth secondary differential delay buffer d4). In this event, the clock signal CK4 is supplied to the lower input terminal of the fourth primary differential delay buffer c4 (the fourth secondary differential delay buffer d4) while the clock signal CK11 is supplied to the upper input terminal of the fourth primary differential delay buffer c4 (the fourth secondary differential delay buffer d4). Accordingly, the clock signal CK4 and the clock signal CLK3 (CLK3D) are phase-locked with each other while the clock signal CK11 and the clock signal CLK11 (CLK11D) are phase-locked with each other. That is, the pair of the differential clock signals CK11–CK4 are phase-locked with the pair of the differential clock signals CKL11–CKL3 (CLK11D–CLK3D). Accordingly, it is understood, in reference with Table 2 and FIG. 4, that the sixth synchronization state <6> is established when the composite selection is represented by 6.

The primary selector and phase comparator 66a (the secondary selector and phase comparator 66b) detects the first phase difference between the clock signal CK11 and the clock signal CLK11 (the second phase difference between the clock signal CK11 and the clock signal CLK11D). The primary charge pump and low pass filter 68a (the secondary charge pump and low pass filter 68b) generates the third control voltage V3 (the fourth control voltage V4) on the basis of the first phase difference (the second phase difference) to supply the third control voltage V3 (the fourth control voltage V4) to the first through the eighth primary differential delay buffers c1 to c8 (the first through the eighth secondary differential delay buffers d1 to d8). Therefore, the first delay line having the fourth primary differential delay buffer c4 as the first-stage delay buffer and the third primary differential delay buffer c3 as the final-stage delay buffer (the second delay line having the fourth secondary differential delay buffer d4 as the first-stage delay buffer and the third secondary differential delay buffer d3 as the final-stage delay buffer) is feedback controlled so that the first through the eighth primary differential delay buffers c1 to c8 (the first through the eighth secondary differential delay buffers d1 to d8) are kept to have the equal propagation delay.

In the similar manner as described above, it is possible to confirm that the seventh though the tenth and the fifty-sixth synchronization states <7> to <10> and <56> are established by the composite selections represented by 7 to 10 and 56 in reference to Tables 2 through 5 and FIGS. 4, 6, and 7.

Although no illustration is made in FIG. 4, it may be possible to confirm that the eleventh through the fifty-fifth synchronization states <11> to <55> are established by the composite selections represented by 11 to 55 in reference to Tables 2 through 5 and FIGS. 6 and 7.

In Table 2, the clock signals to be phase-locked by the primary selector and phase comparator 66*a* (the secondary selector and phase comparator 66*b*) are depicted at underlines. It is understood by confirming connections in the circuitry in FIG. 6 (FIG. 7) that the clock signals CLK9, CLK11, CLK13, and CLK15 (CLK9D, CLK11D, CLK13D, and CLK15D) are fixed as clock signals to be phase-locked.

[6. Oversampling and Phase Comparison]

Referring now to FIGS. 8A through 8D, 9, and 10 and Table 6, the description will proceed to oversampling and phase comparison according to the second embodiment of this invention.

[6-1. Oversampling]

FIGS. 8A through 8D are time charts collectively showing waveforms indicating position relationship of an input data i and leading clock edges. The input data i is a serial data having a data rate of 2.5 Gbps. Accordingly, the input data i has a length per one bit that is equal to 400 ps. Each of the primary sixteen multi-phase clock signals CLK1 to CLK16 and the secondary sixteen multi-phase clock signals CLK1D to CLK16D have a clock frequency of 312.5 MHz. Accordingly, each of the primary sixteen multi-phase clock signals CLK1 to CLK16 and the secondary sixteen multi-phase clock signals CLK1D to CLK16D have a phase interval of 200 ps. Therefore, as shown in FIGS. 8A and 8B, two leading clock edges are overlapped with one bit of the input data i.

It will be assumed that the primary sixteen multi-phase clock signals CLK1 to CLK16 are positioned for the input data i as shown in FIG. 8A. Under the circumstances, the secondary sixteen multi-phase clock signals CLK1D to CLK16D are positioned for the input data i as shown in FIG. 8B. This is because the secondary sixteen multi-phase clock signals CLK1D to CLK16D are put for the primary sixteen multi-phase clock signals CLK1 to CLK16 forward by one resolution of 57 ps. FIG. 8C shows an image where FIGS. 8A and 8B are overlapped with each other.

FIG. 8C shows 32 leading edges of thirty-two clock signals. As shown in FIG. 8C, a phase interval of a j-th clock signal CLKj and a j-th clock signal CLKjD is very narrow and is equal to 57 ps where j represents a positive integer between 1 to 16, both inclusive.

In this embodiment, in order to implement the oversampling clock recovery method according to the first embodiment of this invention, all of thirty-two phase clock signals CLK1 to CLK16 and CLK1D to CLK16D are not used. That is, eight clock signals CLK1D, CLK3D, CLK5D, CLK7D, CLK9D, CLK11D, CLK13, and CLK15D in the secondary sixteen multi-phase clock signals CLK1D to CLK16D are not used but remaining eight clock signals CLK2D, CLK4D, CLK6D, CLK8D, CLK10D, CLK12D, CLK14D, and CLK16D in the secondary sixteen multi-phase clock signals CLK1D to CLK16D and the primary sixteen multi-phase clock signals CLK1 to CLK16 are used as shown in FIG. 8D. Accordingly, 8+16=24 phase clock signals are used. That is, the over-sampling clock data recovery circuit (CDR) 20 according to the second embodiment uses multi-phase clock signals which consists of three-phase clock signals for one bit of the input data i and which has roughness and fineness in arrangement. A period of the roughness and fineness is equal to a one bit length of the input data i.

The clock signal CLK1 correspond to the clock signal CLKa in the first embodiment in conjunction with FIGS. 2A through 2F, the clock signal CLK2D corresponds to the clock signal CLKb in the first embodiment, the clock signal CLK2 corresponds to the clock signal CLKc in the first embodiment, and the clock signal CLK3 corresponds to the clock signal CLKd in the first embodiment.

In a similar manner where successive four-phase clock signals CLK1–CLK2D·CLK2–CLK3 correspond to the clock signals CLKa–CLKb·CLKc–CLKd in the first embodiment in conjunction with FIGS. 2A through 2F, respective successive four-phase clock signals CLK3–CLK4D·CLK4–CLK5, CLK5–CLK6D·CLK6–CLK7, CLK7–CLK8D·CLK8–CLK9, CLK9–CLK10D·CLK10–CLK11, CLK11–CLK12D·CLK12–CLK13, CLK13–CLK14D·CLK14–CLK15, and CLK15–CLK16D·CLK16–CLK1 correspond to the clock signals CLKa–CLKb·CLKc–CLKd in the first embodiment in conjunction with FIGS. 2A through 2F. With this mode, the over-sampling clock recovery method according to the first embodiment of this invention is implemented.

Figure 9:
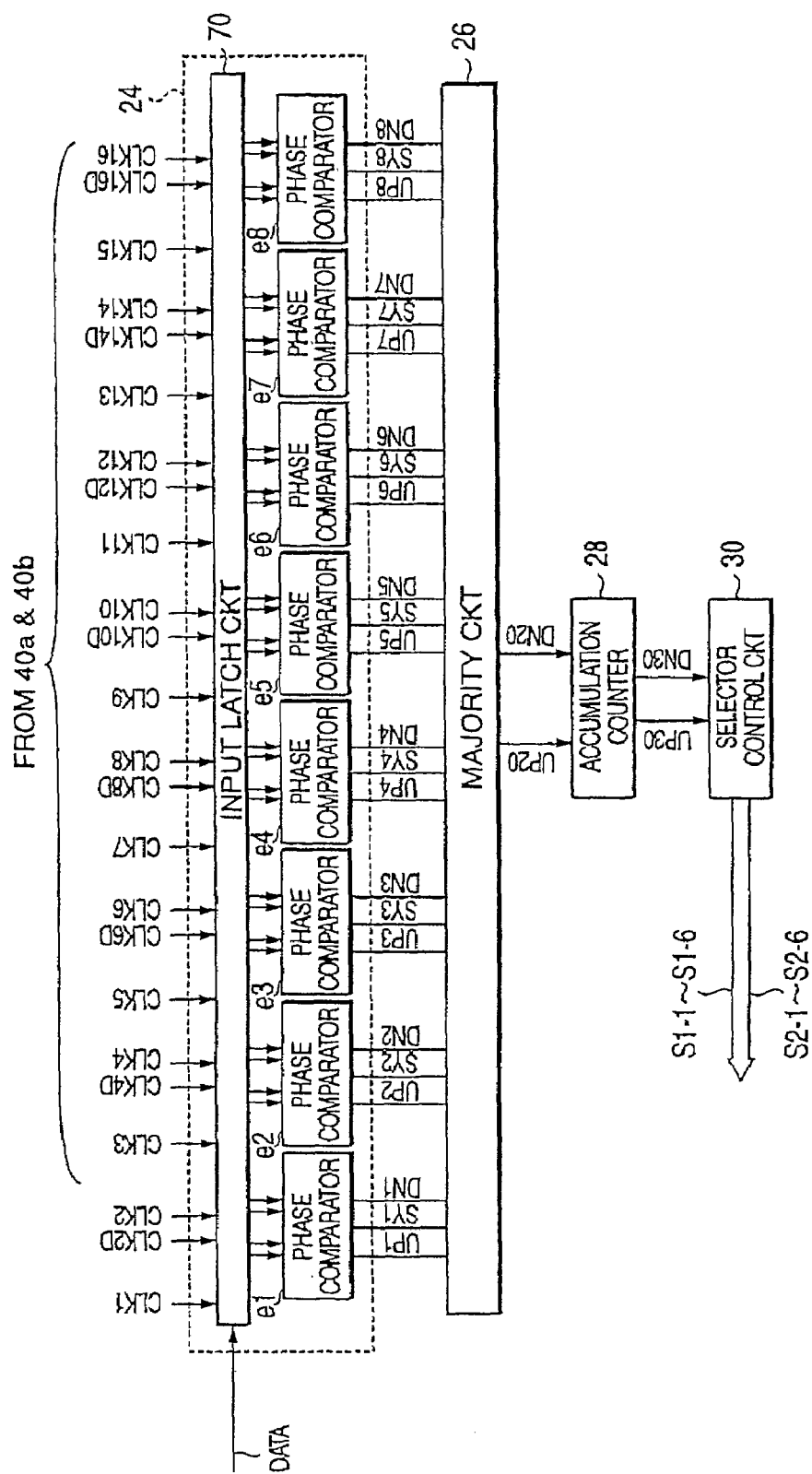
FIG. 9 is a schematic block diagram of a phase comparison circuit for use in the oversampling clock recovery circuit illustrated in FIG. 3.
Figure 10:
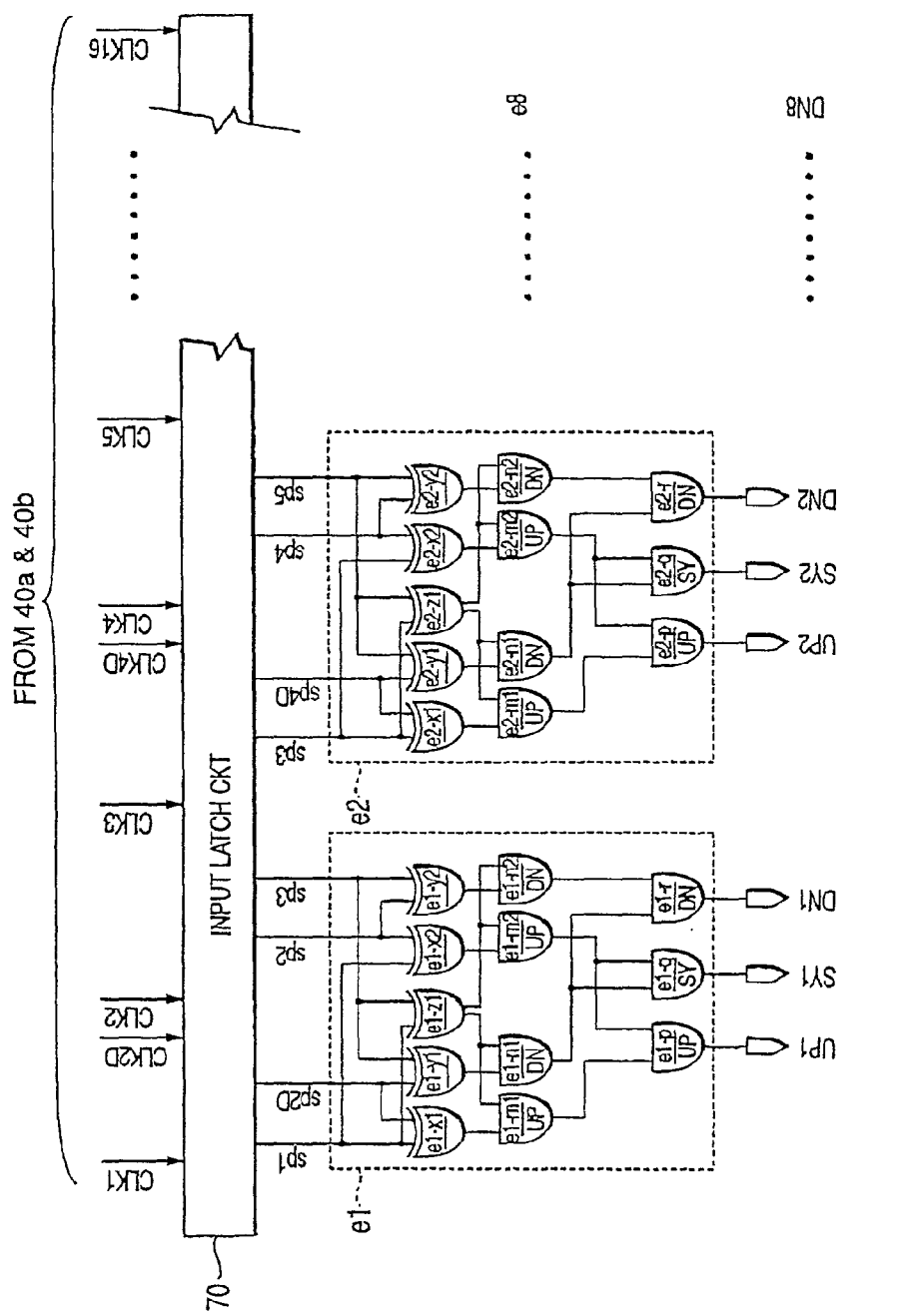
FIG. 10 is a circuit diagram of a phase comparator for use in the phase comparison circuit illustrated in FIG. 9.

Referring now to FIGS. 9 and 10, the phase comparison portion 24 will be described. FIG. 9 is a block diagram showing an internal structure of the phase comparison portion 24. FIG. 10 is a circuit diagram showing a circuit within a phase comparator.

As shown in FIG. 9, the phase comparison portion 24 comprises an input latch circuit 70 and first through eighth phase comparators e1 to e8. The input latch circuit 70 is supplied with the twenty-four phase clock signals. The input latch circuit 70 samples the input data i using the twenty-four phase clock signals to supply sampled data four by four to the first through the eighth phase comparators e1 to e8 which are disposed in parallel.

Referring to FIG. 10, the first phase comparator e1 is supplied with a sampled data sp1 sampled by the clock signal CLK1, a sampled data sp2D sampled by the clock signal CLK2D, a sampled data sp2 sampled by the clock signal CLK2, and a sampled data sp3 sampled by the clock signal CLK3.

In the manner which is described above, the first phase comparator e1 is supplied with four sampled data sp1–sp2D·sp2–sp3 sampled by the successive four-phase clock signals CLK1–CLK2D·CLK2–CLK3.

Likewise, the second phase comparator e2 is supplied with four sampled data sp3–sp4D·sp4–sp5 sampled by the successive four-phase clock signals CLK3–CLK4D·CLK4–CLK5. The third phase comparator e3 is supplied with four sampled data sp5–sp6D·sp6–sp7 sampled by the successive four-phase clock signals CLK5–CLK6D·CLK6–CLK7. The fourth phase comparator e4 is supplied with four sampled data sp7–sp8D·sp8–sp9 sampled by the successive four-phase clock signals CLK7–CLK8D·CLK8–CLK9. The fifth phase comparator e5 is supplied with four sampled data sp9–sp10D·sp10–sp11 sampled by the successive four-phase clock signals CLK9–CLK10D·CLK10–CLK11. The sixth phase comparator e6 is supplied with four sampled data sp11–sp12D·sp12–sp13 sampled by the successive four-phase clock signals CLK11–CLK12D·CLK12–CLK13. The seventh phase comparator e7 is supplied with foursampled data sp13–sp14D·sp14–sp15 sampled by the successive four-phase clock signals CLK13–CLK14D·CLK14–CLK15. The eighth phase comparator e8 is supplied with four sampled data sp15–sp16D·sp16–sp1 sampled by the successive four-phase clock signals CLK15–CLK16D·CLK16–CLK1.

[6-2. Logic of Phase Comparison]

Supplied with the four sampled data sp1–sp2D·sp2–sp3, the first phase comparator e1 produces one of the first UP signal UP1, the first synchronization signal SY1, and the first DOWN signal DN1. Similarly, the second phase comparator e2 is supplied with the four sampled data sp3–sp4D·sp4–sp5 to produce one of the second UP signal UP2, the second synchronization signal SY2, and the second DOWN signal DN2. The third phase comparator e3 is supplied with the four sampled data sp5–sp6D·sp6–sp7 to produce one of the third UP signal UP3, the third synchronization signal SY3, and the third DOWN signal DN3. The fourth phase comparator e4 is supplied with the four sampled data sp7–sp8D·sp8–sp9 to produce one of the fourth UP signal UP4, the fourth synchronization signal SY4, and the fourth DOWN signal DN4. The fifth phase comparator e5 is supplied with the four sampled data sp9–sp10D·sp10–sp11 to produce one of the fifth UP signal UP5, the fifth synchronization signal SY5, and the fifth DOWN signal DN5. The sixth phase comparator e6 is supplied with the four sampled data sp11–sp12D·sp12–sp13 to produce one of the sixth UP signal UP6, the sixth synchronization signal SY6, and the sixth DOWN signal DN6. The seventh phase comparator e7 is supplied with the four sampled data sp13–sp14D·sp14–sp15 to produce one of the seventh UP signal UP7, the seventh synchronization signal SY7, and the seventh DOWN signal DN7. The eighth phase comparator e8 is supplied with the four sampled data sp15–sp16D·sp16–sp1 to produce one of the eighth UP signal UP8, the eighth synchronization signal SY8, and the eighth DOWN signal DN8.

Inasmuch as the first through the eighth phase comparators e1 to e8 are similar in structure and operation, the first phase comparator e1 will be described in behalf of the first through the eighth comparators e1 to e8.

As shown in FIG. 10, the first phase comparator e1 comprises five exclusive OR gates e1-x1, e1-y1, e1-x1, e1-x2, and e1-y2, four AND gates e1-m1, e1-n1, e1-m2, and e1-n2 supplied with outputs from those five exclusive OR gates, and three AND gates e1-p, e1-q, and e1-r supplied with outputs from those four AND gates. These connections are disclosed in FIG. 10. At a final-stage in the first phase comparator e1, the AND gate e1-p produces the first UP signal UP1, the AND gate e1-q produces the first synchronization signal SY1, and the AND gate e1-r produces the first DOWN signal DN1.

In order to implement the over-sampling clock recovery method according to the first embodiment of this invention, the first phase comparator e1 may carries out arithmetic operation according to a truth table shown in Table 6 as follows.

TABLE 6

| | INPUT | | | | OUTPUT | | |
|---|---|---|---|---|---|---|---|
| | sp1 | sp2D | sp2 | sp3 | UP1 | SY1 | DN1 |
| a1 | 0 | 1 | 1 | 1 | 1 | 0 | 0 |
| a2 | 0 | 0 | 1 | 1 | 0 | 1 | 0 |
| a3 | 0 | 0 | 0 | 1 | 0 | 0 | 1 |

TABLE 6-continued

| | INPUT | | | | OUTPUT | | |
|---|---|---|---|---|---|---|---|
| | sp1 | sp2D | sp2 | sp3 | UP1 | SY1 | DN1 |
| a4 | 1 | 1 | 1 | 1 | 0 | 0 | 0 |
| a5 | 1 | 0 | 1 | 1 | 0 | 0 | 0 |
| a6 | 1 | 1 | 0 | 1 | 0 | 0 | 0 |
| a7 | 1 | 0 | 0 | 1 | 0 | 0 | 0 |
| a8 | 1 | 0 | 1 | 0 | 0 | 0 | 0 |
| b1 | 1 | 0 | 0 | 0 | 1 | 0 | 0 |
| b2 | 1 | 1 | 0 | 0 | 0 | 1 | 0 |
| b3 | 1 | 1 | 1 | 0 | 0 | 0 | 1 |
| b4 | 0 | 0 | 0 | 0 | 0 | 0 | 0 |
| b5 | 0 | 1 | 0 | 0 | 0 | 0 | 0 |
| b6 | 0 | 0 | 1 | 0 | 0 | 0 | 0 |
| b7 | 0 | 1 | 1 | 0 | 0 | 0 | 0 |
| b8 | 0 | 1 | 0 | 1 | 0 | 0 | 0 |

Boolean expressions correspond to the truth table shown in Table 6 are represented by Expression 1 as follows.

$$UP1 = \overline{sp1} \cdot sp2D \cdot sp2 \cdot sp3 + sp1 \cdot \overline{sp2D} \cdot \overline{sp2} \cdot \overline{sp3}$$

$$SY1 = \overline{sp1} \cdot sp2D \cdot sp2 \cdot sp3 + sp1 \cdot \overline{sp2D} \cdot \overline{sp2} \cdot \overline{sp3}$$

$$DN1 = \overline{sp1} \cdot \overline{sp2D} \cdot \overline{sp2} \cdot sp3 + sp1 \cdot sp2D \cdot sp2 \cdot \overline{sp3} \quad (1)$$

Configuration of the first phase comparator e1 shown in FIG. 10 reaches the Expression 1 according to Expressions 2 through 4 as regards the first UP signal UP1, the first synchronization signal SY1, and the first DOWN signal DN1 as follows.

$$\begin{aligned}
UP1 &= (\overline{sp1} \cdot sp2D + sp1 \cdot \overline{sp2D}) \cdot (\overline{sp1} \cdot sp3 + sp1 \cdot \overline{sp3}) \cdot (\overline{sp1} \cdot sp3 + \\
&\quad sp1 \cdot \overline{sp3}) \cdot (\overline{sp1} \cdot sp2 + sp1 \cdot \overline{sp2}) \\
&= (\overline{sp1} \cdot sp2D + sp1 \cdot \overline{sp2D}) \cdot (\overline{sp1} \cdot sp3 + sp1 \cdot \overline{sp3}) \cdot \\
&\quad (\overline{sp1} \cdot sp2 + sp1 \cdot \overline{sp2}) \\
&= \overline{sp1} \cdot sp2D \cdot \overline{sp1} \cdot sp3 \cdot \overline{sp1} \cdot sp2 + \overline{sp1} \cdot sp2D \cdot \overline{sp1} \cdot sp3 \cdot sp1 \cdot \overline{sp2} + \\
&\quad \overline{sp1} \cdot sp2D \cdot sp1 \cdot \overline{sp3} \cdot \overline{sp1} \cdot sp2 + \overline{sp1} \cdot sp2D \cdot sp1 \cdot \overline{sp3} \cdot sp1 \cdot \overline{sp2} + \\
&\quad sp1 \cdot \overline{sp2D} \cdot \overline{sp1} \cdot sp3 \cdot \overline{sp1} \cdot sp2 + sp1 \cdot \overline{sp2D} \cdot \overline{sp1} \cdot sp3 \cdot sp1 \cdot \overline{sp2} + \\
&\quad sp1 \cdot \overline{sp2D} \cdot sp1 \cdot \overline{sp3} \cdot \overline{sp1} \cdot sp2 + sp1 \cdot \overline{sp2D} \cdot sp1 \cdot \overline{sp3} \cdot sp1 \cdot \overline{sp2} \\
&= \overline{sp1} \cdot sp2D \cdot sp3 \cdot sp2 + 0 + 0 + 0 + 0 + 0 + 0 + \\
&\quad sp1 \cdot \overline{sp2D} \cdot \overline{sp3} \cdot \overline{sp2} \\
\therefore UP1 &= \overline{sp1} \cdot sp2D \cdot sp2 \cdot sp3 + sp1 \cdot \overline{sp2D} \cdot \overline{sp2} \cdot \overline{sp3}
\end{aligned}$$

$$\begin{aligned}
SY1 &= (\overline{sp2D} \cdot sp3 + sp2D \cdot \overline{sp3}) \cdot (\overline{sp1} \cdot sp3 + sp1 \cdot \overline{sp3}) \cdot \\
&\quad (\overline{sp1} \cdot sp3 + sp1 \cdot \overline{sp3}) \cdot (\overline{sp1} \cdot sp2 + sp1 \cdot \overline{sp2}) \\
&= (\overline{sp2D} \cdot sp3 + sp2D \cdot \overline{sp3}) \cdot (\overline{sp1} \cdot sp3 + sp1 \cdot \overline{sp3}) \cdot \\
&\quad (\overline{sp1} \cdot sp2 + sp1 \cdot \overline{sp2}) \\
&= \overline{sp2D} \cdot sp3 \cdot \overline{sp1} \cdot sp3 \cdot \overline{sp1} \cdot sp2 + \overline{sp2D} \cdot sp3 \cdot \overline{sp1} \cdot sp3 \cdot sp1 \cdot \overline{sp2} + \\
&\quad \overline{sp2D} \cdot sp3 \cdot sp1 \cdot \overline{sp3} \cdot \overline{sp1} \cdot sp2 + \overline{sp2D} \cdot sp3 \cdot sp1 \cdot \overline{sp3} \cdot sp1 \cdot \overline{sp2} + \\
&\quad sp2D \cdot \overline{sp3} \cdot \overline{sp1} \cdot sp3 \cdot \overline{sp1} \cdot sp2 + sp2D \cdot \overline{sp3} \cdot \overline{sp1} \cdot sp3 \cdot sp1 \cdot \overline{sp2} + \\
&\quad sp2D \cdot \overline{sp3} \cdot sp1 \cdot \overline{sp3} \cdot \overline{sp1} \cdot sp2 + sp2D \cdot \overline{sp3} \cdot sp1 \cdot \overline{sp3} \cdot sp1 \cdot \overline{sp2} \\
&= \overline{sp2D} \cdot sp3 \cdot \overline{sp1} \cdot sp2 + 0 + 0 + 0 + 0 + 0 + 0 + sp2D \cdot \overline{sp3} \cdot sp1 \cdot \overline{sp2}
\end{aligned}$$

-continued $$\therefore SY1 = \overline{sp1} \cdot \overline{sp2D} \cdot sp2 \cdot sp3 + sp1 \cdot sp2D \cdot \overline{sp2} \cdot \overline{sp3}$$

$$DN1 = \overline{(sp2D \cdot sp3 + sp2D \cdot \overline{sp3})} \cdot \overline{(sp1 \cdot sp3 + sp1 \cdot \overline{sp3})} \cdot \overline{(sp1 \cdot sp3 +}$$
$$sp1 \cdot \overline{sp3}) \cdot \overline{(sp2 \cdot sp3 + sp2 \cdot \overline{sp3})}$$
$$= \overline{(sp2D \cdot sp3 + sp2D \cdot \overline{sp3})} \cdot \overline{(sp1 \cdot sp3 + sp1 \cdot \overline{sp3})} \cdot$$
$$\overline{(sp2 \cdot sp3 + sp2 \cdot \overline{sp3})}$$
$$= \overline{sp2D} \cdot sp3 \cdot \overline{sp1} \cdot sp3 \cdot \overline{sp2} \cdot sp3 + \overline{sp2D} \cdot sp3 \cdot \overline{sp1} \cdot sp3 \cdot sp2 \cdot \overline{sp3} +$$
$$\overline{sp2D} \cdot sp3 \cdot sp1 \cdot \overline{sp3} \cdot \overline{sp2} \cdot sp3 + \overline{sp2D} \cdot sp3 \cdot sp1 \cdot \overline{sp3} \cdot sp2 \cdot \overline{sp3} +$$
$$sp2D \cdot \overline{sp3} \cdot \overline{sp1} \cdot sp3 \cdot \overline{sp2} \cdot sp3 + sp2D \cdot \overline{sp3} \cdot \overline{sp1} \cdot sp3 \cdot sp2 \cdot \overline{sp3} +$$
$$sp2D \cdot \overline{sp3} \cdot sp1 \cdot \overline{sp3} \cdot \overline{sp2} \cdot sp3 + sp2D \cdot \overline{sp3} \cdot sp1 \cdot \overline{sp3} \cdot sp2 \cdot \overline{sp3}$$
$$= \overline{sp2D} \cdot sp3 \cdot \overline{sp1} \cdot \overline{sp2} + 0 + 0 + 0 + 0 + 0 + 0 + sp2D \cdot \overline{sp3} \cdot sp1 \cdot sp2$$

$$\therefore DN1 = \overline{sp1} \cdot \overline{sp2D} \cdot \overline{sp2} \cdot sp3 + sp1 \cdot sp2D \cdot sp2 \cdot \overline{sp3}$$

Accordingly, it is possible, by using the first through the eighth phase comparators e1 to e8, to produce the first through the eighth UP signals UP1 to UP8, the first through the eighth synchronization signals SY1 to SY8, and the first through the eighth DOWN signals DN1 to DN8 and to determine lead/lag of the clock signals with reference to the input data i.

Eight ones of (the first UP signal UP1/the first synchronization signal SY1/the first DOWN signal DN1) to (the eighth UP signal UP8/the eighth synchronization signal SY8/the eighth DOWN signal DN8) are judged with majority by the majority circuit 26 in the manner which is described above. The majority circuit 26 produces either the judged UP signal UP20 or the judged DOWN signal DN20. Subsequently, processing by the accumulation counter 28 and the selector control circuit 30 is made in the manner which is described above.

[7. Operation Examples of Over-sampling Clock Data Recovery Circuit (CDR) 20]

Referring now to Tables 7 and 8, description will be made as regards operation of the over-sampling clock data recovery circuit (CDR) 20 according to the second embodiment of this invention.

TABLE 7

| SAMPLING NUMBER | PHASE COMPARATOR | OUTPUT OF PHASE COMPARATOR | OUTPUT OF MAJORITY CKT 26 | ACCUMULATED VALUE | COMPOSITE SELECTION BY S1 | COMPOSITE SELECTION BY S2 |
|---|---|---|---|---|---|---|
| 1 | e1 | SY | UP | 1 | 3 | 2 |
|   | e2 | UP |   |   |   |   |
|   | e3 | UP |   |   |   |   |
|   | e4 | NO |   |   |   |   |
|   | e5 | NO |   |   |   |   |
|   | e6 | NO |   |   |   |   |
|   | e7 | SN |   |   |   |   |
|   | e8 | NO |   |   |   |   |
| 2 | e1 | DN | UP | 2 | 3 | 2 |
|   | e2 | NO |   |   |   |   |
|   | e3 | UP |   |   |   |   |
|   | e4 | NO |   |   |   |   |
|   | e5 | NO |   |   |   |   |
|   | e6 | UP |   |   |   |   |
|   | e7 | NO |   |   |   |   |
|   | e8 | UP |   |   |   |   |
| 3 | e1 | NO | SY | 2 | 3 | 2 |
|   | e2 | UP |   |   |   |   |
|   | e3 | SY |   |   |   |   |
|   | e4 | DN |   |   |   |   |
|   | e5 | NO |   |   |   |   |
|   | e6 | SY |   |   |   |   |
|   | e7 | NO |   |   |   |   |
|   | e8 | SY |   |   |   |   |
| 4 | e1 | DN | UP | 3 | 3 | 2 |
|   | e2 | NO |   |   |   |   |
|   | e3 | UP |   |   |   |   |
|   | e4 | NO |   |   |   |   |
|   | e5 | NO |   |   |   |   |
|   | e6 | UP |   |   |   |   |
|   | e7 | NO |   |   |   |   |
|   | e8 | UP |   |   |   |   |
| 5 | e1 | SY | UP | 4 → 0 (UP) | 2 | 1 |
|   | e2 | UP |   |   |   |   |
|   | e3 | UP |   |   |   |   |
|   | e4 | NO |   |   |   |   |
|   | e5 | NO |   |   |   |   |
|   | e6 | NO |   |   |   |   |
|   | e7 | DN |   |   |   |   |
|   | e8 | NO |   |   |   |   |

TABLE 7-continued

| SAMP-LING NUM-BER | PHASE COMPA-RATOR | OUTPUT OF PHASE COMPA-RATOR | OUTPUT OF MAJORITY CKT 26 | ACCUMU-LATED VALUE | COMPO-SITE SELEC-TION BY S1 | COMPO-SITE SELEC-TION BY S2 |
|---|---|---|---|---|---|---|
| 6 | e1 | NO | UP | 1 | 2 | 1 |
|   | e2 | UP |   |   |   |   |
|   | e3 | SY |   |   |   |   |
|   | e4 | UP |   |   |   |   |
|   | e5 | NO |   |   |   |   |
|   | e6 | YP |   |   |   |   |
|   | e7 | NO |   |   |   |   |
|   | e8 | SY |   |   |   |   |
| 7 | e1 | NO | DN | 0 | 2 | 1 |
|   | e2 | UP |   |   |   |   |
|   | e3 | SY |   |   |   |   |
|   | e4 | DN |   |   |   |   |
|   | e5 | NO |   |   |   |   |
|   | e6 | DN |   |   |   |   |
|   | e7 | DN |   |   |   |   |
|   | e8 | DN |   |   |   |   |
| 8 | e1 | NO | UP | 1 | 2 | 1 |
|   | e2 | UP |   |   |   |   |
|   | e3 | SY |   |   |   |   |
|   | e4 | DN |   |   |   |   |
|   | e5 | NO |   |   |   |   |
|   | e6 | UP |   |   |   |   |
|   | e7 | NO |   |   |   |   |
|   | e8 | UP |   |   |   |   |

Table 7 shown an example of the processing on successive four samplings each of which is attached with a sampling number. In Table 7, a vertical item 1 represents a reference symbols of the phase comparators, a vertical item 2 represents a type of an output of each phase comparator, a vertical item 3 represent a type of an output of the majority circuit 24, a vertical item 4 represents an accumulated value held in the accumulation counter 28, a vertical item 5 represents a composite selection name of the composite selection in the circuitry of the side A according to the first through the sixth primary selection control signals S1-1 to S1-6, and a vertical item 6 represents a composite selection name of the composite selection in the circuitry of the side B according to the first through the sixth secondary selection control signals S2-1 to S2-6.

In the item 2, a term "UP" represents that the output of the phase comparator in question is "UP signal=1, synchronization signal=0, DONW signal=0", a term "SY" represents that the output of the phase comparator in question is "UP signal=0, synchronization signal=1, DOWN signal=0", a term "DN" represents that the output of the phase comparator in question is "UP signal=0, synchronization signal=0, DOWN signal=1, and a term "NO" represents that the output of the phase comparator in question is "UP signal=0, synchronization signal=0, DOWN signal=0."

In the item 3, a term "UP" represents that the output of the majority circuit 26 in the sampling number in question is "UP signal UP20=1, DOWN signal DN20=0", a term "SY" represents that the output of the majority circuit 26 in the sampling number in question is "UP signal UP20=0, DOWN signal DN20=0", and a term "DN" represents that the output of the majority circuit 26 in the sampling number in question is "UP signal UP20=0, DOWN signal DN20=1."

As shown in Table 7, at a time instant where the processing of the sampling number of 1 is carried out, the accumulated value is equal to 1, the composite selection of the circuitry in the side A is represented by 3, and the composite selection of the circuitry in the side B is represented by 2. In this event, the synchronization state in the side A is <3> and the synchronization state in the side B is <2>.

In the sampling number of 2, in as much as the outputs of the first through the eighth phase comparators e1 to e8 are three "UP", no "SY", one "DN", and four "NO", the majority circuit 26 produces the judged UP signal of "UP signal UP20=1, DOWN signal DN20=0." Responsive to the judged UP signal, the accumulation counter 28 counts up the accumulated value from 1 to 2.

Subsequently, in the sampling number of 3, inasmuch as the outputs of the first through the eighth phase comparators e1 to e8 are one "UP", three "SY", one "DN", and three "NO", the majority circuit 26 produces the judged signal of "UP signal UP20=0, DOWN signal DN20=0." As a result, the accumulation counter 28 maintains the accumulated value of 2.

Subsequently, in the sampling number of 4, inasmuch as the outputs of the first through the eighth phase comparators e1 to e8 are three "UP", no "SY", one "DN", and four "NO", the majority circuit 26 produces the judged UP signal of "UP signal UP20=1, DOWN signal DN20=0. " Responsive to the judged UP signal, the accumulation counter 28 counts up the accumulated value from 2 to 3.

Subsequently, in the sampling number of 5, inasmuch as the outputs of the first through the eighth phase comparators e1 to e8 are two "UP", one "SY", one "DN", and four "NO", the majority circuit 26 produces the judged UP signal of "UP signal UP20=1, DOWN signal DN20=0. " Responsive to the judged UP signal, the accumulation counter 28 counts up the accumulated value from 3 to 4 and resets the accumulated value to 0. Simultaneously, the accumulation counter 28 supplies the accumulated UP signal UP30 to the selector control circuit 30.

Responsive to the accumulated UP signal UP30, the selector control circuit 30 changes the composite selection of the circuitry in the side A from 3 to 2 and changes the composite selection of the circuitry in the side B from 2 to 1. The selector control circuit 30 supplies the first through the sixth primary selection control signals. S1-1 to S1-6 and the first through the sixth secondary selection control signals S2-1 to S2-6 in question to the first eight-stage delay locked loop (DLL) 40a, the first inversion switching circuit 38a, the first selector 36a, the second eight-stage delay locked loop (DLL) 40b, the second inversion switching circuit 38b, and the second selector 36b. Therefore, the synchronization state in the side A is switched from <3> to <2>, the synchronization state in the side B is switched from <2> to <2¥1>, and the phases of thirty-two phase clock signals CLK1 to CLK16, CLK1D to CLK16D are shifted in a leading direction by one resolution of 57 ps as a whole.

In the similar manner, processing from the sampling number of 6 to the sampling number 8 is carried out as shown in Table 7. By omitting the outputs of the first through the eighth phase comparators e1 to e8, Table 8 illustrates processing from the sampling number 1 to the sampling number 25. In Table 8, vertical items 3 to 6 correspond to the vertical items 3 to 6 in Table 7.

selector control circuit 30, the composite selection in the circuitry of the side A is changed from 1 to 2, and the composite selection in the circuitry of the side B is changed from 56 to 1. Accordingly, the synchronization state in the side A is changed from <1> to <2>, the synchronization state in the side B is changed from <56> to <1>, and the phases in the thirty-two clock signals CLK1 to CLK16, CLK1D to CLK16D are shifted in the lag direction by one resolution of 57 ps as a whole. In a case of synchronization, values of the selection control signals S1-1 to S1-6, S2-1 to S2-6 may be not changed, the accumulated value may be returned to "0" to reset the state. Other processing ways may be adapted and is not restricted to this.

[8. Merits of Oversampling Clock Data Recovery Circuit (CDR) 20]

According to the oversampling clock data recovery circuit (CDR) 20 of the second embodiment of this invention described above, lead/lag in the phases of the clock signals are detected with the transition point of the input data lied between clock edges of two-phase clock signals CLKsD and

TABLE 8

| SAMPLING NUMBER | OUTPUT OF PHASE COMPARATOR | ACCUMU-LATED VALUE | COMPOSITE SELECTION BY S1 | COMPOSITE SELECTION BY S2 |
| --- | --- | --- | --- | --- |
| 1 | UP | 1 | 3 | 2 |
| 5 | UP | 2 | 3 | 2 |
| 3 | SY | 2 | 3 | 2 |
| 4 | UP | 3 | 3 | 2 |
| 5 | UP | 4 → 0 (UP) | 2 | 1 |
| 6 | UP | 1 | 2 | 1 |
| 7 | DN | 0 | 2 | 1 |
| 8 | UP | 1 | 2 | 1 |
| 9 | UP | 2 | 2 | 1 |
| 10 | SY | 2 | 2 | 1 |
| 11 | UP | 3 | 2 | 1 |
| 12 | UP | 4 → 0 (UP) | 1 | 56 |
| 13 | SY | 0 | 1 | 56 |
| 14 | DN | −1 | 1 | 56 |
| 15 | DN | −2 | 1 | 56 |
| 16 | UP | −1 | 1 | 56 |
| 17 | SU | −1 | 1 | 56 |
| 18 | DN | −2 | 1 | 56 |
| 19 | DN | −3 | 1 | 56 |
| 20 | DN | 4 → 0 (UP) | 2 | 1 |
| 21 | SY | 0 | 2 | 1 |
| 22 | UP | 1 | 2 | 1 |
| 23 | DN | 0 | 2 | 1 |
| 24 | UP | 1 | 2 | 1 |
| 25 | DN | 0 | 2 | 1 |

As shown in Table 8, the accumulated value changes to 1, 0, 1, 2, 2, and 3 in the sampling numbers 6 to 11 and then is counted up to 4 in the sampling number of 12 to reset to 0, the accumulated UP signal UP30 is supplied to the selector control circuit 30, the composite selection in the circuitry of the side A is changed from 2 to 1, and the composite selection in the circuitry of the side B is changed from 1 to 56. Accordingly, the synchronization state in the side A is changed from <2> to <1>, the synchronization state in the side B is changed from <1> to <56>, the phases in the thirty-two clock signals CLK1 to CLK16, CLK1D to CLK16D are shifted in the leading direction by one resolution of 57 ps as a whole.

Furthermore, the accumulated value changed to 0, −1, −2, −1, −1, −2, and −3 in the sampling numbers 13 to 19 and is counted down to 4 in the sampling number of 20 to reset to 0, the accumulated DOWN signal DN30 is supplied to the CLKs adjacent to each other by the phase interval of 57 ps, where s represents an even number between 2 to 16, both inclusive. As a result, it is possible to realize a follow-up characteristic equivalent to the 8-times oversampling clock recovery and it is therefore possible to realize clock recovery having an excellent follow-up character independent of a changing rate of the input data i.

While the 8-times oversampling clock recovery uses eight clock edges per one bit of data, the oversampling clock data recovery circuit (CDR) 20 according to this invention can realize follow-up characteristic equivalent to the 8-times oversampling clock recovery by using three clock edges per one bit of data.

Inasmuch as it is impossible to implement a buffer or an inverter having a propagation delay of 57 ps using an existing CMOS process, it is impossible to generate multi-phase clock signals having a narrow phase interval of 57 ps in a conventional CDR. However, according to this embodiment of this invention, it is possible to multi-phase clock signals CLK1 to CLK16, CLK1D to CLK16D having a narrow phase interval of 57 ps using the buffers c1 to c8, d1 to d8 having a propagation delay of 200 ps.

In addition, by cyclically shifting the multi-phase clock signals at a high resolution as a whole with the phase interval of the multi-phase clock signals maintained at a high precision, it is possible to generate the clock signals having a good quality with equal intervals without causing degradation such as distortion of a waveform or the like.

The oversampling clock data recovery circuit according to the second embodiment is no more than an embodiment of this invention. For example, the buffers (a1 to a4, b1 to b7, c1 to c8, and d1 to d8) may be constituted as single-phase in structure.

Third Embodiment

Referring to FIGS. 11A, 11B, 11C, 11D, 11E, 11F, 11F, and 11H, the description will proceed to an oversampling clock recovery method according to a third embodiment of this invention. FIGS. 11A to 11H are time charts showing waveform for use in describing the oversampling clock recovery method according to the third embodiment of this invention.

The illustrated oversampling clock recovery method is different from the oversampling clock recovery method according to the first embodiment and detects lag/lead of clock signals in reference with an input data i by sampling the input data using six-phase clock signals CLKe, CLKf, CLKg, CLKh, CLKi, and CLKj where four leading clock edges correspond to one bit of the input data i. The six-phase clock signals CLKe to CLKj are called first through sixth clock signals, respectively.

A phase interval between the first clock signal CLKe and the fifth clock signal CKLi is equal to a length of the one bit of the input data i. The first, the third, and the fifth clock signals CLKe, CLKg, and CLKi are arranged with substantially equal intervals. Likewise, the second, the fourth, and the sixth clock signals CLKf, CLKh, and CLKj are arranged with substantially equal intervals. Each of a phase interval between the first clock signal CLKe and the second clock signal CLKf, a phase interval between the third clock signal CLKg and the fourth clock signal CLKh, and a phase interval between the fifth clock signal CLKi and the sixth clock signal CLKj is narrower than each of a phase interval between the second clock signal CLKf and the third clock signal CLKg and a phase interval between the fourth clock signal CLKh and the fifth clock signal CLKi. Accordingly, in other words, as shown in FIGS. 11A through 11H, respective two-phase clock signals (CLKe and CLKf), (CLKg and CLKh), and (CLKi and CLKj) each having a relatively narrower interval are composed of three pairs and the three pairs of the two-phase clock signals are arranged with substantially equal intervals and with relatively wider intervals.

Each of the phase interval between the first and the second clock signals CLKe and CLKf, the phase interval between the third and the fourth clock signals CLKg and CLKh, and the phase interval between the fifth and the sixth clock signals CLKi and CLKj is narrower than one-fourth of a bit length of the input data i. In the example being illustrated, each of the phase interval between the first and the second clock signals CLKe and CLKf, the phase interval between the third and the fourth clock signals CLKg and CLKh, and the phase interval between the fifth and the sixth clock signals CLKi and CLKJ is equal to about one-eighth of the bit length of the input data i. The first and the fifth clock signals CLKe and CLKi or the second and the sixth clock signals CLKf and CLKJ are clock signals for use in actually picking up data.

In a state where the sixth-phase clock signals CLKe to CLKj are arranged at the above-mentioned phase intervals, sampling of the input data i is carried out. The over-sampling clock recovery method carries out clock recovery by detecting (determining) lag/lead of the clock signals for the data on the basis of sampled data and by controlling so that the clock signals follow the data, In the over-sampling clock recovering method, if the six-phase clock signals CLKe to CLKj are controlled so that a transition point of the input data i positions between a leading edge of the third clock signal CLKg and a leading edge of the fourth clock signal CLKh, leading edges of the first, the second, the fifth, and sixth clock signals CLKe, CLKf, CLKI, and CLKj automatically synchronize with a center of the bit of the input data i.

In order to control the phases of the six-phase clock signals CLKe to CLKj, the phases of the six-phase clock signals CLKe to CLKj are shifted by a length equal to the phase interval between the third and the fourth clock signals CLKg and CLKh as one resolution (one unit) with those phase intervals maintained.

Figure 11:
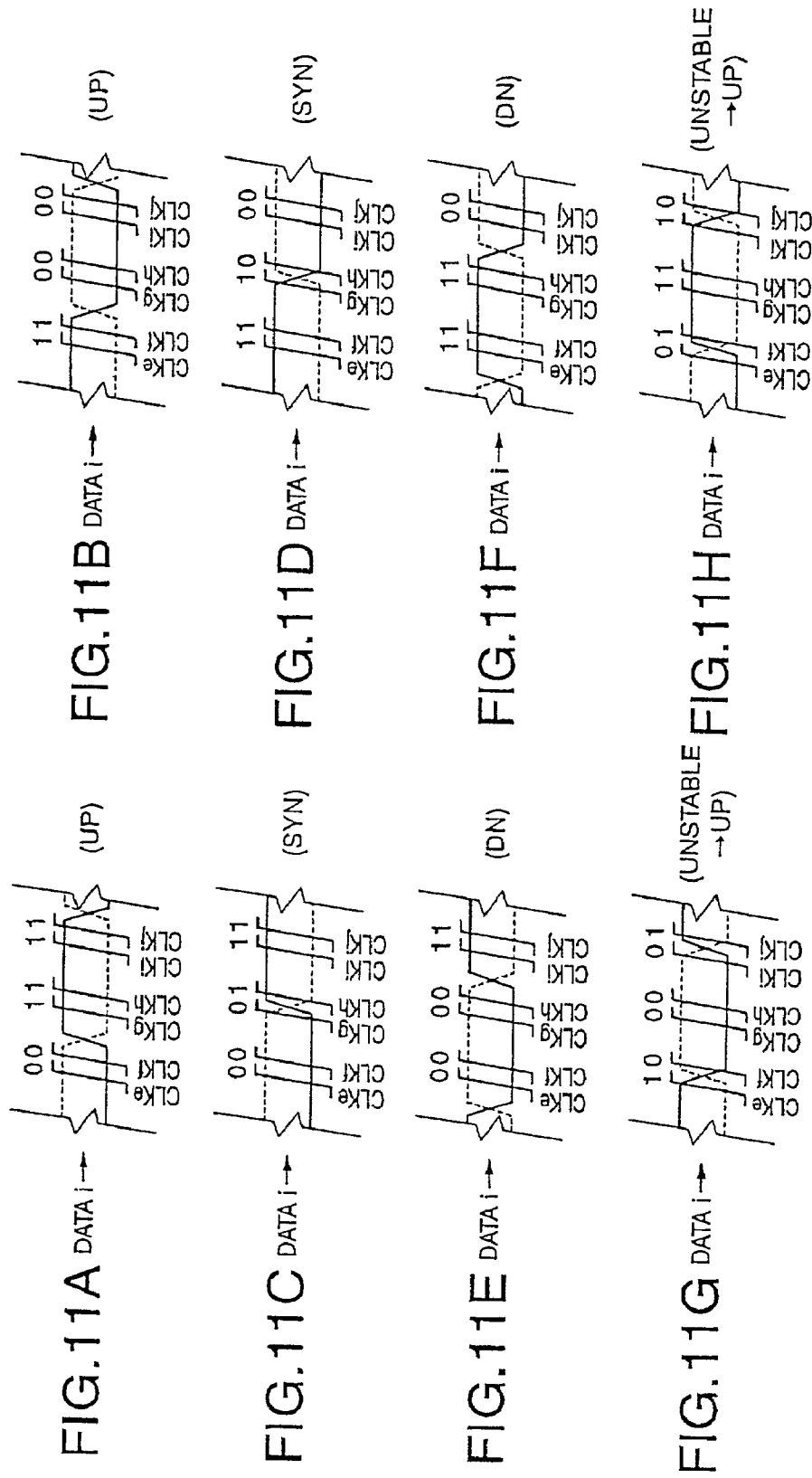
FIGS. 11A through 11H collectively show time charts schematically showing waveforms for use in describing an oversamling clock recovery method according to a third embodiment of this invention.

As shown in FIGS. 11A and 11B, it will be assumed that sampled data sampled by the six-phase clock signals CLKe to CLKj are <001111> or <110000>. In this event, the over-sampling clock recovery method determines that the phases of the six-phase clock signals CLKe to CLKj should be put "forward (UP)." This is.because the transition point of the input data i lies between the second and the third clock signals CLKf and CLKg and therefore the six-phase clock signals CLKe to CLKj are delayed compared with the input data i. On the basis of its determination, the over-sampling clock recovery method puts the phases of the six-phase clock signals CLKe to CLKj forward by the one resolution.

As shown in FIGS. 11C and 11D, it will be assumed that the sampled data sampled by the six-phase clock signals CLKe to CLKj are <000111> or <111000>. In this event, the over-sampling clock recovery method determines that phases between the six-phase clock signals CLKe to CLKj and the input data i are "synchronized (SYN)" with each other. This is because the transition point of the input data i lies between the third and the fourth clock signals CLKg and CLKh and therefore leading edges of the first, the second, the fifth, and the sixth clock signals CLKe, CLKf, CLKi, and CLKj synchronize with a center of the bit of the input data i.

As shown in FIGS. 11E and 11F, it will be assumed that the sampled data sampled by the six-phase clock signals CLKe to CLKi are <000011> or <111100>. In this event, the over-sampling clock recovery method determines that the phases of the six-phase clock signals CLKe to CLKj should be put "backward (DN)." This is because the transition point of the input data i lies between the fourth and the fifth clock signals CLKh and CLKi and therefore the six-phase clock signals CLKe to CLKj run fast compared with the input data i. On the basis of its determination, the over-sampling clock recovery method puts the phases of the six-phase clock signals CLKe to CLKj backward by the one resolution.

As shown in FIGS. 11G and 11H, it will be assumed that sampled data sampled by the six-phase clock signals CLKe to CLKj are <100001> or <011110>. In this event, the over-sampling clock recovery method determines that the phases of the six-phase clock signals CLKe to CLKj should be put "forward (UP)." This is because the transition point of the input data i lies between the first and the second clock signals CLKe and CLKf and between the fifth and the sixth clock signals CLKi and CLKf. Specifically, the first and the fifth clock signals CLKe and CLKi or the second and the sixth clock signals CLKf and CLKj, which are for sampling the data, lie in an unstable position for a value of a bit end portion and it is therefore necessary to quickly avoid a most inconvenient state by shifting the phases of the clock signals. On the basis of its determination, the over-sampling clock recovery method puts the phases of the six-phase clock signals CLKe to CLKj forward by the one resolution.

Although the over-sampling clock recovery method comprises the steps of determining that the phases of the six-phase clock signals CLKe to CLKj should be put "forward (UP)" and of putting the phases of the six-phase clock signals CLKe to CLKj forward by the one resolution in the example being illustrated, a phase shifting amount for recovering the synchronization state is unchanged in the lead direction and in the lag direction. Accordingly, the over-sampling clock recovery method may comprise the steps of determining that the phases of the six-phase clock signals CLKe to CLKj should be put "backward (DOWN)" and of putting the phases of the six-phase clock signals CLKe to CLKj backward by the one resolution. At any rate, it may be preferable to preliminarily set whether or not the phases of the six-phase clock signals CLKe to CLKj should be put UP or DOWN.

By controlling the six-phase clock signals CLKe to CLKj in the manner which is described above, it is possible to phase-lock the first and the fifth clock signals CLKe and CLKi or the second and the sixth clock signals CLKf and CLKj for use in sampling an actual data at a center of a stable bit for a value of the input data i.

According to this method, it is unnecessary to pass eight clock edges within one bit of the input data in the manner as the eight times over-sampling but it may be necessary to pass four clock edges within one bit of the input data. Nevertheless, inasmuch as the interval between the third and the fourth clock signals CLKg and CLKh is relatively narrow, it is possible to realize a high follow-up. If the interval between the third and the fourth clock signals CLKg and CLKh is narrowed to one-eighth of the length of one bit, it is possible to obtain a follow-up equivalent to that of the eight times over-sampling. Likewise, if the interval between the third and the fourth clock signals CLKg and CLKh is narrowed to one-sixteenth of the length of one bit, it is possible to obtain a follow-up equivalent to that of fifteen times over-sampling. It is possible to obtain follow-up of high times over-sampling such as eight, sixteen times over-samplings or the like using the four-phase clock signals per one bit. It is possible to relatively easily control the phases of the clock signals with realizing such as follow-up of the high times over-sampling. This is because the number of phases of the clock signals to be phase locked is four-phase per one bit and is therefore small.

The method according to this embodiment is different from the method according to the first embodiment and can detect the inconvenient state which takes a middle position between lag and lead in reference with the data as shown in FIGS. 11G and 11H and can rapidly avoid such as an inconvenient state. For example, it is possible to rapidly avoid such as an inconvenient state by carrying out a biased weighting processing a detected result shown in FIGS. 11G and 11H on detected results shown in FIGS. 2A through 2F.

Fourth Embodiment

Figure 12:
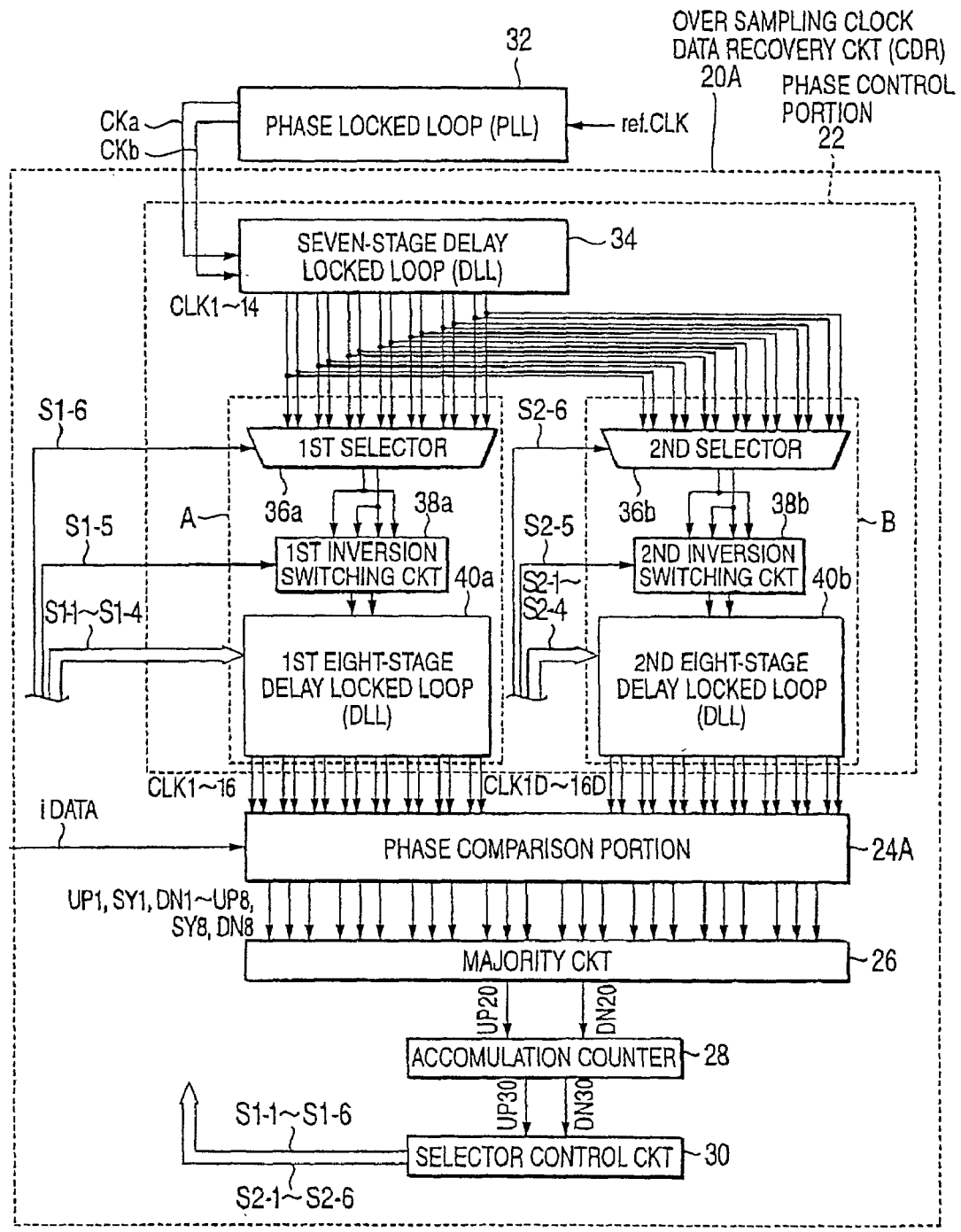
FIG. 12 is a block diagram showing an oversampling clock recovery circuit according to a fourth embodiment of this invention.
Figure 13:
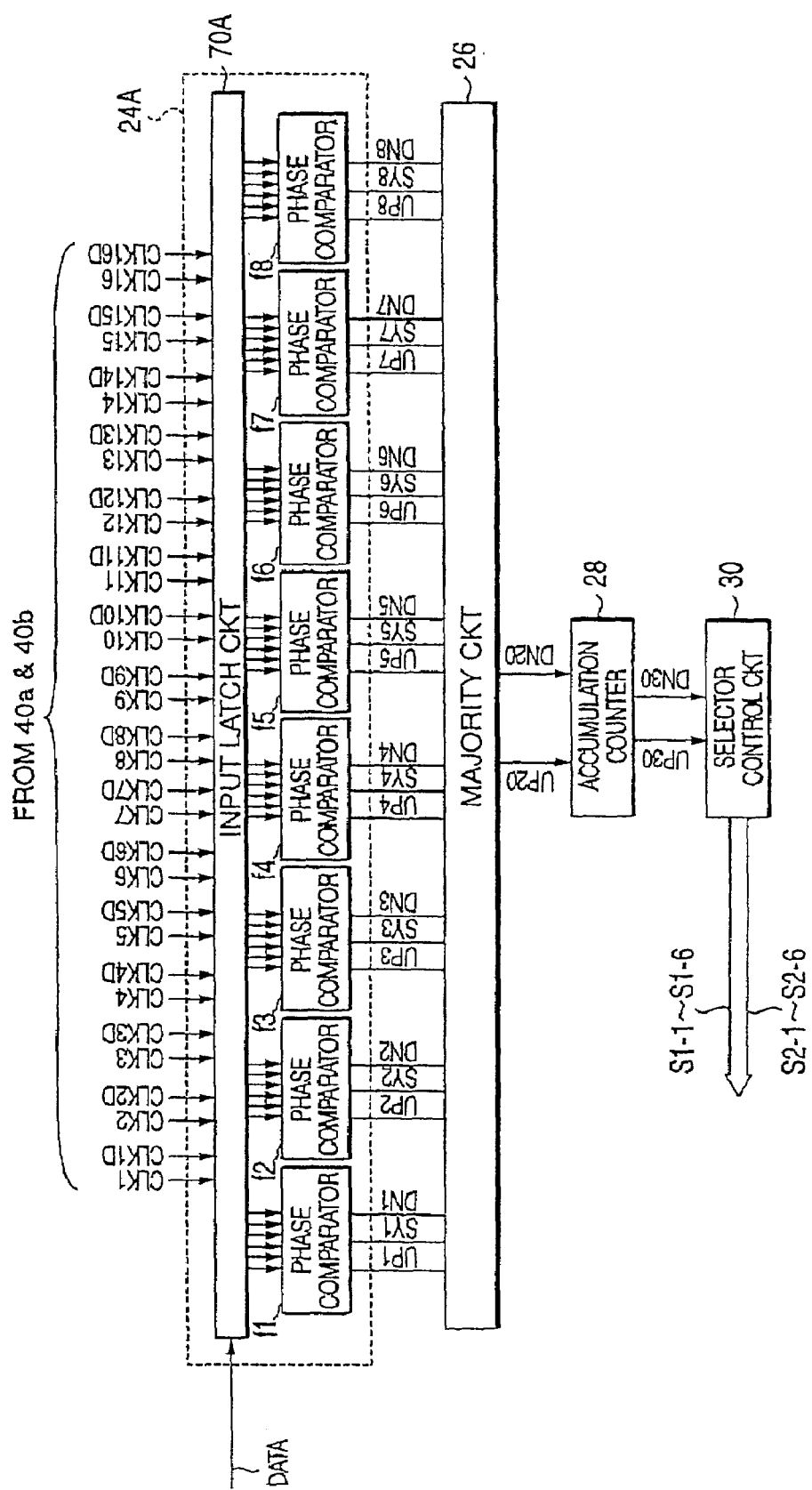
FIG. 13 is a schematic block diagram of a phase comparison circuit for use in the oversampling clock recovery circuit illustrated in FIG. 12.
Figure 14:
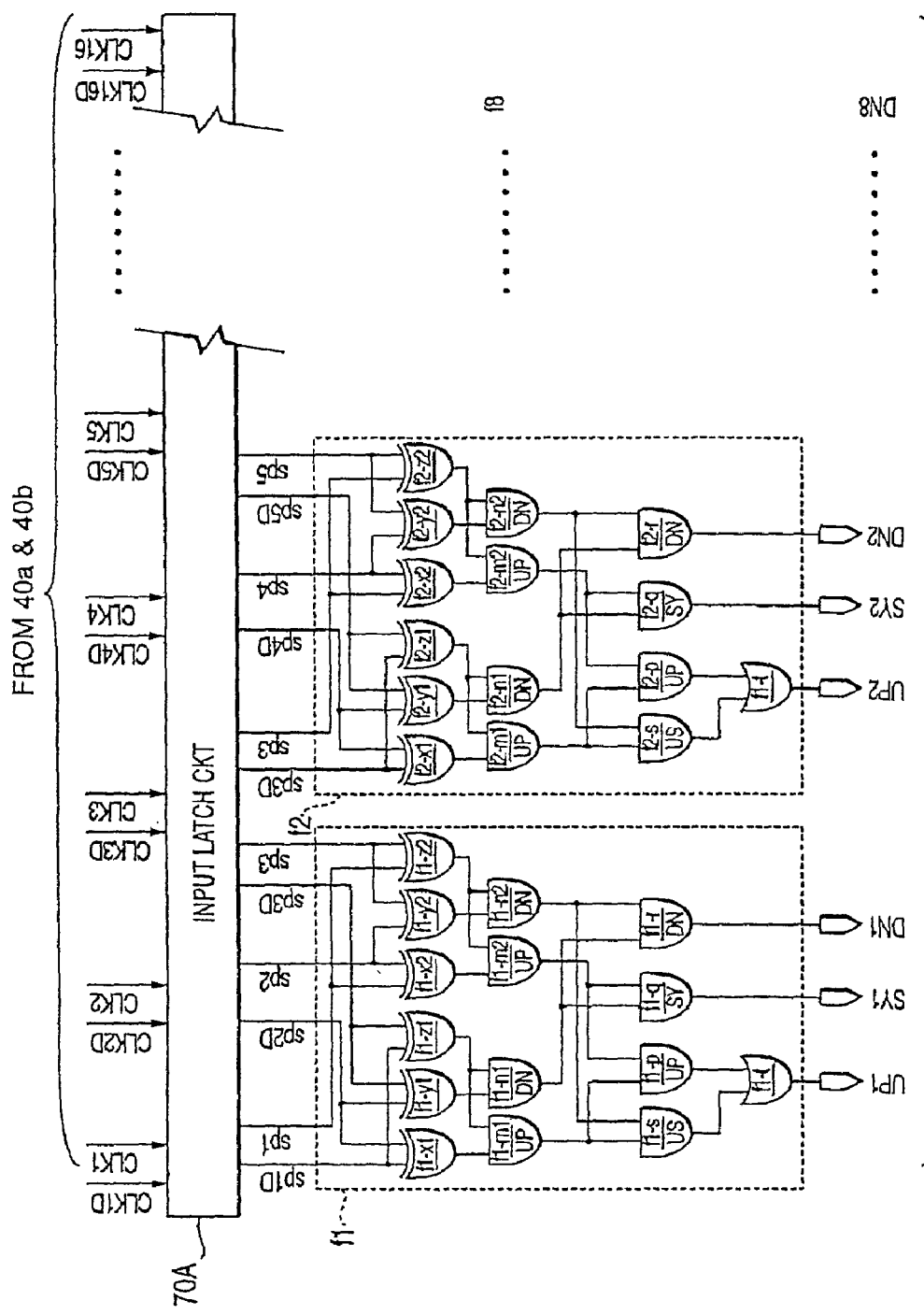
FIG. 14 is a circuit diagram of a phase comparator for use in the phase comparison circuit illustrated in FIG. 13.

Referring to FIGS. 12 through 14 in addition to FIG. 8C, the description will proceed to an oversampling clock data recovery circuit according to a firth embodiment of this invention.

The third embodiment does not describe about realization of circuitry. The illustrated oversampling clock data recovery circuit (CDR) is a circuit for implementing the oversampling clock recovery method of the third embodiment. In the fourth embodiment, description exemplifies a case of dealing with an 8-bit serial input data having a data rate of 2.5 Gbps and a differential clock signal having a clock frequency of 312.5 MHz (a period of 3200 ps) in the similar manner as the above-mentioned second embodiment.

As shown in FIG. 12, the oversampling clock data recovery circuit depicted at 20A comprises the phase control portion 22, a phase comparison portion 24A, the majority circuit 26, the accumulation counter 28, and the selector control circuit 30. The oversampling clock data recovery circuit 20A is supplied with clock signals CKa and CKb from the external phase locked loop (PLL) 32. The selector control circuit 30 generates the first through the sixth primary selection control signals S1-1 to S1-6 and the first through the sixth secondary selection control signals S2-1 to S2-6.

The phase control portion 22 comprises the seven-stage delay locked loop (DLL) 34, the first and the second selectors 36a and 36b, the first and the second inversion switching circuits 38a and 38b, and the first and the second eight-stage delay locked loops (DLLs) 40a and 40b. The first and the second selectors 36a and 36b are similar in structure. The first and the second inversion switching circuits 38a and 38b are similar in structure. The first and the second eight-stage delay locked loops 40a and 40b are similar in structure. A combination of the first selector 36a, the first inversion switching circuit 38a, and the first eight-stage delay locked loop 40a constitutes the side A while a combination of the second selector 36b, the second inversion switching circuit 38b, and the second eight-stage delay locked loop 40b constitutes the side B.

The over-sampling clock data recovery circuit (CDR) 20A according to the fourth embodiment is different from the over-sampling clock data recovery circuit (CDR) 20 according to the second embodiment and comprises the phase comparison portion 24A as shown in FIG. 13.

The oversampling clock data recovery circuit (CDR) 20A is similar in general processing flow, digital phase control, selector control rule to the oversampling clock data recovery circuit (CDR) 20 but is different from the oversampling clock data recovery circuit (CDR) 20 in a point for sampling using all of the thirty-two-phase clock signals CLK1 to CLK16 and CLK1D to CLK16D. The oversampling clock data recovery circuit (CDR) 20A is different in logic of phase comparison from the oversampling clock data recovery circuit (CDR) 20 and carries out logic operation on the basis of the oversampling clock recovery method according to the third embodiment.

Referring to FIG. 8C and FIGS. 11A to 11H, the clock signal CLK1D corresponds to the clock signal CLKe, the clock signal CLK1 corresponds to the clock signal CLKf, the clock signal CLK2D corresponds to the clock signal CLKg, the clock signal CLK2 corresponds to the clock signal CLKh, the clock signal CLK3D corresponds to the clock signal CLKi, and the clock signal CLK3 corresponds to the clock signal CLKj.

In a similar manner where successive six-phase clock signals CLK1D·CLK1–CLK2D·CLK2–CLK3D·CLK3 correspond to the clock signals CLKe·CLKf–CLKg·CLKh–CLKi·CLKj in the third embodiment in conjunction with FIGS. 11A through 11F, respective successive six-phase clock signals CLK3D·CLK3–CKL4D·CLK4–CLK5D·CLK5, CLK5D·CLK5–CLK6D·CLK6–CLK7D·CLK7, CLK7D·CLK7–CLK8D·CLK8–CLK9D·CLK9, CLK9D·CLK9–CLK10D·CLK10–CLK11D·CLK11, CLK11D·CLK11–CLK12D·CLK12–CLK13D·CLK13, CLK13D·CLK13–CLK14D·CLK14–CLK15D·CLK15, and CLK15D·CLK15–CLK16D·CLK16–CLK1D·CLK1 correspond to the clock signals CLKe·CLKf–CLKg·CLKh–CLKi·CLKj in the third embodiment in conjunction with FIGS. 11A through 11H. With this mode, the over-sampling clock recovery method according to the third embodiment of this invention is implemented. That is, the over-sampling clock data recovery circuit (CDR) 20A according to the fourth embodiment uses multi-phase clock signals which consists of four-phase clock signals for one bit of the input data i and which has roughness and fineness in arrangement. A period of the roughness and fineness is equal to half bit length of the input data i.

[Phase Comparison Portion 24A]

FIG. 13 is a block diagram showing an internal structure of the phase comparison portion 24A. As shown in FIG. 13, the phase comparison portion 24A comprises an input latch circuit 70A and first through eighth phase comparators f1 to f8. The input latch circuit 70A is supplied with the thirty-two phase clock signals CLK1 to CLK16 and CLK1D to CLK16D. The input latch circuit 70A samples the input data using the thirty-two phase clock signals to supply sampled data six by six to the first through the eighth phase comparators f1 to f8 which are disposed in parallel.

FIG. 14 is a circuit diagram showing a circuit within a phase comparator. Referring to FIG. 14, the first phase comparator f1 is supplied with a sampled data sp1D sampled by the clock signal CLK1D, a sampled data sp1 sampled by the clock signal CLK1, a sampled data sp2D sampled by the clock signal CLK2D, a sampled data sp2 sampled by the clock signal CLK2, a sampled data sp3D sampled by the clock signal CLK3D, and a sampled data sp3 sampled by the clock signal CLK3.

In the manner which is described above, the first phase comparator f1 is supplied with six sampled data sp1D·sp1–sp2D·sp2–sp3D·sp3 sampled by the successive six-phase clock signals CLK1D·CLK1–CLK2D·CLK2–CLK3D·CLK3.

Likewise, the second phase comparator f2 is supplied with six sampled data sp3D·sp3–sp4D·sp4–sp5D·sp5 sampled by the successive six-phase clock signals CLK3D·CLK3–CLK4D·CLK4–CLK5D·CLK5. The third phase comparator f3 is supplied with six sampled data sp5D·sp5–sp6D·sp6–sp7D·sp7 sampled by the successive six-phase clock signals CLK5D·CLK5–CLK6D·CLK6–CLK7D·CLK7. The fourth phase comparator f4 is supplied with six sampled data sp7D·sp7–sp8D·sp8–sp9D·sp9 sampled by the successive six-phase clock signals CLK7D·CLK7–CLK8D·CLK8–CLK9D·CLK9. The fifth phase comparator f5 is supplied with six sampled data sp9D·sp9–sp10D·sp10–sp11D·sp11 sampled by the successive six-phase clock signals CLK9D·CLK9–CLK10D·CLK10–CLK11D·CLK11. The sixth phase comparator f6 is supplied with six sampled data sp11D·sp11–sp12D·sp12–sp13D·sp13 sampled by the successive six-phase clock signals CLK11D·CLK11–CLK12D·CLK12–CLK13D·CLK13. The seventh phase comparator f7 is supplied with six sampled data sp13D·sp13–sp14D·sp14–sp15D·sp15 sampled by the successive six-phase clock signals CLK13D·CLK13–CLK14D·CLK14–CLK15D·CLK15. The eighth phase comparator f8 is supplied with six sampled data sp15D·sp15–sp16D·sp16–sp1D·sp1 sampled by the successive six-phase clock signals CLK15D·CLK15–CLK16D·CLK16–CLK1D·CLK1.

[Logic of Phase Comparison]

Supplied with the six sampled data sp1D·sp1–sp2D·sp2–sp3D·sp3, the first phase comparator f1 produces one of the first UP signal UP1, the first synchronization signal SY1, and the first DOWN signal DN1. Similarly, the second phase comparator f2 is supplied with the six sampled data sp3D·sp3–sp4D·sp4–sp5D·sp5 to produce one of the second UP signal UP2, the second synchronization signal SY2, and the second DOWN signal DN2. The third phase comparator f3 is supplied with the six sampled data sp5D·sp5–sp6D·sp6–sp7D·sp7 to produce one of the third UP signal UP3, the third synchronization signal SY3, and the third DOWN signal DN3, The fourth phase comparator f4 is supplied with the six sampled data sp7D·sp7–sp8D·sp8–sp9D·sp9 to produce one of the fourth UP signal UP4, the fourth synchronization signal SY4, and the fourth DOWN signal DN4. The fifth phase comparator f5 is supplied with the six sampled data sp9D·sp9–sp10D·sp10–sp11D·sp11 to produce one of the fifth UP signal UP5, the fifth synchronization signal SY5, and the fifth DOWN signal DN5. The sixth phase comparator f6 is supplied with the six sampled data sp11D·sp11–sp12D·sp12–sp13D·sp13 tb produce one of the sixth UP signal UP6, the sixth synchronization signal SY6, and the sixth DOWN signal DN6. The seventh phase comparator f7 is supplied with the six sampled data sp13D·sp13–sp14D·sp14–sp15D·sp15 to produce one of the seventh UP signal UP7, the seventh synchronization signal SY7, and the seventh DOWN signal DN7. The eighth phase comparator f8 is supplied with the six sampled data sp15D·sp15–sp16D·sp16–sp1D·sp1 to produce one of the eighth UP signal UP8, the eighth synchronization signal SY8, and the eighth DOWN signal DN8.

Inasmuch as the first through the eighth phase comparators f1 to f8 are similar in structure and operation, the first phase comparator f1 will be described in behalf of the first through the eighth comparators f1 to f8.

As shown in FIG. 14, the first phase comparator f1 comprises six exclusive OR gates f1-x1, f1-y1, f1-z1, f1-x2, f1-y2, and f1-z2, four AND gates f1-m1, f1-n1, f1-m2, and f1-n2 supplied with outputs from those six exclusive OR gates, four AND gates f1-p, f1-q, f1-r, and f1-s supplied with outputs from those four AND gates, and an OR gate f1-t. These connections are disclosed in FIG. 14. At a final-stage in the first phase comparator f1, the OR gate f1-t produces the first UP signal UP1. At a third-stage in the first phase comparator f1, the AND gate e1-q produces the first synchronization signal SY1, and the AND gate e1–r produces the first DOWN signal DN1.

In order to implement the over-sampling clock recovery method according to the third embodiment of this invention, the first phase comparator f1 may carry out arithmetic operation according to a truth table shown in Table 9 as follows.

TABLE 9

| | INPUT | | | | | | OUTPUT | | |
|---|---|---|---|---|---|---|---|---|---|
| | sp1D | sp1 | sp2D | sp2 | sp3D | sp3 | UP1 | SY1 | DN1 |
| a1 | 0 | 0 | 1 | 1 | 1 | 1 | 1 | 0 | 0 |
| a2 | 0 | 0 | 0 | 1 | 1 | 1 | 0 | 1 | 0 |
| a3 | 1 | 1 | 1 | 1 | 0 | 0 | 0 | 0 | 1 |
| a4 | 0 | 1 | 1 | 1 | 1 | 0 | 1 | 0 | 0 |
| a5 | OTHER COMBINATIONS | | | | | | 0 | 0 | 0 |
| a1 | 1 | 1 | 0 | 0 | 0 | 0 | 1 | 0 | 0 |
| a2 | 1 | 1 | 1 | 0 | 0 | 0 | 0 | 1 | 0 |
| a3 | 0 | 0 | 0 | 0 | 1 | 1 | 0 | 0 | 1 |
| a4 | 1 | 0 | 0 | 0 | 0 | 1 | 1 | 0 | 0 |
| a5 | OTHER COMBINATIONS | | | | | | 0 | 0 | 0 |

Boolean expressions correspond to the truth table shown in Table 9 are represented by Expression 5 as follows.

$$UP1 = sp1D \cdot sp1 \cdot \overline{sp2D} \cdot \overline{sp2} \cdot \overline{sp3D} \cdot \overline{sp3} + sp1D \cdot \overline{sp1} \cdot \overline{sp2D} \cdot \overline{sp2} \cdot \overline{sp3D} \cdot sp3 + \overline{sp1D} \cdot sp1 \cdot sp2D \cdot sp2 \cdot sp3D \cdot sp3 + \overline{sp1D} \cdot sp1 \cdot sp2D \cdot sp2 \cdot sp3D \cdot \overline{sp3}$$

$$SY1 = sp1D \cdot sp1 \cdot sp2D \cdot \overline{sp2} \cdot \overline{sp3D} \cdot \overline{sp3} + \overline{sp1D} \cdot \overline{sp1} \cdot \overline{sp2D} \cdot sp2 \cdot sp3D \cdot sp3$$

$$DN1 = \overline{sp1D} \cdot \overline{sp1} \cdot \overline{sp2D} \cdot \overline{sp2} \cdot sp3D \cdot sp3 + sp1D \cdot sp1 \cdot sp2D \cdot sp2 \cdot \overline{sp3D} \cdot \overline{sp3} \quad (5)$$

Configuration of the first phase comparator ef shown in FIG. 14 reaches the Expression 5 according to Expressions 6 through 8 as regards the first UP signal UP1, the first synchronization signal SY1, and the first DOWN signal DN1 as follows.

$$UP1 = (sp1D \cdot \overline{sp2D} + \overline{sp1D} \cdot sp2D) \cdot (sp1D \cdot \overline{sp3D} + \overline{sp1D} \cdot sp3D) \cdot$$
$$(sp2 \cdot \overline{sp3} + sp2 \cdot sp3) \cdot (sp1 \cdot \overline{sp3} + \overline{sp1} \cdot sp3) +$$
$$(sp1D \cdot \overline{sp2D} + \overline{sp1D} \cdot sp2D) \cdot (sp1D \cdot \overline{sp3D} + \overline{sp1D} \cdot sp3D) \cdot$$
$$(sp1 \cdot \overline{sp2} + sp1 \cdot sp2) \cdot (sp1 \cdot \overline{sp3} + \overline{sp1} \cdot sp3)$$

$$= sp1D \cdot \overline{sp2D} \cdot sp1D \cdot \overline{sp3D} \cdot sp2 \cdot \overline{sp3} \cdot sp1 \cdot \overline{sp3} +$$
$$sp1D \cdot \overline{sp2D} \cdot sp1D \cdot \overline{sp3D} \cdot sp2 \cdot \overline{sp3} \cdot \overline{sp1} \cdot sp3 +$$
$$sp1D \cdot \overline{sp2D} \cdot sp1D \cdot \overline{sp3D} \cdot \overline{sp2} \cdot sp3 \cdot sp1 \cdot \overline{sp3} +$$
$$sp1D \cdot \overline{sp2D} \cdot sp1D \cdot \overline{sp3D} \cdot \overline{sp2} \cdot sp3 \cdot \overline{sp1} \cdot sp3 +$$

$$sp1D \cdot \overline{sp2D} \cdot \overline{sp1D} \cdot sp3D \cdot sp2 \cdot \overline{sp3} \cdot sp1 \cdot \overline{sp3} +$$
$$sp1D \cdot \overline{sp2D} \cdot \overline{sp1D} \cdot sp3D \cdot sp2 \cdot \overline{sp3} \cdot \overline{sp1} \cdot sp3 +$$
$$sp1D \cdot \overline{sp2D} \cdot \overline{sp1D} \cdot sp3D \cdot \overline{sp2} \cdot sp3 \cdot sp1 \cdot \overline{sp3} +$$
$$sp1D \cdot \overline{sp2D} \cdot \overline{sp1D} \cdot sp3D \cdot \overline{sp2} \cdot sp3 \cdot \overline{sp1} \cdot sp3 +$$
$$\overline{sp1D} \cdot sp2D \cdot sp1D \cdot \overline{sp3D} \cdot sp2 \cdot \overline{sp3} \cdot sp1 \cdot \overline{sp3} +$$

$$\overline{sp1D} \cdot sp2D \cdot sp1D \cdot \overline{sp3D} \cdot sp2 \cdot \overline{sp3} \cdot \overline{sp1} \cdot sp3 +$$
$$\overline{sp1D} \cdot sp2D \cdot sp1D \cdot \overline{sp3D} \cdot \overline{sp2} \cdot sp3 \cdot sp1 \cdot \overline{sp3} +$$
$$\overline{sp1D} \cdot sp2D \cdot sp1D \cdot \overline{sp3D} \cdot \overline{sp2} \cdot sp3 \cdot \overline{sp1} \cdot sp3 +$$
$$\overline{sp1D} \cdot sp2D \cdot \overline{sp1D} \cdot sp3D \cdot sp2 \cdot \overline{sp3} \cdot sp1 \cdot \overline{sp3} +$$

$$\overline{sp1D} \cdot sp2D \cdot \overline{sp1D} \cdot sp3D \cdot sp2 \cdot \overline{sp3} \cdot \overline{sp1} \cdot sp3 +$$
$$\overline{sp1D} \cdot sp2D \cdot \overline{sp1D} \cdot sp3D \cdot \overline{sp2} \cdot sp3 \cdot sp1 \cdot \overline{sp3} +$$
$$sp1D \cdot \overline{sp2D} \cdot sp1D \cdot \overline{sp3D} \cdot sp1 \cdot \overline{sp2} \cdot sp1 \cdot \overline{sp3} +$$
$$sp1D \cdot \overline{sp2D} \cdot sp1D \cdot \overline{sp3D} \cdot sp1 \cdot \overline{sp2} \cdot \overline{sp1} \cdot sp3 +$$

$$sp1D \cdot \overline{sp2D} \cdot sp1D \cdot \overline{sp3D} \cdot \overline{sp1} \cdot sp2 \cdot sp1 \cdot \overline{sp3} +$$
$$sp1D \cdot \overline{sp2D} \cdot sp1D \cdot \overline{sp3D} \cdot \overline{sp1} \cdot sp2 \cdot \overline{sp1} \cdot sp3 +$$
$$sp1D \cdot \overline{sp2D} \cdot \overline{sp1D} \cdot sp3D \cdot sp1 \cdot \overline{sp2} \cdot sp1 \cdot \overline{sp3} +$$
$$sp1D \cdot \overline{sp2D} \cdot \overline{sp1D} \cdot sp3D \cdot sp1 \cdot \overline{sp2} \cdot \overline{sp1} \cdot sp3 +$$
$$sp1D \cdot \overline{sp2D} \cdot \overline{sp1D} \cdot sp3D \cdot \overline{sp1} \cdot sp2 \cdot sp1 \cdot \overline{sp3} +$$

$$sp1D \cdot \overline{sp2D} \cdot \overline{sp1D} \cdot sp3D \cdot \overline{sp1} \cdot sp2 \cdot \overline{sp1} \cdot sp3 +$$
$$\overline{sp1D} \cdot sp2D \cdot sp1D \cdot \overline{sp3D} \cdot sp1 \cdot \overline{sp2} \cdot sp1 \cdot \overline{sp3} +$$
$$\overline{sp1D} \cdot sp2D \cdot sp1D \cdot \overline{sp3D} \cdot sp1 \cdot \overline{sp2} \cdot \overline{sp1} \cdot sp3 +$$
$$\overline{sp1D} \cdot sp2D \cdot sp1D \cdot \overline{sp3D} \cdot \overline{sp1} \cdot sp2 \cdot sp1 \cdot \overline{sp3} +$$
$$\overline{sp1D} \cdot sp2D \cdot sp1D \cdot \overline{sp3D} \cdot \overline{sp1} \cdot sp2 \cdot \overline{sp1} \cdot sp3 +$$

$$\overline{sp1D} \cdot sp2D \cdot \overline{sp1D} \cdot sp3D \cdot sp1 \cdot \overline{sp2} \cdot sp1 \cdot \overline{sp3} +$$
$$\overline{sp1D} \cdot sp2D \cdot \overline{sp1D} \cdot sp3D \cdot sp1 \cdot \overline{sp2} \cdot \overline{sp1} \cdot sp3 +$$
$$\overline{sp1D} \cdot sp2D \cdot \overline{sp1D} \cdot sp3D \cdot \overline{sp1} \cdot sp2 \cdot sp1 \cdot \overline{sp3} +$$
$$\overline{sp1D} \cdot sp2D \cdot \overline{sp1D} \cdot sp3D \cdot \overline{sp1} \cdot sp2 \cdot \overline{sp1} \cdot sp3$$

$$= sp1D \cdot \overline{sp2D} \cdot \overline{sp3D} \cdot sp2 \cdot \overline{sp3} \cdot sp1 + 0 +$$
$$0 sp1D \cdot \overline{sp2D} \cdot \overline{sp3D} \cdot \overline{sp2} \cdot sp3 \cdot \overline{sp1} + 0 + 0 + 0 + 0 +$$
$$0 + 0 + 0 + 0 + \overline{sp1D} \cdot sp2D \cdot sp3D \cdot sp2 \cdot \overline{sp3} \cdot sp1 +$$
$$0 + 0 + \overline{sp1D} \cdot sp2D \cdot sp3D \cdot \overline{sp2} \cdot sp3 \cdot \overline{sp1} +$$
$$sp1D \cdot \overline{sp2D} \cdot \overline{sp3D} \cdot sp1 \cdot \overline{sp2} \cdot \overline{sp3} + 0 + 0 +$$

$$sp1D \cdot \overline{sp2D} \cdot \overline{sp3D} \cdot \overline{sp1} \cdot sp2 \cdot sp3 + 0 + 0 +$$
$$0 + 0 + 0 + 0 + 0 + 0 + \overline{sp1D} \cdot sp2D \cdot sp3D \cdot sp1 \cdot \overline{sp2} \cdot \overline{sp3} +$$
$$0 + 0 + \overline{sp1D} \cdot sp2D \cdot sp3D \cdot \overline{sp1} \cdot sp2 \cdot sp3$$

$$\therefore UP1 = sp1D \cdot sp1 \cdot \overline{sp2D} \cdot sp2 \cdot \overline{sp3D} \cdot \overline{sp3} + \quad (6)$$
$$sp1D \cdot \overline{sp1} \cdot \overline{sp2D} \cdot \overline{sp2} \cdot \overline{sp3D} \cdot sp3 +$$
$$\overline{sp1D} \cdot sp1 \cdot sp2D \cdot sp2 \cdot sp3D \cdot \overline{sp3} +$$
$$\overline{sp1D} \cdot \overline{sp1} \cdot sp2D \cdot \overline{sp2} \cdot sp3D \cdot sp3 +$$

$$sp1D \cdot sp1 \cdot \overline{sp2D} \cdot sp2 \cdot \overline{sp3D} \cdot \overline{sp3} + sp1D \cdot \overline{sp1} \cdot \overline{sp2D} \cdot sp2 \cdot \overline{sp3D} \cdot sp3 +$$
$$\overline{sp1D} \cdot sp1 \cdot sp2D \cdot \overline{sp2} \cdot sp3D \cdot \overline{sp3} + \overline{sp1D} \cdot \overline{sp1} \cdot sp2D \cdot sp2 \cdot sp3D \cdot sp3$$

$$SY1 = (sp2D \cdot \overline{sp3D} + \overline{sp2D} \cdot sp3D) \cdot (sp1D \cdot \overline{sp3D} + \overline{sp1D} \cdot sp3D) \cdot$$
$$(sp1 \cdot \overline{sp2} + \overline{sp1} \cdot sp2) \cdot (sp1 \cdot \overline{sp3} + \overline{sp1} \cdot sp3)$$

$$= sp2D \cdot \overline{sp3D} \cdot sp1D \cdot \overline{sp3D} \cdot sp1 \cdot \overline{sp2} \cdot sp1 \cdot \overline{sp3} +$$
$$sp2D \cdot \overline{sp3D} \cdot sp1D \cdot \overline{sp3D} \cdot sp1 \cdot \overline{sp2} \cdot \overline{sp1} \cdot sp3 +$$
$$sp2D \cdot \overline{sp3D} \cdot sp1D \cdot \overline{sp3D} \cdot \overline{sp1} \cdot sp2 \cdot sp1 \cdot \overline{sp3} +$$

$$sp2D \cdot \overline{sp3D} \cdot sp1D \cdot \overline{sp3D} \cdot \overline{sp1} \cdot sp2 \cdot \overline{sp1} \cdot sp3 +$$
$$sp2D \cdot \overline{sp3D} \cdot \overline{sp1D} \cdot sp3D \cdot sp1 \cdot \overline{sp2} \cdot sp1 \cdot \overline{sp3} +$$
$$sp2D \cdot \overline{sp3D} \cdot \overline{sp1D} \cdot sp3D \cdot sp1 \cdot \overline{sp2} \cdot \overline{sp1} \cdot sp3 +$$

$$sp2D \cdot \overline{sp3D} \cdot \overline{sp1D} \cdot sp3D \cdot \overline{sp1} \cdot sp2 \cdot sp1 \cdot \overline{sp3} +$$
$$sp2D \cdot \overline{sp3D} \cdot \overline{sp1D} \cdot sp3D \cdot \overline{sp1} \cdot sp2 \cdot \overline{sp1} \cdot sp3 +$$

$$\overline{sp2D} \cdot sp3D \cdot sp1D \cdot \overline{sp3D} \cdot sp1 \cdot \overline{sp2} \cdot sp1 \cdot \overline{sp3} +$$
$$\overline{sp2D} \cdot sp3D \cdot sp1D \cdot \overline{sp3D} \cdot sp1 \cdot \overline{sp2} \cdot \overline{sp1} \cdot sp3 +$$
$$\overline{sp2D} \cdot sp3D \cdot sp1D \cdot \overline{sp3D} \cdot \overline{sp1} \cdot sp2 \cdot sp1 \cdot \overline{sp3} +$$

$$\overline{sp2D} \cdot sp3D \cdot sp1D \cdot \overline{sp3D} \cdot \overline{sp1} \cdot sp2 \cdot \overline{sp1} \cdot sp3 +$$
$$\overline{sp2D} \cdot sp3D \cdot \overline{sp1D} \cdot sp3D \cdot sp1 \cdot \overline{sp2} \cdot sp1 \cdot \overline{sp3} +$$
$$\overline{sp2D} \cdot sp3D \cdot \overline{sp1D} \cdot sp3D \cdot sp1 \cdot \overline{sp2} \cdot \overline{sp1} \cdot sp3 +$$
$$\overline{sp2D} \cdot sp3D \cdot \overline{sp1D} \cdot sp3D \cdot \overline{sp1} \cdot sp2 \cdot sp1 \cdot \overline{sp3} +$$
$$\overline{sp2D} \cdot sp3D \cdot \overline{sp1D} \cdot sp3D \cdot \overline{sp1} \cdot sp2 \cdot \overline{sp1} \cdot sp3$$

-continued $$= sp2D \cdot \overline{sp3D} \cdot sp1D \cdot sp1 \cdot \overline{sp2} \cdot \overline{sp3} + 0 + 0 +$$
$$sp2D \cdot \overline{sp3D} \cdot sp1D \cdot \overline{sp1} \cdot sp2 \cdot sp3 + 0 + 0 + 0 + 0 +$$
$$0 + 0 + 0 + 0 + \overline{sp2D} \cdot sp3D \cdot \overline{sp1D} \cdot sp1 \cdot \overline{sp2} \cdot \overline{sp3} +$$
$$0 + 0 + \overline{sp2D} \cdot sp3D \cdot \overline{sp1D} \cdot \overline{sp1} \cdot sp2 \cdot sp3$$

$$\therefore SY1 = sp1D \cdot sp1 \cdot sp2D \cdot \overline{sp2} \cdot \overline{sp3D} \cdot \overline{sp3} + \quad (7)$$
$$sp1D \cdot \overline{sp1} \cdot sp2D \cdot sp2 \cdot \overline{sp3D} \cdot sp3 +$$
$$\overline{sp1D} \cdot sp1 \cdot \overline{sp2D} \cdot \overline{sp2} \cdot sp3D \cdot \overline{sp3} +$$
$$\overline{sp1D} \cdot \overline{sp1} \cdot \overline{sp2D} \cdot sp2 \cdot sp3D \cdot sp3$$

$$DN1 = (sp2D \cdot \overline{sp3D} + \overline{sp2D} \cdot sp3D) \cdot (sp1D \cdot \overline{sp3D} + \overline{sp1D} \cdot sp3D) \cdot$$
$$(sp2 \cdot \overline{sp3} + \overline{sp2} \cdot sp3) \cdot (sp1 \cdot \overline{sp3} + \overline{sp1} \cdot sp3) +$$
$$sp2D \cdot \overline{sp3D} \cdot sp1D \cdot \overline{sp3D} \cdot sp2 \cdot \overline{sp3} \cdot sp1 \cdot \overline{sp3} +$$
$$sp2D \cdot \overline{sp3D} \cdot sp1D \cdot \overline{sp3D} \cdot sp2 \cdot \overline{sp3} \cdot \overline{sp1} \cdot sp3 +$$
$$sp2D \cdot \overline{sp3D} \cdot sp1D \cdot \overline{sp3D} \cdot \overline{sp2} \cdot sp3 \cdot sp1 \cdot \overline{sp3} +$$

$$sp2D \cdot \overline{sp3D} \cdot sp1D \cdot \overline{sp3D} \cdot \overline{sp2} \cdot sp3 \cdot \overline{sp1} \cdot sp3 +$$
$$sp2D \cdot \overline{sp3D} \cdot \overline{sp1D} \cdot sp3D \cdot sp2 \cdot \overline{sp3} \cdot sp1 \cdot \overline{sp3} +$$
$$sp2D \cdot \overline{sp3D} \cdot \overline{sp1D} \cdot sp3D \cdot sp2 \cdot \overline{sp3} \cdot \overline{sp1} \cdot sp3 +$$
$$sp2D \cdot \overline{sp3D} \cdot \overline{sp1D} \cdot sp3D \cdot \overline{sp2} \cdot sp3 \cdot sp1 \cdot \overline{sp3} +$$

$$sp2D \cdot \overline{sp3D} \cdot \overline{sp1D} \cdot sp3D \cdot \overline{sp2} \cdot sp3 \cdot \overline{sp1} \cdot sp3 +$$
$$\overline{sp2D} \cdot sp3D \cdot sp1D \cdot \overline{sp3D} \cdot sp2 \cdot \overline{sp3} \cdot sp1 \cdot \overline{sp3} +$$
$$\overline{sp2D} \cdot sp3D \cdot sp1D \cdot \overline{sp3D} \cdot sp2 \cdot \overline{sp3} \cdot \overline{sp1} \cdot sp3 +$$
$$\overline{sp2D} \cdot sp3D \cdot sp1D \cdot \overline{sp3D} \cdot \overline{sp2} \cdot sp3 \cdot sp1 \cdot \overline{sp3} +$$

$$\overline{sp2D} \cdot sp3D \cdot sp1D \cdot \overline{sp3D} \cdot \overline{sp2} \cdot sp3 \cdot \overline{sp1} \cdot sp3 +$$
$$\overline{sp2D} \cdot sp3D \cdot \overline{sp1D} \cdot sp3D \cdot sp2 \cdot \overline{sp3} \cdot sp1 \cdot \overline{sp3} +$$
$$\overline{sp2D} \cdot sp3D \cdot \overline{sp1D} \cdot sp3D \cdot sp2 \cdot \overline{sp3} \cdot \overline{sp1} \cdot sp3 +$$
$$\overline{sp2D} \cdot sp3D \cdot \overline{sp1D} \cdot sp3D \cdot \overline{sp2} \cdot sp3 \cdot sp1 \cdot \overline{sp3} +$$
$$\overline{sp2D} \cdot sp3D \cdot \overline{sp1D} \cdot sp3D \cdot \overline{sp2} \cdot sp3 \cdot \overline{sp1} \cdot sp3$$

$$\therefore DN1 = sp1D \cdot sp1 \cdot sp2D \cdot sp2 \cdot \overline{sp3D} \cdot \overline{sp3} + \quad (8)$$
$$sp1D \cdot \overline{sp1} \cdot sp2D \cdot \overline{sp2} \cdot \overline{sp3D} \cdot sp3 +$$
$$\overline{sp1D} \cdot sp1 \cdot \overline{sp2D} \cdot sp2 \cdot sp3D \cdot \overline{sp3} +$$
$$\overline{sp1D} \cdot \overline{sp1} \cdot \overline{sp2D} \cdot \overline{sp2} \cdot sp3D \cdot sp3$$

As input signal pattern having any term inconsistent with Expression 5 among Expressions 6 to 8 cannot occur from the nature of a data signal, it is not a problem in technique.

Accordingly, it is possible, by using the first through the eighth phase comparators f1 to f8, to produce the first through the eighth UP signals UP1 to UP8, the first through the eighth synchronization signals SY1 to SY8, and the first through the eighth DOWN signals DN1 to DN8 and to determine lead/lag of the clock signals with reference to the input data i.

Eight ones of (the first UP signal UP1/the first synchronization signal SY1/the first DOWN signal DN1) to (the eighth UP signal UP8/the eighth synchronization signal SY8/the eighth DOWN signal DN8) are judged with majority by the majority circuit 26 in the manner which is described above. The majority circuit 26 produces either the judged UP signal UP20 or the judged DOWN signal DN20. Subsequently, processing by the accumulation counter 28 and the selector control circuit 30 is made in the manner which is described above.

In order to pass four-phase or more clock signals or five-phase or more clock signals for one bit of the input data in the above-mentioned embodiments, it is necessary to increase another side in addition to the sides A and B in the above-mentioned embodiments to carry out control so as to shift one resolution by one resolution.

Now, the description will proceed to favorable merits in this invention compared with prior art by comparing a changing rate of the input data with follow-up speed as regards the conventional method and the method according to this invention.

[1. Calculation of Changing Rate and Follow-up Speed]

Now, follow-up character in each method will be estimated by comparing a maximum changing rate of the input data having jitter with follow-up speeds of the conventional 2-times, 3-times, 4-times, 8-times oversamplings and an oversampling clock recovery according to this invention. It will be assumed that the input data in question has a data rate of 2.5 Gbps.

[1-1. Changing Rate of the Input Data]

Now, the changing rate of the input data is calculated. Consideration will be made as regards in a case where the data rate has a frequency shifted with an offset of 200 ppm and the input data is frequency modulated caused by jitter in the manner which will later be described.

It will be assumed that the input data has a pattern having the densest transition points where different codes are alternatively arranged in a data train such as "010101 . . . ". In this event, the input data is approximated to a sinusoidal wave. When the input data has a frequency of fc, a phase $\theta 1(t)$ of the input data at a time instant t is represented by:

$$\theta 1(t) = 2\pi \cdot fc \cdot t [\text{rad}] \quad (1)$$

On the other hand, the input data having jitter may be dealt with as a frequency modulated wave. Accordingly, the input data frequency modulated by a jitter frequency fs and at a modulation index mdi has a phase $\theta 2(t)$ at a time instant t that is represented by:

$$\theta 2(t) = 2\pi \cdot fc \cdot t + mdi \cdot \sin(2\pi \cdot fs \cdot t)[\text{rad}] \quad (2)$$

In this event, a modulated component $\theta 3(t)$ caused by the jitter is represented by:

$$\theta 3(t) = mdi \cdot \sin(2\pi \cdot fs \cdot t)[\text{rad}] \quad (3)$$

Figure 15:
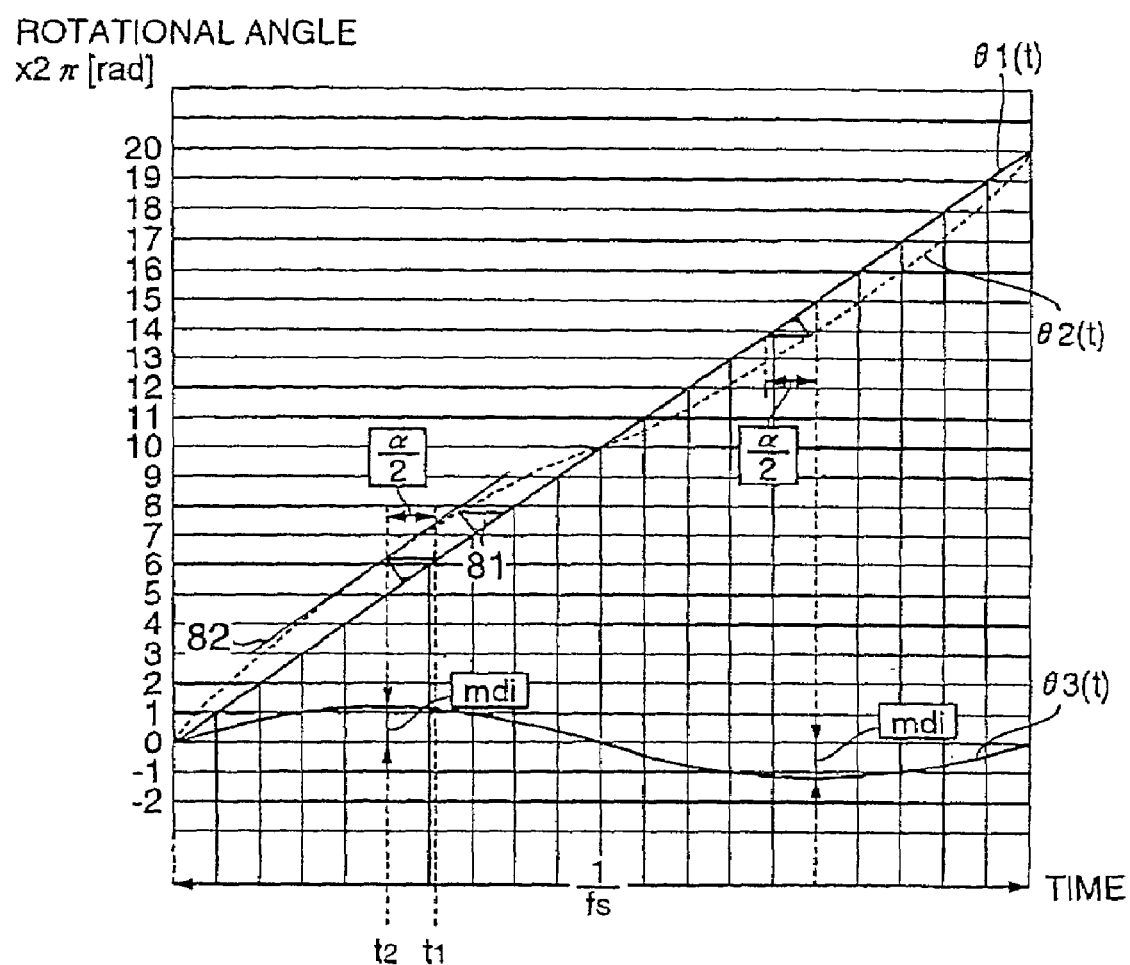
FIG. 15 is a graph showing phases of an input data having no jitter and of an input data having jitter and s modulated component caused by the jitter.

FIG. 15 shows a graph of Equations (1) through (3). In FIG. 15, the ordinate represents an rotational angle (rad) of the phase and the abscissa represents the time instant t.

Lag/lead of the phase of the input data (Equation (2)) having the jitter with reference to the input data (Equation (1)) having no jitter can be evaluated by a time difference which reaches to the same phase. The time difference reaching to the same phase between the input data (Equation (2)) having the jitter and the input data (Equation (1)) vibrates as shown in FIG. 15. A difference between the maximum value and the minimum value in this time difference corresponds to magnitude of the jitter, namely, an amplitude of a data arrival time (data rate) due to the jitter. When the amplitude of the data arrival time due to the jitter is represented by $\alpha$, an absolute value of the maximum and the minimum in the time difference of the date arrival time is represented by $\alpha/2$. This is added to FIG. 15.

It will be assumed that t1 represents a time interval in the input data (Equation (1)) having no jitter at a time when the time difference of the data arrival time becomes the maximum, or a phase becomes $\alpha/2$ and t2 represents a time interval in the input data (Equation (2)) having the jitter at a time when the time difference of the data arrival time becomes the maximum, or a phase becomes $\alpha/2$. In this event, a following Equation (4) is satisfied:

$$2(t1-t2) = \alpha \quad (4)$$

Referring to FIG. 15, a curve θ2(t) at the time instant t2 has a slope which is equal to that of a straight line θ1(t) or 2π·fc.

This is because when a right-angled triangle 81 shown in FIG. 15 has a maximum oblique line, the right-angled triangle 81 has a maximum height which is equal to a distance between a point of the curve θ2(t) and the straight line θ1(t). When the distance between the point of the curve θ2(t) and the straight line θ1(t) is maximum, a tangential line 82 of the curve θ2(t) at this point is in parallel with the straight line θ1(t).

Accordingly, inasmuch as a variation rate in θ2(t) at the time instant t2 is equal to a variation rate in θ1(t) at the time instant t1, a following Equation (5) is satisfied from Equations (1) and (2):

$$2\pi \cdot fc + mdi \cdot 2\pi \cdot fs \cdot \sin(2\pi \cdot fs \cdot t2) = 2\pi \cdot fc \quad (5)$$

By solving Equation (5), a following Equation (6) is satisfied:

$$t2 = \tfrac{1}{4}fs \quad (6)$$

The phase where the time difference of the data arrival time is maximum is represented by a following Equation (7) by substituting Equation (6) for Equation (2):

$$\theta 2(t2) = (\pi fc/2fs) + mdi \quad (7)$$

Inasmuch as θ1(t1)=θ2(t2), a following Equation (8) is satisfied by Equations (1) and (7):

$$2\pi \cdot fc \cdot t1 = (\pi fc/2fs) + mdi \quad (8)$$

By solving Equation (8), a following Equation (9) is satisfied:

$$t1 = (\tfrac{1}{4}fs) + (mdi/2\pi \cdot fc) \quad (9)$$

By substituting Equations (6) and (9) for Equation (4), a following Equation (10) is obtained:

$$(mdi/\pi fc) = \alpha \quad (10)$$

Now, a unit will be introduced. It will be assumed that the time t has a unit of [sec] and α has a unit of [UI], where [UI(Unit Interval)] is a unit of a length (time) in one bit of the data. Inasmuch as the length (time) in the one bit of the data is equal to one-second of a period of 1/fc or half period, a following Equation (11) is satisfied:

$$1[UI] = \tfrac{1}{2}fc \text{ [sec]} \quad (11)$$

By giving the unit to Equation (10), a following Equation (12) is obtained:

$$(mdi/\pi fc) \text{ [sec]} = \alpha[UI] \quad (12)$$

From Equation (11), a following Equation (13) is obtained:

$$(mdi/\pi fc) \text{ [sec]} = \alpha/2fc \text{ [sec]} \quad (13)$$

By solving Equation (13) about the modulation index mdi, a following Equation (14) is obtained:

$$mdi = \alpha\pi/2 \text{ [rad]} \quad (14)$$

By substituting Equation (14) for Equation (2), a following Equation (15) is obtained:

$$\theta 2(t) = 2\pi \cdot fc \cdot t + (\alpha\pi/2) \cdot \sin(2\pi \cdot fs \cdot t) \text{ [rad]} \quad (15)$$

Now, it will be assumed that 1 [UI] and π[rad] are represented by following Equations (16) and (17):

$$1[UI] = T[\text{sec}] \quad (16)$$

$$\pi[\text{rad}] = T \text{ [sec]} \quad (17)$$

where T represents the length (time) in the one bit of the data and is equal to ½fc.

From Equations (15) and (17), a following Equation (18) is obtained:

$$\theta 2(t) = 2fc \cdot t \cdot T + (\alpha T/2) \cdot \sin(2\pi \cdot fs \cdot t) \text{ [sec]} \quad (18)$$

Likewise, from Equations (1) and (17), a following Equation (19) is obtained:

$$\theta 1(t) = 2T \cdot fc \cdot t \text{ [sec]} \quad (19)$$

From Equations (18) and (19), a following Equation (20) is obtained:

$$\theta 2(t) - \theta 1(t) = (\alpha T/2) \cdot \sin(2\pi \cdot fs \cdot t) \text{ [sec]} \quad (20)$$

By differentiating Equation (20) with respect to t, a following Equation (21) is obtained:

$$d\{\theta 2(t) - \theta 1(t)\}/t = (\alpha T/2) \cdot 2\pi \cdot fs \cdot \cos(2\pi \cdot fs \cdot t) \text{ [sec/sec]} \quad (21)$$

Equation (21) represents a relative speed of the input data θ2(t) having the jitter in reference with the input data θ1(t) having no jitter. The relative speed indicates the variation speed due to the jitter.

Referring to FIG. 15, an edge variation speed in the input data due to the jitter is maximum when t=0. When this maximum value is represented by r1, a following Equation (22) is obtained by substituting t=0 for Equation (21):

$$r1 = \alpha T\pi fs \text{ [sec/sec]} \quad (22)$$

Now, the maximum value r1 of the variation speed in the input data due to the jitter will be calculated under the conditions of the data rate of 2.5 [Gbps], of the jitter frequency fs of 100 [kHz], and of the amplitude α caused by the jitter of 1.5 [UI].

When the data rate is equal to 2.5 [Gbps], the frequency fc of the input data is equal to 1.25 [GHz]. From Equations (11) and (16), inasmuch as T=½fc [sec], $$T = 1/2.5 = 400 \text{ [psec]}$$

Accordingly, calculation is made by substituting α=1.5 [UI], T=400 [psec], and fs=100 [kHz] for Equation (22), the maximum value r1 of the variation speed in the input data due to the jitter is represented by a following Equation (23):

$$r1 = 1.5 \times 400 \times 10^{-12} \times 100 \times 10^3 \times 3.141592 \therefore r1 = 0.00019 \text{ [sec/sec]} \quad (23)$$

Now, a variation speed r2 of the input data caused by the frequency offset in the data speed will be calculated. It will be assumed that the input data has an offset of +200 [ppm]. In this event, the variation speed r2 is represented by a following Equation (24):

$$r2 = 1 \times 200 \times 10^{-6} = 0.0002 \text{ [sec/sec]} \quad (24)$$

A maximum variation speed rmax of the input data is represented from Equations (23) and (24) by a following Equation (25):

$$rmax = r1 + r2 = 0.00039 \text{ [sec/sec]} \quad (25)$$

In the similar manner, the variation speeds rmax of the input data will be calculated in a case of α=5 [UI], α=10 [UI], α=50 [UI], and α100 [UI]. Table 10 shows those results.

TABLE 10

| INPUT DATA | |
|---|---|
| MAGNITUDE OF JITTER α(Uip - p) | VARIATION SPEED OF INPUT DATA |
| 1.5 | 3.88496E-04 |
| 5 | 8.28318E-04 |
| 10 | 0.001456637 |
| 50 | 0.006483184 |
| 100 | 0.012466368 |

[1-2. Follow-up Speed of Oversampling Clock Recovery]

A follow-up speed of the oversampling clock recovery is equal to a value obtained by dividing resolution of phase control by a response time, namely, (Follow-up speed)=(Resolution)/(Response time)   (26)

where the resolution represents an amount for shifting a clock signal by a time and the response time represents a time interval taken to determine that the clock signal should be shifted in a case where either lag (UP signal) or lead (DOWN signal) for the input data is successively detected immediately after shifting the clock signal by a time.

[1-3. Follow-up Speed in 2-Times Digital Oversampling Clock Recovery]

Now, follow-up speeds in a 2-times digital oversampling clock recovery will be calculated.

In a case of the 2-times digital oversampling clock recovery, the follow-up speed is calculated by Equation (26) in four patterns in which the resolution is equal to 25 [psec] or 50 [psec] and the response time of an ACR filter is equal to 20 [sec] or 40 [nsec]. Calculated results is shown in Table 11.

It will be assumed that a weighting for detection of lag (UP signal) or lead (DOWN signal) by a time is equal to 0.25. Accordingly, response is made by four times detection of the lag (UP signal) or the lead (DOWN signal) and is represented in terms of time by:

400 [psec]×4=1600 [psec]   (28-1)

Although the input data shifts in a lag direction or a lead direction before starting that the lag (UP signal) or the lead (DOWN signal) is detected, it takes a time interval from a time instant when a transition point of the input data passes a clock edge up to a time instant when the transition point passes an adjacent clock edge. This time interval corresponds to a time interval taken to moving the input data for one phase interval (T/8=50 [psec]) in dependency on the variation speed in the input data caused by the jitter.

Accordingly, when a moving time interval f for the one phase interval is represented by t3, the one phase interval is represented from Equation (20) by:

$T/8=(\alpha T/2)\cdot\sin(2\pi f_s \cdot t3)$   (29-1)

By substituting T=400 [psec] for Equation (29-1) and by deforming, the one phase interval t3 is represented by:

$t3=\{\sin^{-1}(1/4\alpha)\}/2\pi f_s$   (30-1)

By substituting fs=100 [kHz] and α=1.5 [UI] for Equation (30-1), the one phase interval t3 is represented by:

$t3=0.267$ [μsec]   (31-1)

A response time of the 8-times oversampling clock recovery is given from values (28-1) and (30-1) by:

1600 [psec]+0.267 [μsec]=0.2686 [μsec]   (32-1)

TABLE 11

| INPUT DATA | | RESOLUTION 400 p/16 = 25 ps | | RESOLUTION 400 p/8 = 50 ps | |
|---|---|---|---|---|---|
| | | ACR FILTER RESPONSE | ACR FILTER RESPONSE | ACR FILTER RESPONSE | ACR FILTER RESPONSE |
| MAGNITUDE OF JITTER α (Uip-p) | VARIATION SPEED OF INPUT DATA | TIME 20 ns FOLLOW-UP SPEED (25 p, 20 n) | TIME 40 ns FOLLOW-UP SPEED (25 p, 40 n) | TIME 20 ns FOLLOW-UP SPEED (50 p, 20 n) | TIME 40 ns FOLLOW-UP SPEED (50 p, 40 n) |
| 1.5 | 3.88496E-04 | 0.00125 | 0.000625 | 0.0025 | 0.00125 |
| 5 | 8.28318E-04 | 0.00125 | 0.000625 | 0.0025 | 0.00125 |
| 10 | 0.001456637 | 0.00125 | 0.000625 | 0.0025 | 0.00125 |
| 50 | 0.006483184 | 0.00125 | 0.000625 | 0.0025 | 0.00125 |
| 100 | 0.012466368 | 0.00125 | 0.000625 | 0.0025 | 0.00125 |

[1-4. Follow-up Speed in 8-times Oversampling Clock Recovery]

Now, follow-up speed speeds in an 8-times oversampling clock recovery will be calculated.

In a case of the 8-times oversampling clock recovery, inasmuch as eight-phase clock edges are arranged within one bit of the data (400[psec]), its resolution is represented by:

400 [psec]/8=50 [psec]   (27-1)

Accordingly, from Equation (26), values (27-1) and (32-1), the follow-up speed of the 8-times oversampling clock recovery is equal to 50 [psec]/0.2686 [μsec] =0.000186 [sec/sec].

Similarly, the response times are calculated in each case of α=5 [UI], α=10 [UI], α=50 [UI], and α=100 [UI] and the follow-up speeds are calculated by Equation (26). Calculated results are shown in Table 12.

TABLE 12

| INPUT DATA | | 8-TIMES OVERSAMPLING CDR | |
|---|---|---|---|
| | | WEIGHTING: 1/4 = 0.25 | |
| MAGNITUDE OF | VARIATION | RESOLUSION: 400 ps/8 = 50 ps | |
| JITTER $\alpha$(Uip – p). | SPEED OF INPUT DATA | CDR RESPONSE TIME (8-TIMES) | FOLLOW-UP SPEED (8-TIMES) |
| 1.5 | 3.88496E–04 | 2.66502E–07 | 0.000186496 |
| 5 | 8.28318E–04 | 7.96107E–08 | 0.000615683 |
| 10 | 0.001456637 | 3.97929E–08 | 0.001207937 |
| 50 | 0.006483184 | 7.95778E–09 | 0.005231339 |
| 100 | 0.012466368 | 3.97888E–09 | 0.008962375 |

[1-5. Follow-up Speed in 4-Times Oversampling Clock Recovery]

Now, follow-up speed speeds in a 4-times oversampling clock recovery will be calculated.

In a case of the 4-times oversampling clock recovery, its resolution is represented by:

$$50 \text{ [psec]} \tag{27-2}$$

It will be assumed that a weighting for detection of lag (UP signal) or lead (DOWN signal) by a time is equal to 0.25. Accordingly, response is made by four times detection of the lag (UP signal) or the lead (DOWN signal) and is represented in terms of time by:

$$400 \text{ [psec]} \times 4 = 1600 \text{ [psec]} \tag{28-2}$$

Although the input data shifts in a lag direction or a lead direction before starting that the lag (UP signal) or the lead (DOWN signal) is detected, it takes a time interval from a time instant when a transition point of the input data passes a clock edge up to a time instant when the transition point passes an adjacent clock edge. This time interval corresponds to a time interval taken to moving the input data for one phase interval (T/4=100 [psec]) in dependency on the variation speed in the input data caused by the jitter.

Accordingly, when a moving time interval for the one phase interval is represented by t4, the one phase interval is represented from Equation (20) by:

$$T/4 = (\alpha T/2) \cdot \sin(2\pi \cdot fs \cdot t4) \tag{29-2}$$

By substituting T=400 [psec] for Equation (29-2) and by deforming, the one phase interval t4 is represented by:

$$t4 = \{\sin^{-1}(\tfrac{1}{2}\alpha)\}/2\pi fs \tag{30-2}$$

By substituting fs=100 [kHz] and $\alpha$=1.5 [UI] for Equation (30-2), the one phase interval t4 is represented by:

$$t4 = 0.541 \text{ [}\mu\text{sec]} \tag{31-2}$$

A response time of the 4-times oversampling clock recovery is given from values (28-2) and (30-2) by:

$$1600 \text{ [psec]} + 0.541 \text{ [}\mu\text{sec]} = 0.5426 \text{ [}\mu\text{sec]} \tag{32-2}$$

Accordingly, from Equation (26), values (27-2) and (32-2), the follow-up speed of the 4-times oversampling clock recovery is equal to 50 [psec]/0.5426 [$\mu$sec]=0.000092 [sec/sec].

Similarly, the response times are calculated in each case of $\alpha$=5 [UI], $\alpha$=10 [UI], $\alpha$=50 [UI], and $\alpha$=100 [UI] and the follow-up speeds are calculated by Equation (26). Calculated results are shown in Table 13.

TABLE 13

| INPUT DATA | | 4-TIMES OVERSAMPLING CDR | |
|---|---|---|---|
| | | WEIGHTING: 1/4 = 0.25 | |
| MAGNITUDE OF | VARIATION | RESOLUSION: 400 ps/8 = 50 ps | |
| JITTER $\alpha$(Uip – p). | SPEED OF INPUT DATA | CDR RESPONSE TIME (4-TIMES) | FOLLOW-UP SPEED (4-TIMES) |
| 1.5 | 3.88496E–04 | 5.40867E–07 | 9.21714E–05 |
| 5 | 8.28318E–04 | 1.59421E–07 | 0.000310518 |
| 10 | 0.001456637 | 7.96107E–08 | 0.000615683 |
| 50 | 0.006483184 | 1.59158E–08 | 0.002854572 |
| 100 | 0.012466368 | 7.95778E–09 | 0.005231339 |

[1-6. Follow-up Speed in 3-Times Oversampling Clock Recovery]

Now, follow-up speed speeds in a 3-times oversampling clock recovery will be calculated.

In a case of the 3-times oversampling clock recovery, its resolution is represented by:

$$50 \text{ [psec]} \tag{27-3}$$

It will be assumed that a weighting for detection of lag (UP signal) or lead (DOWN signal) by a time is equal to 0.25. Accordingly, response is made by four times detection of the lag (UP signal) or the lead (DOWN signal) and is represented in terms of time by:

$$400 \text{ [psec]} \times 4 = 1600 \text{ [psec]} \tag{28-3}$$

Although the input data shifts in a lag direction or a lead direction before starting that the lag (UP signal) or the lead (DOWN signal) is detected, it takes a time interval from a time instant when a transition point of the input data passes a clock edge up to a time instant transition point passes an adjacent clock edge. This time interval corresponds to a time interval taken to moving the input data for one phase interval (T/3≈133.33 [psec]) in dependency on the variation speed in the input data caused by the jitter.

Accordingly, when a moving time interval for the one phase interval is represented by t5, the one phase interval is represented from Equation (20) by:

$$T/3 = (T/2) \cdot \sin(2\pi \cdot fs \cdot t5) \tag{29-3}$$

By substituting T=400 [psec] for Equation (29-3) and by deforming, the one phase interval t5 is represented by:

$$t5 = \{\sin^{-1}(\tfrac{2}{3}\alpha)\}/2\pi fs \tag{30-3}$$

By substituting fs=100 [kHz] and $\alpha$=1.5 [UI] for Equation (30-3), the one phase interval t5 is represented by:

$$t5 = 0.73 \text{ [}\mu\text{sec]} \tag{31-3}$$

A response time of the 3-times oversampling clock recovery is given from values (28-3) and (30-3) by:

$$1600 \text{ [psec]} + 0.73 \text{ [}\mu\text{sec]} = 0.7316 \text{ [}\mu\text{sec]} \tag{32-3}$$

Accordingly, from Equation (26), values (27-3) and (32-3), the follow-up speed of the 3-times oversampling clock recovery is equal to 50 [psec]/0.7316 [$\mu$sec]=0.000058 [sec/sec].

Similarly, the response times are calculated in each case of $\alpha$=5 [UI], $\alpha$=10 [UI], $\alpha$=50 [UI], and $\alpha$=100 [UI] and the follow-up speeds are calculated by Equation (26). Calculated results are shown in Table 14.

TABLE 14

| INPUT DATA | | 3-TIMES OVERSAMPLING CDR | |
|---|---|---|---|
| MAGNITUDE OF JITTER α(Uip – p) | VARIATION SPEED OF INPUT DATA | WEIGHTING: 1/4 = 0.25 RESOLUSION: 400 ps/8 = 50 ps | |
| | | CDR RESPONSE TIME (3-TIMES) | FOLLOW-UP SPEED (3-TIMES) |
| 1.5 | 3.88496E–04 | 7.3295E–07 | 6.80648E–05 |
| 5 | 8.28318E–04 | 2.1284E–07 | 0.000233165 |
| 10 | 0.001456637 | 1.6182E–07 | 0.000463899 |
| 50 | 0.006483184 | 2.12213E–08 | 0.002190936 |
| 100 | 0012466368 | 1.6104E–08 | 0.004094866 |

[1-7. Follow-up Speed in Over-sampling Clock Recovery According to the Embodiment of this Invention]

Now, follow-up speed speeds in an oversampling clock recovery according to the embodiment of this invention will be calculated.

In a case of the over-sampling clock recovery according to the embodiment of this invention, three-phase or four-phase clock edges are arranged within one bit of the data (400 [psec]) and at least two-phase clock edges form to a narrow phase interval. Its resolution (one phase interval) is calculated by:

$$(400 \text{ [psec]} \times 8/7) - (400 \text{ [psec]} \times 7/7) = 400/7 \approx 57.1 \text{ [psec]} \quad (27\text{-}4)$$

It will be assumed that a weighting for detection of lag (UP signal) or lead (DOWN signal) by a time is equal to 0.25. Accordingly, response is made by four times detection of the lag (UP signal) or the lead (DOWN signal) and is represented in terms of time by:

$$400 \text{ [psec]} \times 4 = 1600 \text{ [psec]} \quad (28\text{-}4)$$

Although the input data shifts in a lag direction or a lead direction before starting that the lag (UP signal) or the lead (DOWN signal) is detected, it takes a time interval from a time instant when a transition point of the input data passes a clock edge up to a time instant when the transition point passes an adjacent clock edge. This time interval corresponds to a time interval taken to moving the input data for one phase interval (400/7 [psec]) in dependency on the variation speed in the input data caused by the jitter.

Accordingly, when a moving time interval for the one phase interval is represented by t6, the one phase interval is represented from Equation (20) by:

$$T/7 = (\alpha T/2) \cdot \sin(2\pi f s \cdot t6) \quad (29\text{-}4)$$

By substituting T=400 [psec] for Equation (29-4) and by deforming, the one phase interval t6 is represented by:

$$t6 = \{\sin^{-1}(2/7\alpha)\}/2\pi fs \quad (30\text{-}4)$$

By substituting fs=100 [kHz] and α=1.5 [UI] for Equation (30-4), the one phase interval t6 is represented by:

$$t6 = 0.303 \text{ [}\mu\text{sec]} \quad (31\text{-}4)$$

A response time of the over-sampling clock recovery according to the embodiment of this invention is given from values (28-4) and (30-4) by:

$$1600 \text{ [psec]} + 0.303 \text{ [}\mu\text{sec]} = 0.3046 \text{ [}\mu\text{sec]} \quad (32\text{-}4)$$

Accordingly, from Equation (26), values (27-4) and (32-4), the follow-up speed of the oversampling clock recovery according to the embodiment of this invention is equal to 57.1 [psec]/0.3046 [μsec]=0.00019 [sec/sec].

Similarly, the response times are calculated in each case of α=5 [UI], α=10 [UI], α=50 [UI], and α=100 [UI] and the follow-up speeds are calculated by Equation (26). Calculated results are shown in Table 15.

TABLE 15

| INPUT DATA | | OVERSAMPLING CDR OF THIS INVENTION WEIGHTING: 1/4 = 0.25 RESOLUTION: 3200 ps/7 – 3200 ps/8) = 57 ps | |
|---|---|---|---|
| MAGNITUDE OF JITTER α(Uip – p) | VARIATION SPEED OF INPUT DATA | CDR RESPONSE TIME (NON-UNIFORM 4-TIMES) | FOLLOW-UP SPEED (NON-UNIFORM 4-TIMES) |
| 1.5 | 3.88496E–04 | 3.05016E–07 | 0.000186366 |
| 5 | 8.28318E–04 | 9.09953E–08 | 0.000617125 |
| 10 | 0.001456637 | 4.5479E–08 | 0.001213764 |
| 50 | 0.006483184 | 9.09462E–09 | 0.005343141 |
| 100 | 0.012466368 | 4.54729E–09 | 0.009295616 |

[2. Profitable Merits Compared with Prior Art]

Figure 16:
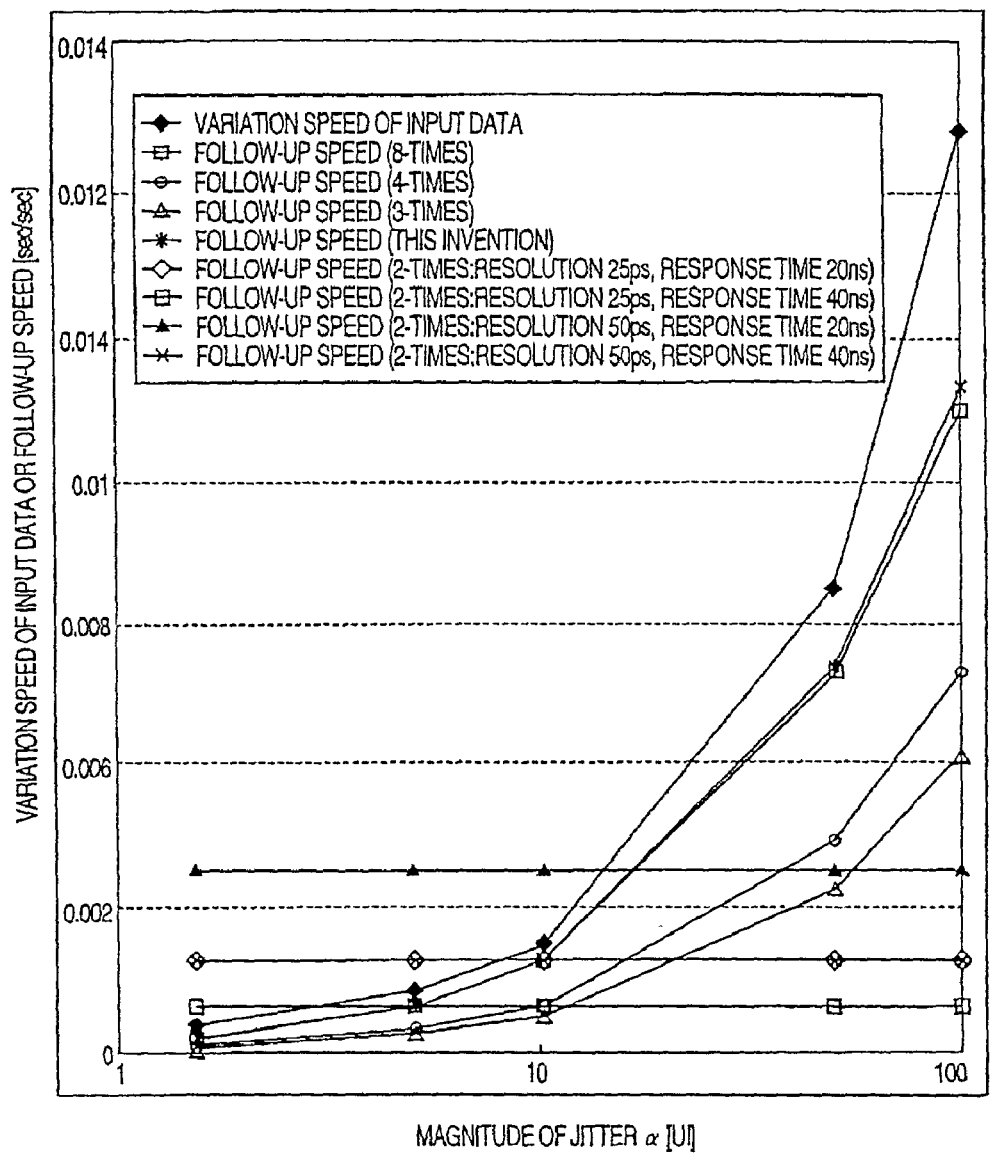
FIG. 16 is a graph showing relationships between a magnitude of the jitter and a variation speed of the input data or a follow-up speed of each clock recovery.

FIG. 16 is a graph showing relationship between the magnitude α of the jitter illustrated in Tables 10 to 15 and the variation speed of the input data or the follow-up speed of each clock recovery.

Figure 17:
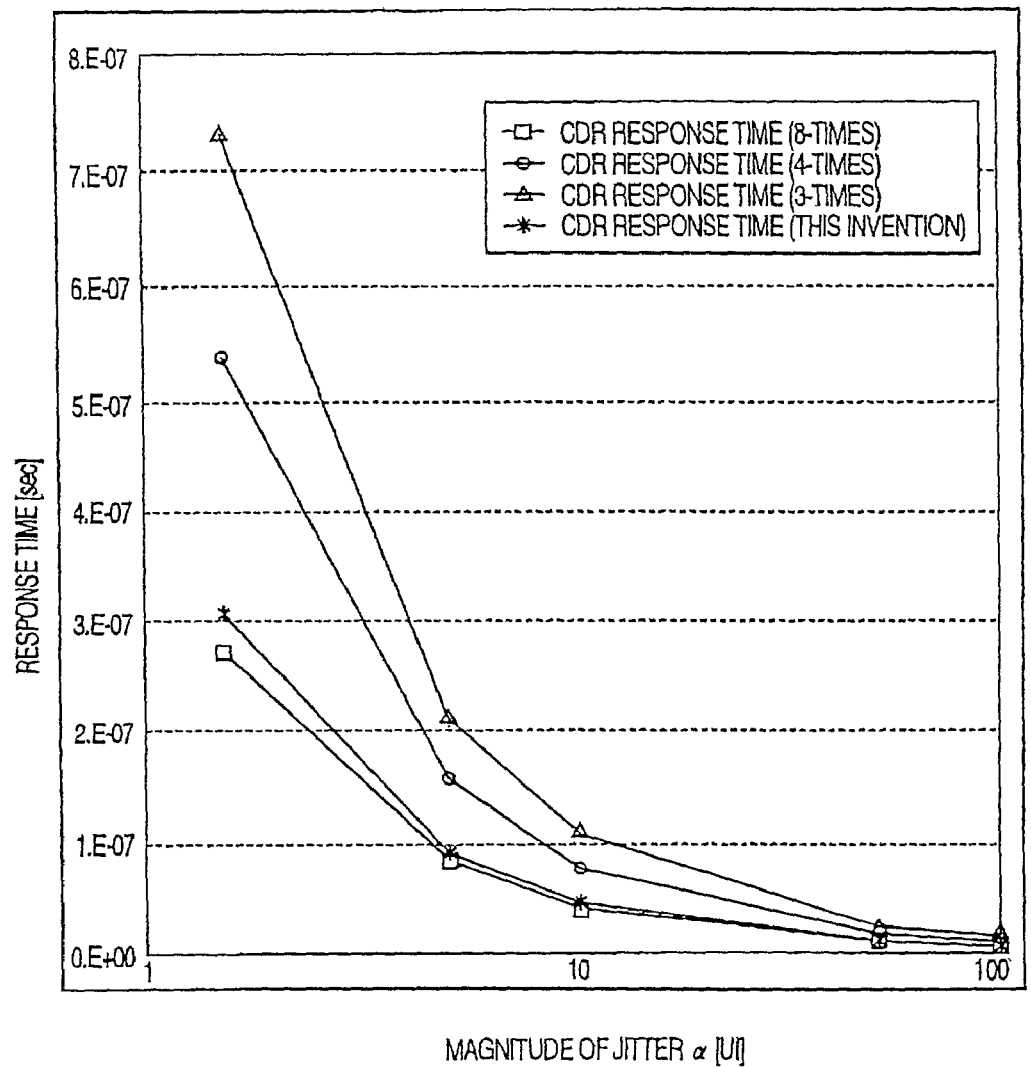
FIG. 17 is a graph showing relationships between the magnitude of the jitter and a response time of each clock recovery.

FIG. 17 is a graph showing relationship between the magnitude a of the jitter illustrated in Tables 10 to 15 and the response time of each clock recovery.

As shown in FIG. 16, when the magnitude a of the jitter is large, the variation speed of the input data is fast.

In FIG. 16, it will be assumed that the follow-up speed of the clock signal is less than the variation speed of the input data. In this event, when a difference between the follow-up speed of the clock signal and the variation speed of the input data is large, the clock signal tends to be impossible to follow the input data and it results in degradation of follow-up. On the other hand, it will be assumed that the follow-up speed of the clock signal is more than the variation speed of the input data. In this event, when a difference between the follow-up speed of the clock signal and the variation speed of the input data is large, the clock signal is too shifted in response to variation of the input data. Accordingly, the clock signal tends the more to be impossible to follow the input data and it results in degradation of follow-up.

That is, it is the best follow-up to always follow the input data at the follow-up speed equivalent to the variation speed of the input data. In terms of the graph shown in FIG. 16, the oversampling clock recovery having the graph indicative of the follow-up speed so as to come close along the graph indicative of the variation speed of the input data is optimum.

In the 2-times digital oversampling clock recovery, the follow-up speed of the clock signal is constant regardless of the magnitude of the jitter and the magnitude of the variation speed of the input data. Accordingly, as shown in FIG. 16, it is feared that the follow-up character remarkably deteriorates in an area (10 [UI] to 100 [UI]) having a relatively large jitter and/or in an area (1.5 [UI] to 10 [U ]) having a relatively small jitter.

In the 3-times or the 4-times oversampling clock recovery, the follow-up speed of the clock signal changes according to the magnitude of the jitter and the magnitude of the variation speed of the input data. However, as shown in FIG. 16, it is impossible to obtain a sufficient follow-up speed in the area (10 [UI] to 100 [UI]) having the relatively large jitter and it is feared that the follow-up character remarkably deteriorates in the area (10 [UI] to 100 [UI]).

In the 8-times oversampling clock recovery and the oversampling clock recovery according to the embodiments of this invention, the follow-up speed of the clock signal changes according to the magnitude of the jitter and the magnitude of the variation speed of the input data and is represented by the graph so as to extremely come close along the graph of the variation speed of the input data. Accordingly, it is possible to obtain a necessary and sufficient follow-up speed regardless of the magnitude of the jitter. Each of the 8-times oversampling clock recovery and the oversampling clock recovery according to the embodiments of this invention has a high follow-up character.

In the 3-times, the 3-times, the 8-times oversampling clock recovery and the oversampling clock recovery according to the embodiments of this invention, the follow-up speed is fast when the jitter is large. This is because the response time is short when the jitter is large as shown in FIG. 17.

As a result, the oversampling clock recovery according to the embodiments of this invention has the profitable merits compared with prior art so that it is possible to realize a high follow-up character equivalent to that of the 8-times oversampling clock recovery for sampling data using eight-phase clock signals per one bit of the data by using a small number of phases such as three-phase or four-phase clock signals per one bit of the data.

That is, this invention has the profitable merits compared with prior art so that it is possible to realize a high follow-up character for sufficiently following variation of a rate of the data by using a relatively small number of clock signals.

While this invention has thus far been described in conjunction with a few preferred embodiments thereof, it will now be readily possible for those skilled in the art to put this invention into various other manners.

What is claimed is:

1. An oversampling clock recovery method comprising the steps of: generating non-uniform multi-phase clock signals having a non-uniform interval, said non-uniform multi-phase clock signals comprising three or more phase clock signals for one bit of an input data; controlling a phase of said non-uniform multi-phase clock signals so that a phase of one of two edges in two-phase clock signals having a relative narrower interval among said non-uniform multi-phase clock signals is locked with a phase of a transition point of said input data; digitally controlling, by using selection circuits and delay locked loops each comprising a plurality of delay buffers, phases of two or more sets of uniform multi-phase clock signals having a uniform interval at a resolution less than a propagation delay of a delay buffer in said delay locked loops; keeping, by said digital control, a phase difference between a set of uniform multi-phase clock signals and another set of uniform multi-phase clock signals to a phase difference shorter than said propagation delay, and using a combination of said two or more sets of uniform multi-phase clock signals as said non-uniform multi-phase clock signals.

2. An oversampling clock recovery method as claimed in claim 1, wherein said non-uniform multi-phase clock signals comprise three-phase clock signals for one bit of said input data.

3. An oversampling clock recovery method as claimed in claim 1, wherein said step of controlling the phase of said non-uniform multi-phase clock signals is carried out by using a digital phase control method which comprises the steps of: preparing first multi-phase clock signals having a fixed phase and having a first uniform phase interval; preparing second multi-phase clock signals having a second uniform phase interval different from said first uniform phase interval; phase locking a specific clock signal in said first multi-phase clock signals and a particular clock signal in said second multi-phase clock signals; and changing a combination of the specific and the particular clock signals to be phase-locked to shift a phase of said second multi-phase clock signals.

4. An oversampling clock recovery method as claimed in claim 1, wherein said step of controlling the phase of said non-uniform multi-phase clock signals is carried out by a digital phase control method which comprises the steps of: preparing first multi-phase clock signals having a fixed phase and having a first uniform phase interval; preparing second multi-phase clock signals having a second uniform phase interval different from said first uniform phase interval; preparing third multi-phase clock signals having the second uniform phase interval; phase locking a specific clock signal in said first multi-phase clock signals and a first particular clock signal in said second multi-phase clock signals; phase locking said specific clock signal in said first multi-phase clock signals and a second particular clock signal in said third multi-phase clock signals; and changing a combination of the specific clock signal and the first particular clock signal to be phase-locked and a combination of the specific clock signal and the second particular clock signal to be phase-locked, thereby controlling phases of said second and said third multi-phase clock signals for use in sampling said input data with a phase difference between said second multi-phase clock signals and said third multi-phase clock signals kept.

5. An oversampling clock recovery method as claimed in claim 4, wherein the resolution for controlling the phases of said second and said third multi-phase clock signals is equal to the phase difference between said second multi-phase clock signals and said third multi-phase clock signals.

6. An oversampling clock recovery method comprising the steps of: generating compression multi-phase clock signals having condensation and rarefaction in arrangement, said compression multi-phase clock signals comprising three or more phase clock signals for one bit of an input data, said compression multi-phase clock signals having a compression period equal to a length of one bit in said input data; controlling a phase of said compression multi-phase clock signals so that a phase of one of clock edges in two clock signals having a condensation portion among said compression multi-phase clock signals is phase locked with a phase of a transition point of said input data; digitally controlling, by using selection circuits and delay locked loops each comprising a plurality of delay buffers, phases of two or more sets of uniform multi-phase clock signals having uniform interval at a resolution shorter than a propagation delay of a delay buffer in said delay locked loops; keeping, by said digital control, a phase difference between a set of uniform multi-phase clock signals and another set of uniform multi-phase clock signals to a phase difference shorter than said propagation delay; and using a combination of said two or more sets of uniform multi-phase clock signals as said compression multi-phase clock signals.

7. An oversampling clock recovery method as claimed in claim 6, wherein said compression multi-phase clock signals comprise three-phase clock signals for one bit for said input data.

8. An oversampling clock recovery method as claimed in claim 6, wherein said step of controlling the phase of said compression multi-phase clock signals is carried out by using a digital phase control method which comprises the steps of: preparing first multi-phase clock signals having a fixed phase and having a first uniform phase interval; preparing second multi-phase clock signals having a second uniform phase interval different from said first uniform phase interval; phase locking a specific clock signal in said first multi-phase clock signals and a particular clock signal in said second multi-phase clock signals; and changing a combination of the specific and the particular clock signals to be phase-locked to shift a phase of said second multi-phase clock signals.

9. An oversampling clock recovery method as claimed in claim 6, wherein said step of controlling the phase of said compression multi-phase clock signals is carried out by a digital phase control method which comprises the steps of: preparing first multi-phase clock signals having a fixed phase and having a first uniform phase interval; preparing second multi-phase clock signals having a second uniform phase interval different from said first uniform phase interval; preparing third multi-phase clock signals having the second uniform phase interval; phase locking a specific clock signal in said first multi-phase clock signals and a first particular clock signal in said second multi-phase clock signals; phase locking said specific clock signal in said first multi-phase clock signals and a second particular clock signal in said third multi-phase clock signals; and changing a combination of the specific clock signal and the first particular clock signal to be phase-locked and a combination of the specific clock signal and the second particular clock signal to be phase-locked, thereby controlling phases of said second and said third multi-phase clock signals for use in sampling said input data with a phase difference between said second multi-phase clock signals and said third multi-phase clock signals kept.

10. An oversampling clock recovery method as claimed in claim 9, wherein the resolution for controlling the phases of said second and said third multi-phase clock signals is equal to the phase difference between said second multi-phase clock signals and said third multi-phase clock signals.

11. An oversampling clock recovery method comprising the steps of: generating non-uniform multi-phase clock signals having a non-uniform interval, said non-uniform multi-phase clock signals comprising four or more phase clock signals for one bit of an input data; controlling a phase of said non-uniform multi-phase clock signals so that a phase of one of two clock edges in a first set of clock signals having a relative narrower interval among said non-uniform multi-phase clock signals is phase locked with a phase of a transition point of said input data; and controlling a phase of said non-uniform multi-phase clock signals so as to avoid making a phase of one of two clock edges in a second set of clock signals having a relative narrower interval among said non-uniform multi-phase clock signals phase lock with the phase of the transition point of said input data, said second set of clock signals being apart from said first set of clock signals through a relatively wider phase interval by about a length of half bit of said input data.

12. An oversampling clock recovery method as claimed in claim 11, wherein said non-uniform multi-phase clock signals comprise four-phase clock signals for one bit for said input data.

13. An oversampling clock recovery method as claimed in claim 11, wherein said method further comprises the steps of: digitally controlling, by using selection circuits and delay locked loops each comprising a plurality of delay buffers, phases of two or more sets of uniform multi-phase clock signals having uniform interval at a resolution shorter than a propagation delay of a delay buffer in said delay locked loops; keeping, by said digital control, a phase difference between a set of uniform multi-phase clock signals and another set of uniform multi-phase clock signals to a phase difference shorter than said propagation delay, and using a combination of said two or more sets of uniform multi-phase clock signals as said non-uniform multi-phase clock signals.

14. An oversampling clock recovery method as claimed in claim 11, wherein said step of controlling the phase of said non-uniform multi-phase clock signals is carried out by using a digital phase control method which comprises the steps of: preparing first multi-phase clock signals having a fixed phase and having a first uniform phase interval; preparing second multi-phase clock signals having a second uniform phase interval different from said first uniform phase interval; phase locking a specific clock signal in said first multi-phase clock signals and a particular clock signal in said second multi-phase clock signals; and changing a combination of the specific and the particular clock signals to be phase-locked to shift a phase of said second multi-phase clock signals.

15. An oversampling clock recovery method as claimed in claim 11, wherein said step of controlling the phase of said non-uniform multi-phase clock signals is carried out by a digital phase control method which comprises the steps of: preparing first multi-phase clock signals having a fixed phase and having a first uniform phase interval; preparing second multi-phase clock signals having a second uniform phase interval different from said first uniform phase interval; preparing third multi-phase clock signals having the second uniform phase interval; phase locking a specific clock signal in said first multi-phase clock signals and a first particular clock signal in said second multi-phase clock signals; phase locking said specific clock signal in said first multi-phase clock signals and a second particular clock signal in said third multi-phase clock signals; and changing a combination of the specific clock signal and the first particular clock signal to be phase-locked and a combination of the specific clock signal and the second particular clock signal to be phase-locked, thereby controlling phases of said second and said third multi-phase clock signals for use in sampling said input data with a phase difference between said second multi-phase clock signals and said third multi-phase clock signals kept.

16. An oversampling clock recovery method as claimed in claim 15, wherein the resolution for controlling the phases of said second and said third multi-phase clock signals is equal to the phase difference between said second multi-phase clock signals and said third multi-phase clock signals.

17. An oversampling clock recovery method comprising the steps of: generating compression multi-phase clock signals having condensation and rarefaction in arrangement, said compression multi-phase clock signals comprising four or more phase clock signals for one bit of an input data, said compression multi-phase clock signals having a compression period equal to one-second of a length of one bit in said input data; controlling a phase of said compression multi-phase clock signals so that a phase of one of two clock edges in a first set of clock signals having a first condensation portion among said compression multi-phase clock signals is phase locked with a phase of a transition point of said input data; and controlling a phase of said compression multi-phase clock signals so as to avoid making a phase of one of two clock edges in a second set of clock signals having a second condensation portion among said compression multi-phase clock signals are phase locked with the phase of the transition point of said input data, said second set of clock signals being adjacent to said first set of clock signals through a rarefaction portion.

18. An oversampling clock recovery method as claimed in claim 17, wherein said compression multi-phase clock signals comprise four-phase clock signals for one bit for said input data.

19. An oversampling clock recovery method as claimed in claim 17, wherein said method further comprises the steps of: digitally controlling, by using selection circuits and delay locked loops each comprising a plurality of delay buffers, phases of two or more sets of uniform multi-phase clock signals having uniform interval at a resolution shorter than a propagation delay of a delay buffer in said delay locked loops; keeping, by said digital control, a phase difference between a set of uniform multi-phase clock signals and another set of uniform multi-phase clock signals to a phase difference shorter than said propagation delay; and using a combination of said two or more sets of uniform multi-phase clock signals as said compression multi-phase clock signals.

20. An oversampling clock recovery method as claimed in claim 17, wherein said step of controlling the phase of said compression multi-phase clock signals is carried out by using a digital phase control method which comprises the steps of: preparing first multi-phase clock signals having a fixed phase and having a first uniform phase interval; preparing second multi-phase clock signals having a second uniform phase interval different from said first uniform phase interval; phase locking a specific clock signal in said first multi-phase clock signals and a particular clock signal in said second multi-phase clock signals; and changing a combination of the specific and the particular clock signals to be phase-locked to shift a phase of said second multi-phase clock signals.

21. An oversampling clock recovery method as claimed in claim 17, wherein said step of controlling the phase of said compression multi-phase clock signals is carried out by a digital phase control method which comprises the steps of: preparing first multi-phase clock signals having a fixed phase and having a first uniform phase interval; preparing second multi-phase clock signals having a second uniform phase interval different from said first uniform phase interval; preparing third multi-phase clock signals having the second uniform phase interval; phase locking a specific clock signal in said first multi-phase clock signals and a first particular clock signal in said second multi-phase clock signals; phase locking said specific clock signal in said first multi-phase clock signals and a second particular clock signal in said third multi-phase clock signals; and changing a combination of the specific clock signal and the first particular clock signal to be phase-locked and a combination of the specific clock signal and the second particular clock signal to be phase-locked, thereby controlling phases of said second and said third multi-phase clock signals for use in sampling said input data with a phase difference between said second multi-phase clock signals and said third multi-phase clock signals kept.

22. An oversampling clock recovery method as claimed in claim 21, wherein the resolution for controlling the phases of said second and said third multi-phase clock signals is equal to the phase difference between said second multi-phase clock signals and said third multi-phase clock signals.

23. An oversampling clock recovery circuit comprising: a first delay locked loop comprising rn-stage delay buffers where m represents a first positive integer which is not less than two; a first selection circuit for selecting, as a first selected delay buffer, a first one of said rn-stage delay buffers in said first delay locked loop to pick up a first selected clock signal from said first selected delay buffer; a second selection circuit for selecting, as a second selected delay buffer, a second one of said rn-stage delay buffers in said first delay locked loop to pick up a second selected clock signal from said second selected delay buffer; a second delay locked loop comprising n-stage delay buffers where n represents a second positive integer which is different from the first positive integer and which is not less than two; a third selection circuit for selecting, as a third selected delay buffer, one of said n-stage delay buffers in said second delay locked loop to supply said third selected delay buffer with said first selected clock signal; a third delay locked loop comprising n-stage delay buffers; a fourth selection circuit for selecting, as a fourth selected delay buffer, one of said n-stage delay buffers in said third delay locked loop to supply said fourth selected delay buffer with said second selected clock signal; a phase comparison portion for sampling an input data using clock signals produced by said second delay locked loop and clock signals produced by said third delay locked loop to detect lag/lead of said clock signals in reference with said input data, said phase comparison portion producing a comparison result indicative of the lag/lead of said clock signals produced by said second delay locked loop and said clock signals produced by said third delay locked loop; and a control circuit for controlling said first through said fourth selection circuits on the basis of said comparison result.

24. An oversampling clock recovery circuit as claimed in claim 23, wherein resolution of a phase control is set so as to be smaller than a propagation delay in said m-stage and n-stage delay buffers, said control circuit carrying out the phase control so as to differ by one resolution between said first and said third selection circuits and said second and said fourth selection circuits.

25. An oversampling clock recovery circuit as claimed in claim 23, wherein each of said second and said third delay locked loops comprises the n-stage delay buffers which are chained with each other in a ring-shaped fashion, said second delay locked loop compares phases of input and output signals in a first delay line having said third selected delay buffer as a first stage delay buffer in said first delay line, and said third delay locked loop compares phases of input and output signals in a second delay line having said fourth selected delay buffer as a first stage delay buffer in said second delay line.

* * * * *